(12) United States Patent
Banhegyesi

(10) Patent No.: US 12,069,778 B2
(45) Date of Patent: Aug. 20, 2024

(54) DEVICES, SYSTEMS AND METHODS FOR ELECTRICAL UTILITY SUBMETERING

(71) Applicant: EI ELECTRONICS LLC, Westbury, NY (US)

(72) Inventor: Tibor Banhegyesi, Northport, NY (US)

(73) Assignee: EI ELECTRONICS LLC, Westbury, NY (US)

( * ) Notice: Subject to any disclaimer, the term of this patent is extended or adjusted under 35 U.S.C. 154(b) by 0 days.

(21) Appl. No.: 17/975,934

(22) Filed: Oct. 28, 2022

(65) Prior Publication Data

US 2023/0051528 A1 Feb. 16, 2023

Related U.S. Application Data

(63) Continuation of application No. 16/429,003, filed on Jun. 2, 2019, now Pat. No. 11,516,899, which is a continuation-in-part of application No. 15/166,474, filed on May 27, 2016, now Pat. No. 10,585,125.

(60) Provisional application No. 62/749,921, filed on Oct. 24, 2018, provisional application No. 62/166,851, filed on May 27, 2015.

(51) Int. Cl.
| | |
|---|---|
| *H05B 45/14* | (2020.01) |
| *G01R 19/145* | (2006.01) |
| *H01H 71/02* | (2006.01) |
| *H04B 10/80* | (2013.01) |

(52) U.S. Cl.
CPC ........... *H05B 45/14* (2020.01); *G01R 19/145* (2013.01); *H01H 71/0228* (2013.01); *H04B 10/808* (2013.01)

(58) Field of Classification Search
CPC .... H05B 45/14; G01R 19/145; G01R 22/063; H01H 71/0228; H01H 2300/03; H01H 71/04; H04B 10/808; H04B 10/278
See application file for complete search history.

(56) References Cited

U.S. PATENT DOCUMENTS

| | | | |
|---|---|---|---|
| 3,748,654 | A | 7/1973 | Sutherland |
| 3,780,433 | A | 12/1973 | Lynch |
| 3,796,953 | A | 3/1974 | Zisa et al. |
| 4,050,621 | A | 9/1977 | Bouley |
| 4,072,385 | A | 2/1978 | Wallner |

(Continued)

FOREIGN PATENT DOCUMENTS

| | | |
|---|---|---|
| EP | 0176634 A1 | 4/1986 |
| WO | 9854583 A1 | 12/1998 |

OTHER PUBLICATIONS

DIRIS Digiware Measuring and Monitoring Systems, Instruction Manual, Socomec Group, May 2017, pp. 70.

(Continued)

*Primary Examiner* — Akm Zakaria
(74) *Attorney, Agent, or Firm* — Robinson + Cole LLP

(57) ABSTRACT

Devices, systems and methods for coupling sensors to intelligent electronic devices (IED's), e.g., an electrical power meter, via various communication media for electrical utility submetering are provided. The present disclosure provides a mechanism for coupling an IED to another desired device, e.g., a circuit breaker, using modular connectors (e.g., a RJ-45 connector, fiber optic connectors, etc.) and fiber-optic cables. The present disclosure also provides for coupling devices using modular connectors via wired or wireless connectivity.

20 Claims, 26 Drawing Sheets

(56) References Cited

U.S. PATENT DOCUMENTS

| | | |
|---|---|---|
| 4,092,592 A | 5/1978 | Milkovic |
| 4,272,687 A | 6/1981 | Borkan |
| 4,301,543 A | 11/1981 | Palmer |
| 4,458,307 A | 7/1984 | McAnlis et al. |
| 4,531,240 A | 7/1985 | Yokomizo |
| 4,713,609 A | 12/1987 | Losapio et al. |
| 4,803,632 A | 2/1989 | Frew et al. |
| 4,811,284 A | 3/1989 | Adler et al. |
| 4,839,819 A | 6/1989 | Begin et al. |
| 4,843,311 A | 6/1989 | Rozman et al. |
| 4,851,614 A | 7/1989 | Duncan, Jr. |
| 5,017,860 A | 5/1991 | Germer et al. |
| 5,207,595 A | 5/1993 | Learmont et al. |
| 5,210,632 A | 5/1993 | Murakami et al. |
| 5,224,011 A | 6/1993 | Yalla et al. |
| 5,248,967 A | 9/1993 | Daneshfar |
| 5,252,967 A | 10/1993 | Brennan et al. |
| 5,293,115 A | 3/1994 | Swanson |
| 5,301,122 A | 4/1994 | Halpern |
| 5,369,691 A | 11/1994 | Cain et al. |
| 5,418,752 A | 5/1995 | Harari et al. |
| 5,459,459 A | 10/1995 | Lee, Jr. |
| 5,528,507 A | 6/1996 | McNamara et al. |
| 5,545,981 A | 8/1996 | Dubin et al. |
| 5,548,527 A | 8/1996 | Hemminger et al. |
| 5,555,508 A | 9/1996 | Munday et al. |
| 5,559,870 A | 9/1996 | Patton et al. |
| 5,572,438 A | 11/1996 | Ehlers et al. |
| 5,602,744 A | 2/1997 | Meek et al. |
| 5,623,507 A | 4/1997 | Burns et al. |
| 5,631,554 A | 5/1997 | Briese et al. |
| 5,631,843 A | 5/1997 | Munday et al. |
| 5,680,324 A | 10/1997 | Schweitzer, III et al. |
| 5,696,501 A | 12/1997 | Ouellette et al. |
| 5,704,535 A | 1/1998 | Thompson |
| 5,715,390 A | 2/1998 | Hoffman et al. |
| 5,734,571 A | 3/1998 | Pilz et al. |
| 5,736,847 A | 4/1998 | Doorn et al. |
| 5,742,512 A | 4/1998 | Edge et al. |
| 5,764,155 A | 6/1998 | Kertesz et al. |
| 5,768,148 A | 6/1998 | Murphy et al. |
| 5,898,387 A | 4/1999 | Davis et al. |
| 5,933,092 A | 8/1999 | Ouellette et al. |
| 5,963,734 A | 10/1999 | Ackerman et al. |
| 5,974,312 A | 10/1999 | Hayes, Jr. et al. |
| 5,995,911 A | 11/1999 | Hart |
| 6,008,711 A | 12/1999 | Bolam |
| 6,018,700 A | 1/2000 | Edel |
| 6,073,169 A | 6/2000 | Shuey et al. |
| 6,124,806 A | 9/2000 | Cunningham et al. |
| 6,181,257 B1 | 1/2001 | Meek et al. |
| 6,186,842 B1 | 2/2001 | Hirschbold et al. |
| 6,208,266 B1 | 3/2001 | Lyons et al. |
| 6,219,656 B1 | 4/2001 | Cain et al. |
| 6,236,949 B1 | 5/2001 | Hart |
| 6,275,168 B1 | 8/2001 | Slater et al. |
| 6,311,105 B1 | 10/2001 | Budike |
| 6,316,932 B1 | 11/2001 | Horan et al. |
| 6,327,541 B1 | 12/2001 | Pitchford et al. |
| 6,333,975 B1 | 12/2001 | Brunn et al. |
| 6,367,023 B2 | 4/2002 | Kling et al. |
| 6,424,270 B1 | 7/2002 | Ali |
| 6,429,785 B1 | 8/2002 | Griffin et al. |
| 6,459,175 B1 | 10/2002 | Potega |
| 6,459,258 B1 | 10/2002 | Lavoie et al. |
| 6,459,997 B1 | 10/2002 | Andersen |
| 6,486,652 B1 | 11/2002 | Ouellette et al. |
| 6,504,357 B1 | 1/2003 | Hemminger et al. |
| 6,519,509 B1 | 2/2003 | Nierlich et al. |
| 6,529,883 B1 | 3/2003 | Yee et al. |
| 6,538,577 B1 | 3/2003 | Ehrke et al. |
| 6,591,229 B1 | 7/2003 | Pattinson et al. |
| 6,615,147 B1 | 9/2003 | Jonker et al. |
| 6,618,709 B1 | 9/2003 | Sneeringer |
| 6,671,635 B1 | 12/2003 | Forth et al. |
| 6,694,270 B2 | 2/2004 | Hart |
| 6,728,646 B2 | 4/2004 | Howell et al. |
| 6,735,535 B1 | 5/2004 | Kagan et al. |
| 6,751,562 B1 | 6/2004 | Blackett et al. |
| 6,751,563 B2 | 6/2004 | Spanier et al. |
| 6,778,920 B1 | 8/2004 | Balch et al. |
| 6,784,806 B1 | 8/2004 | Lee, Jr. et al. |
| 6,785,711 B1 | 8/2004 | Motoyama et al. |
| 6,798,191 B1 | 9/2004 | Macfarlane et al. |
| 6,813,571 B2 | 11/2004 | Lightbody et al. |
| 6,825,776 B2 | 11/2004 | Lightbody et al. |
| 6,847,300 B2 | 1/2005 | Yee et al. |
| 6,871,150 B2 | 3/2005 | Huber et al. |
| 6,885,185 B1 | 4/2005 | Makinson et al. |
| 6,889,271 B1 | 5/2005 | Germer et al. |
| 6,895,189 B1 | 5/2005 | Bedrosian |
| 6,900,738 B2 | 5/2005 | Crichlow |
| 6,937,003 B2 | 8/2005 | Bowman et al. |
| 6,944,555 B2 | 9/2005 | Blackett et al. |
| 6,954,814 B1 | 10/2005 | Leach |
| 6,961,641 B1 | 11/2005 | Forth et al. |
| 6,983,211 B2 | 1/2006 | Macfarlene et al. |
| 6,988,025 B2 | 1/2006 | Ransom et al. |
| 6,990,395 B2 | 1/2006 | Ransom et al. |
| 7,009,379 B2 | 3/2006 | Ramirez |
| 7,053,790 B2 | 5/2006 | Jang et al. |
| 7,085,824 B2 | 8/2006 | Forth et al. |
| 7,158,050 B2 | 1/2007 | Lightbody et al. |
| 7,184,904 B2 | 2/2007 | Kagan |
| 7,245,502 B2 | 7/2007 | Kochis et al. |
| 7,259,690 B1 | 8/2007 | Furmidge et al. |
| 7,271,996 B2 | 9/2007 | Kagan et al. |
| 7,295,776 B2 | 11/2007 | Okubo et al. |
| 7,379,791 B2 | 5/2008 | Tamarkin et al. |
| 7,388,189 B2 | 6/2008 | Spanier et al. |
| 7,447,762 B2 | 11/2008 | Curray et al. |
| 7,477,998 B2 | 1/2009 | Kagan |
| 7,589,516 B2 | 9/2009 | Rzehak et al. |
| 7,826,692 B2 | 11/2010 | Mongold |
| 7,897,905 B2 | 3/2011 | Spanier et al. |
| 7,953,565 B2 | 5/2011 | Kagan |
| 7,994,934 B2 | 8/2011 | Kagan |
| 8,350,417 B1 | 1/2013 | Dooley et al. |
| 8,442,660 B2 | 5/2013 | Kagan |
| 8,481,911 B2 | 7/2013 | Spanier et al. |
| 8,581,169 B2 | 11/2013 | Banhegyesi |
| 8,588,561 B2 | 11/2013 | Zbinden et al. |
| 8,588,562 B2 | 11/2013 | Zbinden et al. |
| 8,787,711 B2 | 7/2014 | Zbinden et al. |
| 8,923,670 B2 | 12/2014 | Zbinden et al. |
| 9,052,473 B2 | 6/2015 | Schmelz et al. |
| 9,054,806 B2 | 6/2015 | Zbinden et al. |
| 9,134,489 B2 | 9/2015 | Zbinden et al. |
| 9,191,109 B2 | 11/2015 | Zbinden et al. |
| 9,270,373 B2 | 2/2016 | Zbinden et al. |
| 9,374,165 B2 | 6/2016 | Zbinden et al. |
| 9,379,907 B2 | 6/2016 | Kagan et al. |
| 10,008,355 B2 | 6/2018 | Bouazza et al. |
| 10,020,142 B2 | 7/2018 | Dumont et al. |
| 10,260,903 B2 | 4/2019 | Kagan |
| 10,545,178 B2 | 1/2020 | Kern |
| 2002/0039068 A1 | 4/2002 | Holowick |
| 2002/0082748 A1 | 6/2002 | Enga et al. |
| 2002/0161536 A1 | 10/2002 | Suh et al. |
| 2003/0065459 A1 | 4/2003 | Huber et al. |
| 2003/0101008 A1 | 5/2003 | Hart |
| 2003/0105608 A1 | 6/2003 | Hart |
| 2003/0184448 A1 | 10/2003 | Kagan |
| 2003/0212512 A1 | 11/2003 | Hart |
| 2003/0220752 A1 | 11/2003 | Hart |
| 2004/0004555 A1 | 1/2004 | Martin |
| 2004/0066311 A1 | 4/2004 | Giles et al. |
| 2004/0070517 A1 | 4/2004 | Ehrke et al. |
| 2004/0084914 A1 | 5/2004 | Karimi et al. |
| 2004/0138787 A1 | 7/2004 | Ransom et al. |
| 2004/0138835 A1 | 7/2004 | Ransom et al. |
| 2004/0140908 A1 | 7/2004 | Gladwin et al. |
| 2004/0183522 A1 | 9/2004 | Gunn et al. |
| 2004/0196159 A1 | 10/2004 | Brennan et al. |

(56) References Cited

U.S. PATENT DOCUMENTS

| | | |
|---|---|---|
| 2004/0229578 A1 | 11/2004 | Lightbody et al. |
| 2005/0015219 A1 | 1/2005 | Lightfoot et al. |
| 2005/0017874 A1 | 1/2005 | Lightbody et al. |
| 2005/0060436 A1 | 3/2005 | Kienhoefer |
| 2005/0125361 A1 | 6/2005 | Girsham et al. |
| 2005/0215244 A1 | 9/2005 | Whitson |
| 2006/0023853 A1 | 2/2006 | Shelley et al. |
| 2006/0071813 A1 | 4/2006 | Kagan |
| 2006/0077999 A1 | 4/2006 | Kagan et al. |
| 2006/0082468 A1 | 4/2006 | Wang et al. |
| 2006/0086893 A1* | 4/2006 | Spanier ............ H04B 10/2755 250/214 R |
| 2006/0087783 A1 | 4/2006 | Holley |
| 2006/0161396 A1 | 7/2006 | Kagan |
| 2006/0230394 A1 | 10/2006 | Forth et al. |
| 2007/0150237 A1 | 6/2007 | Swarztrauber et al. |
| 2007/0185666 A1 | 8/2007 | Kagan |
| 2007/0273546 A1 | 11/2007 | Viaro et al. |
| 2008/0136667 A1 | 6/2008 | Vaswani et al. |
| 2008/0266056 A1 | 10/2008 | Alomar |
| 2009/0051557 A1 | 2/2009 | Beatty et al. |
| 2009/0112494 A1 | 4/2009 | Kagan |
| 2010/0013632 A1* | 1/2010 | Salewske ............ G01R 19/2513 340/540 |
| 2010/0156664 A1 | 6/2010 | Swarztrauber et al. |
| 2010/0164744 A1 | 7/2010 | Parker et al. |
| 2010/0256934 A1 | 10/2010 | Rohrbaugh |
| 2010/0264906 A1 | 10/2010 | Shamir et al. |
| 2011/0074382 A1 | 3/2011 | Patel |
| 2012/0022814 A1 | 1/2012 | Swarztrauber et al. |
| 2012/0080944 A1 | 4/2012 | Recker et al. |
| 2012/0089265 A1* | 4/2012 | Kucinskas ................ H02J 3/14 700/293 |
| 2012/0316698 A1 | 12/2012 | Daniel |
| 2013/0069779 A1 | 3/2013 | Vitucci |
| 2013/0076269 A1 | 3/2013 | Shilton |
| 2013/0197835 A1 | 8/2013 | Jonsson et al. |
| 2013/0329331 A1 | 12/2013 | Erger et al. |
| 2015/0028848 A1* | 1/2015 | Lynch .................. G01R 21/133 324/76.11 |
| 2015/0163881 A1 | 6/2015 | Pederson |
| 2016/0231721 A1 | 8/2016 | Lakshmanan et al. |
| 2016/0349295 A1 | 12/2016 | Banhegyesi |
| 2016/0358722 A1 | 12/2016 | Lakshmanan et al. |
| 2018/0059175 A1 | 3/2018 | Hase |
| 2018/0197256 A1 | 7/2018 | Madonna et al. |
| 2018/0246150 A1 | 8/2018 | Cook |
| 2019/0189378 A1 | 6/2019 | Lagree et al. |
| 2020/0051423 A1 | 2/2020 | Kevelos et al. |
| 2021/0092576 A1 | 3/2021 | Mueller |
| 2022/0051864 A1 | 2/2022 | Daoura et al. |

OTHER PUBLICATIONS

DIRIS Digiware Power Metering and Monitoring Systems Brochure, Socomec Group, Aug. 2019, pp. 14.

Introducing Savant Power Systems, inCharge by Savant Power, Giving you the power to make every electrical panel smart; Savant Systems, Inc.; Copyright 2022; pp. 1-12.

Lanzisera, et al., Steven; Electricity Submetering on the Cheap: Stick-on Electricity Meters, ACEEE Summer Study on Energy Efficiency in Buildings; Copyright 2014; pp. 146-155.

Savant Power System Deployment Guide, Savant Power & Light app; Savant Systems Inc.; Copyright 2022, document date Apr. 2022; pp. 1-52.

Savant Single 30 Amp Relay Companion Module, Quick Reference and Installation Guide—QRG 009-2112-02; Savant Systems, Inc.; Copyright 2022; pp. 1-4.

SEM3—Embedded Micro Metering Module, Selection & Application Guide; Siemens Industry, Inc; Copyright 2019, pp. 24.

SEM3—Embedded Micro Metering Module, User Manual; Siemens Industry, Inc; Copyright 2019, pp. 171.

* cited by examiner

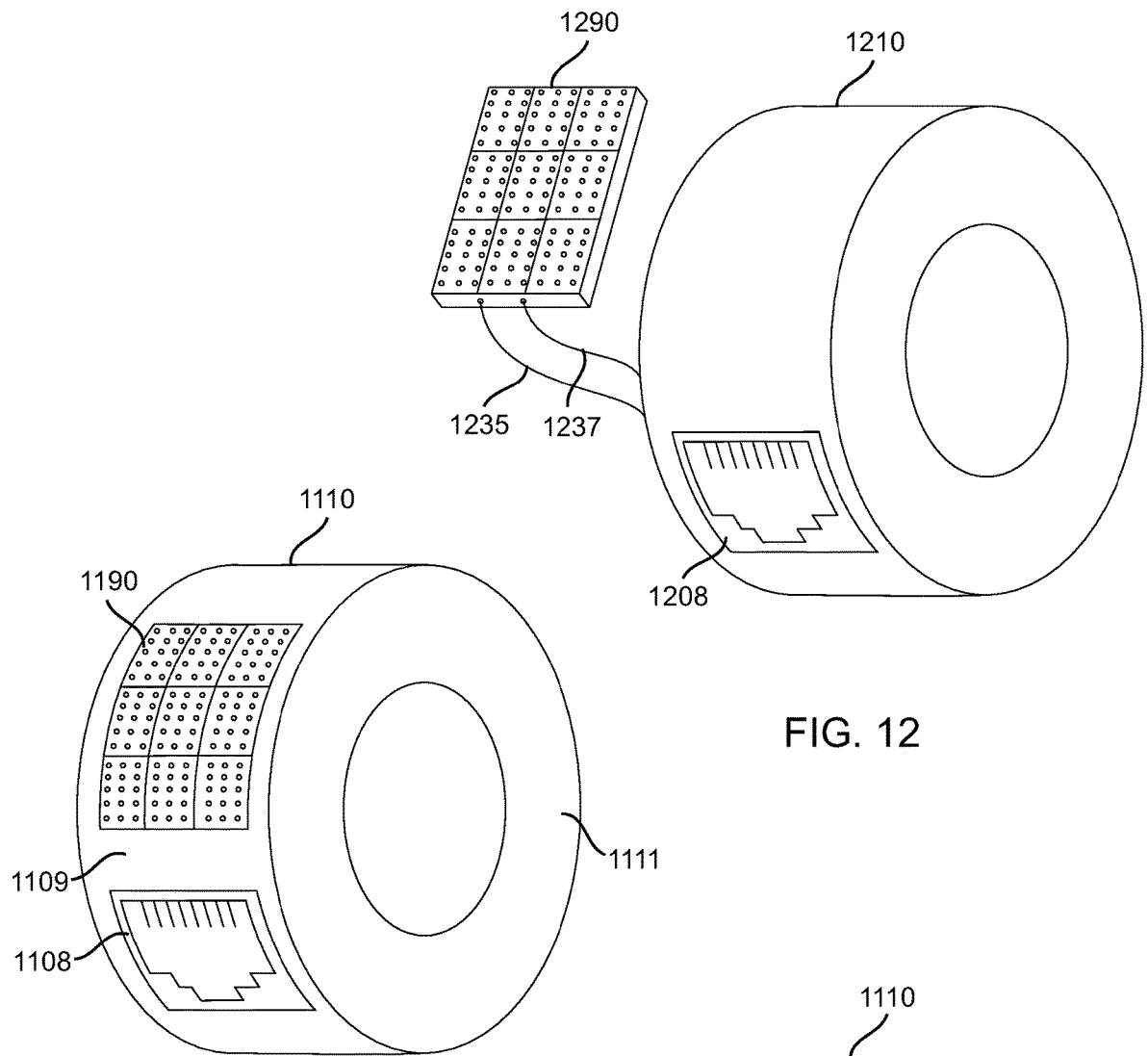
FIG. 12
FIG. 11
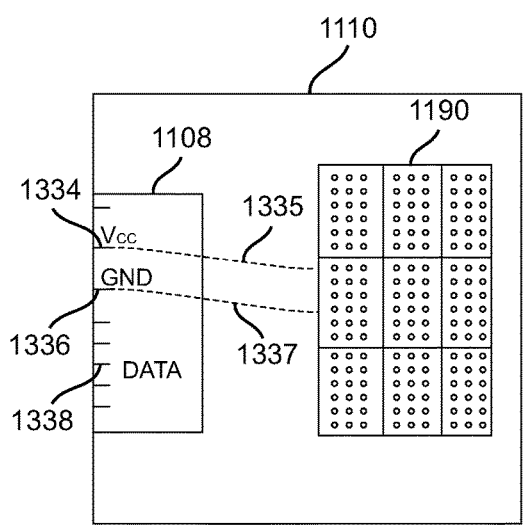
FIG. 13

DEVICES, SYSTEMS AND METHODS FOR ELECTRICAL UTILITY SUBMETERING

PRIORITY

This application claims priority to U.S. Provisional Patent Application No. 62/749,921, filed Oct. 24, 2018, entitled "DEVICES, SYSTEMS AND METHODS FOR ELECTRICAL UTILITY SUBMETERING", the contents of which are hereby incorporated by reference in its entirety.

This application is also a continuation-in-part application to U.S. patent application Ser. No. 15/166,474, filed May 27, 2016, entitled "DEVICES, SYSTEMS AND METHODS FOR DATA TRANSMISSION OVER A COMMUNICATION MEDIA USING MODULAR CONNECTORS", which claims priority to U.S. Provisional Application No. 62/166,851, filed May 27, 2015, the contents of which are hereby incorporated by reference in their entireties.

TECHNICAL FIELD

The present disclosure generally relates to intelligent electrical devices (IEDs), sensing devices and associated systems. In particular, the present disclosure relates to devices, systems and methods for sending/receiving data to/from IEDs using a fiber-medium for data transmission. Additionally, the present disclosure relates to devices, systems and methods for electrical utility submetering.

BACKGROUND

Description of the Related Art Monitoring of electrical energy by consumers and providers of electric power is a fundamental function within any electric power distribution system. Electrical energy may be monitored for purposes of usage, revenue, equipment performance and power quality. Electrical parameters that may be monitored include volts, amps, watts, vars, power factor, harmonics, kilowatt hours, kilovar hours and any other power related measurement parameters. Typically, measurement of the voltage and current at a location within the electric power distribution system may be used to determine the electrical parameters for electrical energy flowing through that location.

Devices that perform monitoring of electrical energy may be electromechanical devices, such as, for example, a residential billing meter or may be an intelligent electronic device ("IED"). Intelligent electronic devices typically include some form of a processor. In general, the processor is capable of using the measured voltage and current to derive the measurement parameters. The processor operates based on a software configuration. A typical consumer or supplier of electrical energy may have many intelligent electronic devices installed and operating throughout their operations. IEDs may be positioned along the supplier's distribution path or within a customer's internal distribution system. IEDs include revenue electric watt-hour meters, protection relays, programmable logic controllers, remote terminal units, fault recorders and other devices used to monitor and/or control electrical power distribution and consumption.

IEDs are widely available that make use of memory and microprocessors to provide increased versatility and additional functionality. Such functionality includes the ability to communicate with remote computing systems, either via a direct or indirect connection, e.g., a modem, a wireless connection or a network. IEDs also include legacy mechanical or electromechanical devices that have been retrofitted with appropriate hardware and/or software allowing integration with the power management system.

Typically, an IED is associated with a particular load or set of loads that are drawing electrical power from the power distribution system. The IED may also be capable of receiving data from or controlling its associated load. Depending on the type of IED and the type of load it may be associated with, the IED implements a power management function that is able to respond to a power management command and/or generate power management data. Power management functions include measuring power consumption, controlling power distribution such as a relay function, monitoring power quality, measuring power parameters such as phasor components, voltage or current, controlling power generation facilities, computing revenue, controlling electrical power flow and load shedding, or combinations thereof.

SUMMARY

Devices, systems and methods for coupling sensors, circuit breakers, etc., to intelligent electronic devices (IED's), e.g., an electrical power meter, via various communication media for electrical utility submetering are provided. The present disclosure provides techniques for coupling an IED to another desired device, e.g., a circuit breaker. In one embodiment, a circuit breaker is coupled to an IED using modular connectors (e.g., RJ-45 connectors, fiber optic connectors, etc.) and fiber-optic cables. The present disclosure also provides for coupling devices using modular connectors via wired or wireless connectivity.

According to one aspect of the present disclosure, a circuit breaker is provided including a housing; at least one modular receptacle disposed on a surface of the housing and configured to receive at least one modular connector for communicatively coupling the circuit breaker to at least one intelligent electronic device; at least one fault detection and tripping device configured to detect a fault condition in a circuit and, if a fault condition is detected, break the circuit; at least one sensor configured to sense at least one electrical parameter of the circuit and output an analog signal indicative of the at least one electrical parameter; and at least one analog to digital converter configured to convert the analog signal to a digital signal, wherein, the at least one receptacle is configured to receive the digital signal and provide the digital signal the at least one modular connector.

According to another aspect of the present disclosure, a system includes at least one circuit breaker including, a housing, at least one first, modular receptacle disposed on a surface of the housing and configured to receive at least one first modular connector, at least one fault detection and tripping device configured to detect a fault condition in a circuit and, if a fault condition is detected, break the circuit, at least one sensor configured to sense at least one electrical parameter of the circuit and output an analog signal indicative of the at least one electrical parameter, and at least one analog to digital converter configured to convert the analog signal to at least one digital signal, wherein, the at least one first modular receptacle is configured to receive the at least one digital signal and provide the at least one digital signal the at least one first modular connector; at least one cable coupled to the at least one first modular connector and the at least one second modular connector, the at least one digital signal provided via the at least one cable to the at least one second modular connector; and at least one intelligent electronic device (IED) including at least one second receptacle configured to receive the at least one second modular connector.

BRIEF DESCRIPTION OF THE DRAWINGS

These, and other aspects, features and advantages of the present disclosure will be described or become apparent from the following description of the embodiments, which is to be read in connection with the accompanying drawings.

In the drawings, wherein like reference numerals denote similar elements throughout the views:

FIG. 11 is a perspective view of a current sensor in accordance with another embodiment of the present disclosure;

FIG. 12 is a perspective view of a current sensor in accordance with an alternative embodiment of the present disclosure;

FIG. 13 is a schematic view of a current sensor in accordance with an embodiment of the present disclosure;

Figure 1:
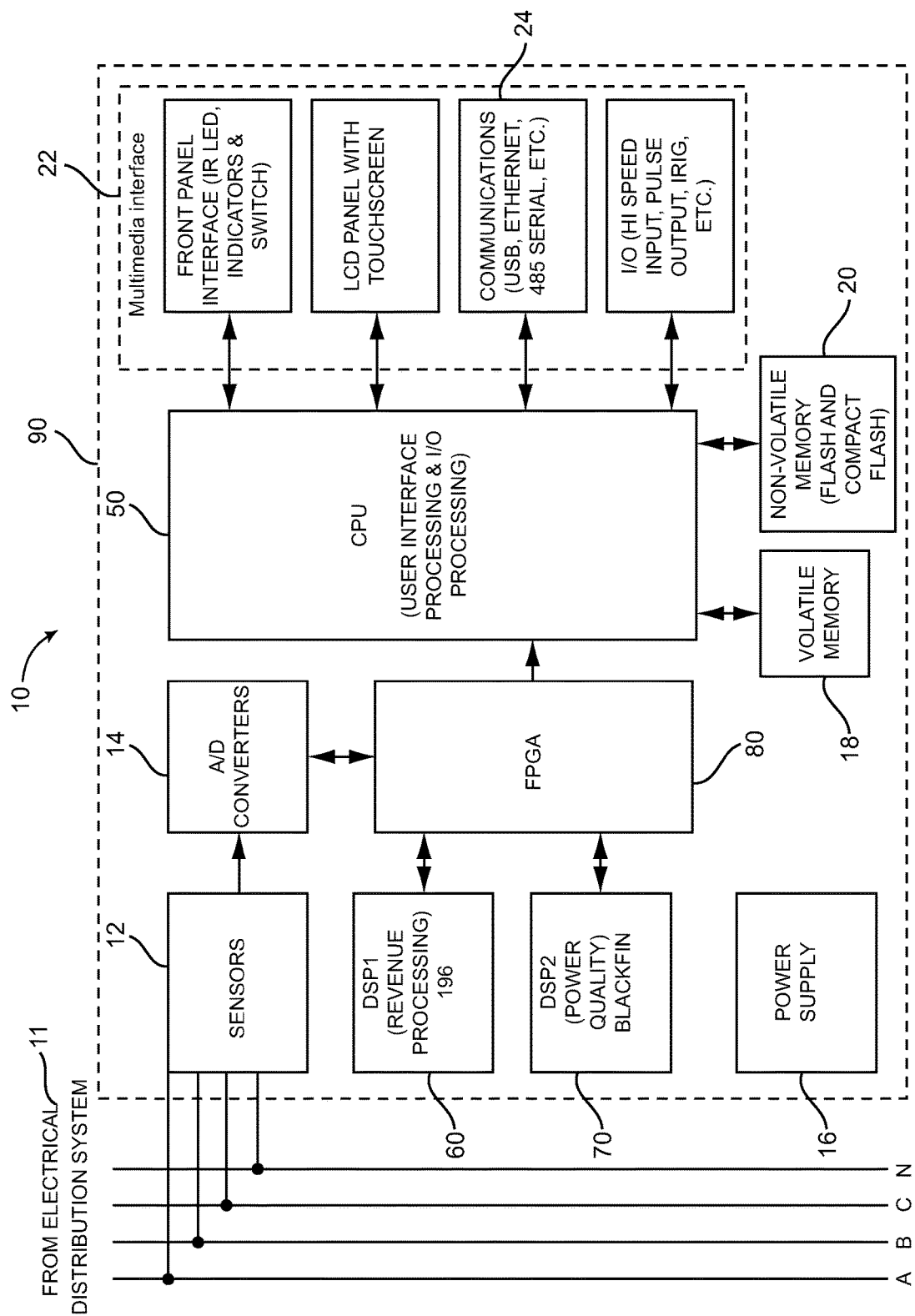
FIG. 1 is a block diagram of an exemplary Intelligent Electronic Device (IED), in accordance with an embodiment of the present disclosure.

It should be understood that the drawing(s) is for purposes of illustrating the concepts of the disclosure and is not necessarily the only possible configuration for illustrating the disclosure.

DETAILED DESCRIPTION OF THE EMBODIMENTS

Embodiments of the present disclosure will be described herein below with reference to the accompanying drawings.

In the following description, well-known functions or constructions are not described in detail to avoid obscuring the present disclosure in unnecessary detail. The word "exemplary" is used herein to mean "serving as an example, instance, or illustration." Any configuration or design described herein as "exemplary" is not necessarily to be construed as preferred or advantageous over other configurations or designs. Herein, the phrase "coupled" is defined to mean directly connected to or indirectly connected with through one or more intermediate components. Such intermediate components may include both hardware and software based components.

It is further noted that, unless indicated otherwise, all functions described herein may be performed in either hardware or software, or some combination thereof. In one embodiment, however, the functions are performed by at least one processor, such as a computer or an electronic data processor, digital signal processor or embedded microcontroller, in accordance with code, such as computer program code, software, and/or integrated circuits that are coded to perform such functions, unless indicated otherwise.

It should be appreciated that the present disclosure can be implemented in numerous ways, including as a process, an apparatus, a system, a device, a method, or a computer readable medium such as a computer readable storage medium or a computer network where program instructions are sent over optical or electronic communication links.

Embodiments of the present disclosure will be described herein below with reference to the accompanying drawings.

As used herein, intelligent electronic devices ("IEDs") can be any device that senses electrical parameters and computes data including, but not limited to, Programmable Logic Controllers ("PLC's"), Remote Terminal Units ("RTU's"), electric power meters, panel meters, protective relays, fault recorders, phase measurement units, serial switches, smart input/output devices and other devices which are coupled with power distribution networks to manage and control the distribution and consumption of electrical power. A meter is a device that records and measures power events, power quality, current, voltage waveforms, harmonics, transients and other power disturbances. Revenue accurate meters ("revenue meter") relate to revenue accuracy electrical power metering devices with the ability to detect, monitor, report, quantify and communicate power quality information about the power that they are metering.

Although IEDs, such as IED 10, 200 (described below), may be coupled using electrical connections (i.e., conductive wire, such as copper), IEDs may also be coupled using fiber-optic cables. Fiber-optic cables provide several advantages over electrical connections. For instance, propagations speeds of transmitted signals may be increased using fiber-optic cables. Furthermore, fiber-optic cables are not electrically conducting, and, therefore, are not susceptible to noise, poor grounding, or power surge related problems.

The devices, systems, and methods described in the present disclosure provide a mechanism for coupling an IED to another desired device (such as a current sensor), using a modular connector (e.g., an RJ-45 connector). In one embodiment, fiber-optic cables are employed between two modular connectors for coupling devices such as an IED to a sensor, e.g., a current sensor. In one embodiment, the IED may include an RJ-45 jack or receptacle, as the modular connector. A modular connector, e.g., disposed on either end of a cable, includes circuitry for converting an electrical signal to a light signal (and light signal to electrical signal) within the modular connector, such as a receptacle or plug.

Because the electrical signal to light signal (and vice versa) conversion occurs in the modular connector associated to the communication media or cable, the IED does not need to include additional modules for conversion internally. Using the devices, systems and methods described in the present disclosure, a user can easily take advantage of a fiber-optic connection simply by coupling an IED to a desired device by using the modular connectors described below. Although the modular connections shown and described are RJ-45 connections, other modular connections are contemplated to be within the scope of the present disclosure. For example, the teachings of the present disclosure may be applied to RJ-9, RJ-11, RJ-45, RJ-50 (which have common contact counts of 4, 6, 8, and 10 pins, respectively), and many other modular connectors. Modular connectors may include any connector or pair of connectors that are mateable by disposing a portion of a first connector at least partially inside a portion of a second connector, e.g., a RJ-45 plug and receptacle. In the present disclosure, the term modular connector may be used interchangeably to indicate a plug, jack, receptacle, etc. Modular connectors of the present disclosure may further include a pair of connectors that snap together and require no tools for coupling the connectors together or decoupling the connectors apart.

FIG. 1 is a block diagram of an IED 10 for monitoring and determining power usage and power quality for any metered point within a power distribution system and for providing a data transfer system for faster and more accurate processing of revenue and waveform analysis.

The IED 10 of FIG. 1 includes a plurality of sensors 12 coupled to various phases A, B, C and neutral N of an electrical distribution system 11, a plurality of analog-to-digital (A/D) converters 14, including inputs coupled to the sensor 12 outputs, a power supply 16, a volatile memory 18, a non-volatile memory 20, a multimedia user interface 22, and a processing system that includes at least one central processing unit (CPU) 50 (or host processor) and/or one or more digital signal processors, two of which are shown, i.e., DSP1 60 and DSP2 70. The IED 10 may also include a Field Programmable Gate Array 80 which performs a number of functions, including, but not limited to, acting as a communications gateway for routing data between the various processors 50, 60, 70, receiving data from the A/D converters 14 performing transient detection and capture and performing memory decoding for CPU 50 and the DSP processors 60, 70. In one embodiment, the FPGA 80 is internally comprised of two dual port memories to facilitate the various functions. It is to be appreciated that the various components shown in FIG. 1 are contained within housing 90. Exemplary housings will be described below in relation to FIGS. 2A and 2B.

The plurality of sensors 12 sense electrical parameters, e.g., voltage and current, on incoming lines, (i.e., phase A, phase B, phase C, neutral N), from an electrical power distribution system 11, e.g., an electrical circuit. In one embodiment, the sensors 12 will include current transformers and potential transformers, wherein one current transformer and one voltage transformer will be coupled to each phase of the incoming power lines. A primary winding of each transformer will be coupled to the incoming power lines and a secondary winding of each transformer will output a voltage representative of the sensed voltage and current. The output of each transformer will be coupled to the A/D converters 14 configured to convert the analog output voltage from the transformer to a digital signal that can be processed by the CPU 50, DSP1 60, DSP2 70, FPGA 80 or any combination thereof.

A/D converters 14 are respectively configured to convert an analog voltage output to a digital signal that is transmitted to a gate array, such as Field Programmable Gate Array (FPGA) 80. The digital signal is then transmitted from the FPGA 80 to the CPU 50 and/or one or more DSP processors 60, 70 to be processed in a manner to be described below. In other embodiments, the A/D converters 14 may be coupled to the CPU 50 or DSPs 60, 70 without the need for FPGA 80.

The CPU 50 or DSP Processors 60, 70 are configured to operatively receive digital signals from the A/D converters 14 (see FIG. 1) to perform calculations necessary to determine power usage and to control the overall operations of the IED 10. In some embodiments, CPU 50, DSP1 60 and DSP2 70 may be combined into a single processor, serving the functions of each component. In some embodiments, it is contemplated to use an Erasable Programmable Logic Device (EPLD) or a Complex Programmable Logic Device (CPLD) or any other programmable logic device in place of the FPGA 80. In some embodiments, the digital samples, which are output from the A/D converters 14 are sent directly to the CPU 50 or DSP processors 60, 70, effectively bypassing the FPGA 80 as a communications gateway.

The power supply 16 provides power to each component of the IED 10. In one embodiment, the power supply 16 is a transformer with its primary windings coupled to the incoming power distribution lines 11 and having windings to provide a nominal voltage, e.g., 5 VDC, +12 VDC and −12 VDC, at its secondary windings. In other embodiments, power may be supplied from an independent power source to the power supply 16. For example, power may be supplied from a different electrical circuit or an uninterruptible power supply (UPS).

In one embodiment, the power supply 16 can be a switch mode power supply in which the primary AC signal will be converted to a form of DC signal and then switched at high frequency, such as, for example, 100 Khz, and then brought through a transformer to step the primary voltage down to, for example, 5 Volts AC. A rectifier and a regulating circuit would then be used to regulate the voltage and provide a stable DC low voltage output. Other embodiments, such as, but not limited to, linear power supplies or capacitor dividing power supplies are also contemplated.

The multimedia user interface 22 is shown coupled to the CPU 50 in FIG. 1 for interacting with a user and for communicating events, such as alarms and instructions to the user. The multimedia user interface 22 may include a display for providing visual indications to the user. The display may be embodied as a touch screen, a liquid crystal display (LCD), a plurality of LED number segments, individual light bulbs or any combination. The display may provide information to the user in the form of alpha-numeric lines, computer-generated graphics, videos, animations, etc. The multimedia user interface 22 further includes a speaker or audible output means for audibly producing instructions, alarms, data, etc. The speaker is coupled to the CPU 50 via a digital-to-analog converter (D/A) for converting digital audio files stored in a memory 18 or non-volatile memory 20 to analog signals playable by the speaker. An exemplary interface is disclosed and described in commonly owned pending U.S. Pat. No. 8,442,660, entitled "POWER METER HAVING AUDIBLE AND VISUAL INTERFACE", which claims priority to expired U.S. Provisional Patent Appl. No. 60/731,006, filed Oct. 28, 2005, the contents of which are hereby incorporated by reference in their entireties.

The IED 10 will support various file types including but not limited to Microsoft™ Windows Media Video files (.wmv), Microsoft™ Photo Story files (.asf), Microsoft™ Windows Media Audio files (.wma), MP3 audio files (.mp3), JPEG image files (.jpg, .jpeg, .jpe, .jfif), MPEG movie files (.mpeg, .mpg, .mpe, .m1v, .mp2v.mpeg2), Microsoft™ Recorded TV Show files (.dvr-ms), Microsoft™ Windows Video files (.avi) and Microsoft™ Windows Audio files (.wav).

The IED 10 further comprises a volatile memory 18 and a non-volatile memory 20. In addition to storing audio and/or video files, the volatile memory 18 and/or non-volatile memory 20 may store the sensed and generated data for further processing and for retrieval when called upon to be displayed at the IED 10 or from a remote location. The volatile memory 18 includes internal storage memory, e.g., random access memory (RAM), and the non-volatile memory 20 includes removable memory such as magnetic storage memory; optical storage memory, e.g., the various types of CD and DVD media; solid-state storage memory, e.g., a CompactFlash card, a Memory Stick, SmartMedia card, MultiMediaCard (MMC), SD (Secure Digital) memory; or any other memory storage that exists currently or will exist in the future. By utilizing removable memory, an IED can be easily upgraded as needed. Such memory will be used for storing historical trends, waveform captures, event logs including time-stamps and stored digital samples for later downloading to a client application, web-server or PC application.

In a further embodiment, the IED 10 may include a communication device 24, also known as a network interface, for enabling communications between the IED or meter, and a remote terminal unit, programmable logic controller and other computing devices, microprocessors, a desktop computer, laptop computer, other meter modules, etc. The communication device 24 may be a modem, network interface card (NIC), wireless transceiver, etc. The communication device 24 may perform its functionality by hardwired and/or wireless connectivity. The hardwire connection may include but is not limited to hard wire cabling, e.g., parallel or serial cables, RS232, RS485, USB cable, Firewire™ (1394 connectivity) cables, Ethernet, and the appropriate communication port configuration. The wireless connection may operate under any of the various wireless protocols including but not limited to Bluetooth™ interconnectivity, infrared connectivity, radio transmission connectivity including computer digital signal broadcasting and reception commonly referred to as Wi-Fi or 802.11.X (where x denotes the type of transmission), satellite transmission or any other type of communication protocols, communication architecture or systems currently existing or to be developed for wirelessly transmitting data including spread spectrum 900 MHz, or other frequencies, Zigbee™, WiFi, or any mesh enabled wireless communication.

The IED 10 may communicate to a server or other computing device via the communication device 24. The IED 10 may be connected to a communications network, e.g., the Internet, by any means, for example, a hardwired or wireless connection, such as dial-up, hardwired, cable, DSL, satellite, cellular, PCS, wireless transmission (e.g., 802.11a/b/g), etc. It is to be appreciated that the network may be a local area network (LAN), wide area network (WAN), the Internet or any network that couples a plurality of computers to enable various modes of communication via network messages. Furthermore, the server will communicate using various protocols such as Transmission Control Protocol/Internet Protocol (TCP/IP), File Transfer Protocol (FTP), Hypertext Transfer Protocol (HTTP), etc. and secure protocols such as Hypertext Transfer Protocol Secure (HTTPS), Internet Protocol Security Protocol (IPSec), Point-to-Point Tunneling Protocol (PPTP), Secure Sockets Layer (SSL) Protocol, etc.

In an additional embodiment, the IED 10 may also have the capability of not only digitizing waveforms, but storing the waveform and transferring that data upstream to a central computer, e.g., a remote server, when an event occurs such as a voltage surge or sag or a current short circuit. This data will be triggered and captured on an event, stored to memory, e.g., non-volatile RAM, and additionally transferred to a host computer within the existing communication infrastructure either immediately in response to a request from a remote device or computer to receive said data or in response to a polled request. The digitized waveform will also allow the CPU 50 to compute other electrical parameters such as harmonics, magnitudes, symmetrical components and phasor analysis. Using the harmonics, the IED 10 may also calculate dangerous heating conditions and can provide harmonic transformer derating based on harmonics found in the current waveform.

In a further embodiment, the IED 10 may execute an e-mail client and may send e-mails to the utility or to the customer direct on an occasion that a power quality event occurs. This allows utility companies to dispatch crews to repair the condition. The data generated by the meters are used to diagnose the cause of the condition. The data is transferred through the infrastructure created by the electrical power distribution system. The email client will utilize a POP3 or other standard mail protocol. A user will program the outgoing mail server and email address into the meter. An exemplary embodiment of said metering is available in U.S. Pat. No. 6,751,563, which all contents thereof are incorporated by reference herein.

The techniques of the present disclosure can be used to automatically maintain program data and provide field wide updates upon which IED firmware and/or software can be upgraded. An event command can be issued by a user, on a schedule or by digital communication that may trigger the IED 10 to access a remote server and obtain the new program code. This will ensure that program data will also be maintained allowing the user to be assured that all information is displayed identically on all units.

It is to be understood that the present disclosure may be implemented in various forms of hardware, software, firmware, special purpose processors, or a combination thereof. The IED 10 also includes an operating system and micro instruction code. The various processes and functions described herein may either be part of the micro instruction code or part of an application program (or a combination thereof) which is executed via the operating system.

It is to be further understood that because some of the constituent system components and method steps depicted in the accompanying figures may be implemented in software, or firmware, the actual connections between the system components (or the process steps) may differ depending upon the manner in which the present disclosure is programmed. Given the teachings of the present disclosure provided herein, one of ordinary skill in the related art will be able to contemplate these and similar implementations or configurations of the present disclosure.

Figure 2B:
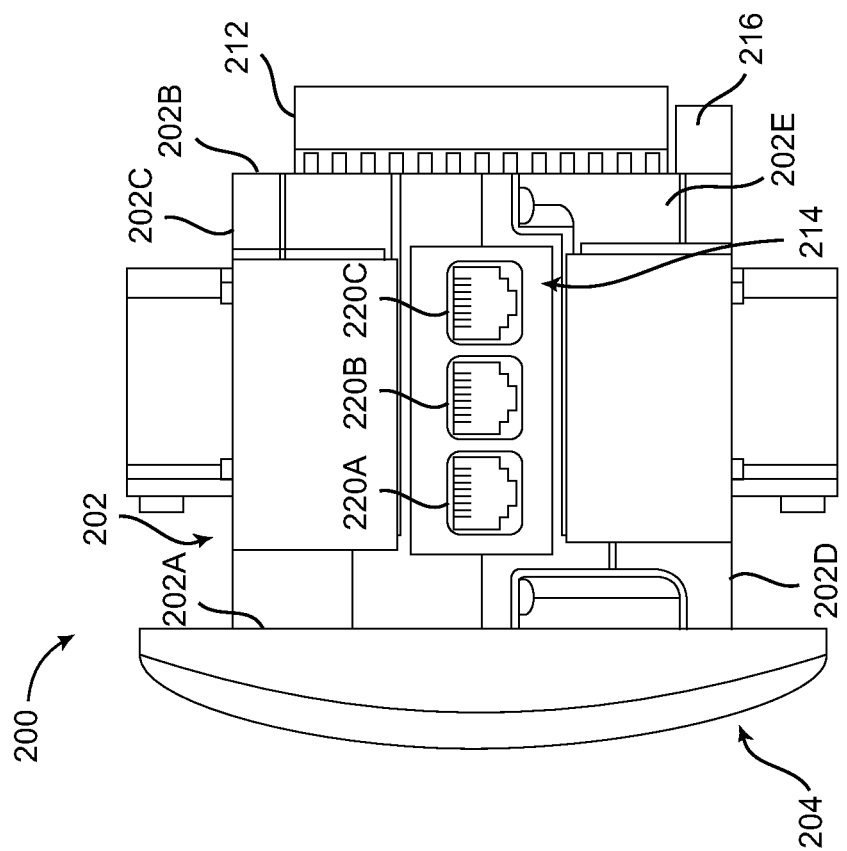
FIG. 2B is a side view of an exemplary IED in accordance with an embodiment of the present disclosure.
Figure 2A:
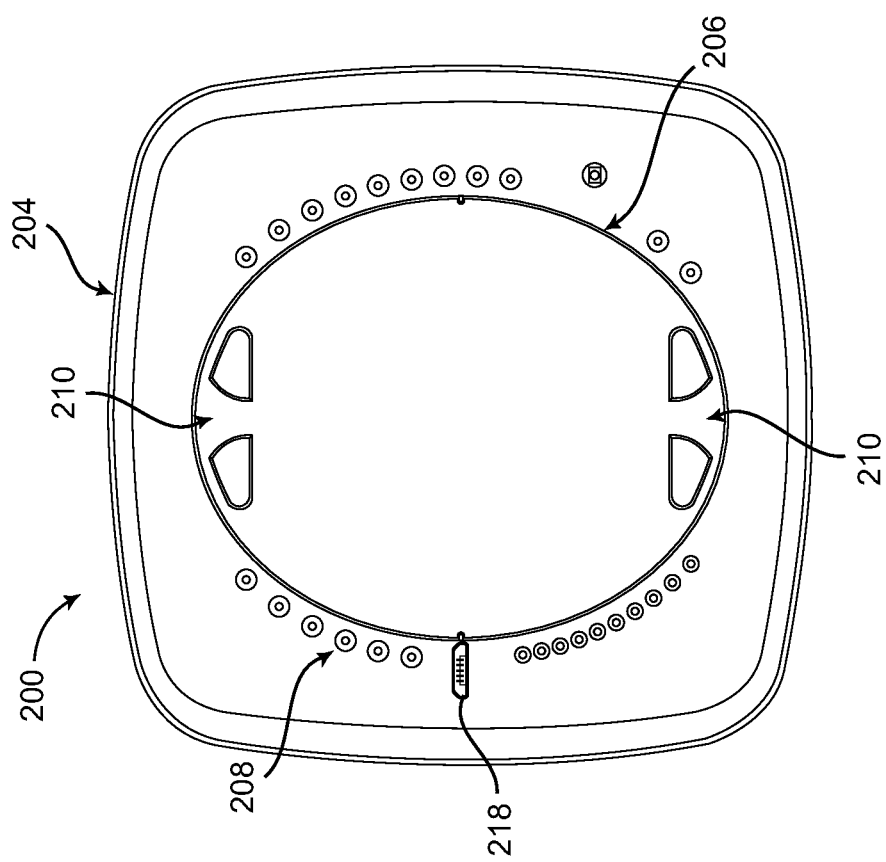
FIG. 2A is front view of an exemplary IED in accordance with an embodiment of the present disclosure.

Furthermore, it is to be appreciated that the components and devices of the IED 10 of FIG. 1 may be disposed in various housings depending on the application or environment. For example, the IED 10 may be configured as a panel meter 200 as shown in FIGS. 2A and 2B. The panel meter 200 of FIGS. 2A and 2B is described in more detail in commonly owned U.S. Pat. No. 7,271,996, the contents of which are hereby incorporated by reference. Although a panel meter is shown, the teachings of the present disclosure may be applied to other housings, such as a socket or S-based housing, an A-base housing, a switchboard housing, a circuit breaker housing, etc.

As seen in FIGS. 2A and 2B, the IED 200 includes a housing 202 defining a front surface 202*a*, a rear surface 202*b*, a top surface 202*c*, a bottom surface 202*d*, a right side surface 202*e*, and a left side surface (not shown). IED 200 includes a face plate 204 operatively connected to front surface 202*a* of housing 202. Face plate 204 includes displays 206, indicators 208 (e.g., LEDs and the like), buttons 210, and the like providing a user with an interface for visualization and operation of IED 200. For example, as seen in FIG. 2A, face plate 204 of IED 200 includes analog and/or digital displays 206 capable of producing alphanumeric characters. Face plate 204 includes a plurality of indicators 208 which, when illuminated, indicate to the user the "type of reading", the "% of load bar", the "parameter designation" which indicates the reading which is being displayed on displays 206, a "scale selector" (e.g., Kilo or Mega multiplier of Displayed Readings), etc. Face plate 204 includes a plurality of buttons 210 (e.g., a "menu" button, an "enter" button, a "down" button, a "right" button, etc.) for performing a plurality of functions, including and not limited to: viewing of meter information; enter display modes; configuring parameters; performing re-sets; performing LED checks; changing settings; viewing parameter values; scrolling parameter values; and viewing limit states. The housing 202 includes voltage connections or inputs 212 provided on rear surface 202*b* thereof, and current inputs 214 provided along right side surface 202*e* thereof. The current inputs 214 are configured as modular receptacles, e.g., RJ-45 receptacles 220A, 220B, and 220C, for use in accordance with the present disclosure.

It is to be appreciated that in all figures described from this point forward in the present disclosure, the letters A, B, and C next to a designated reference number indicate that the described aspect of the embodiment is being used in connection with power distribution lines A, B, or C. However, it is to be understood that identical reference numbers ending in A, B, or C perform identical functions. Therefore, for clarity, instead of referring to, for instance, RJ-45 transmitters 308A, 308B, and 308C separately, when RJ-45 transmitter 308 is referred to it is to be understood that the described use of RJ-45 transmitter 308 applies to all three RJ-45 transmitters (308A, 308B, and 308C), because the described usage of the present disclosure is identical or similar for each. Also, although only power distribution lines A, B, and C are shown, it is contemplated to be within the scope of the present disclosure to implement the teachings described herein with as many power distribution lines as desired, including a neutral line. Additionally, it is to be appreciated that the teachings of the present disclosure may apply to a single phase system and a single circuit, along with multiphase systems.

Figure 3A:
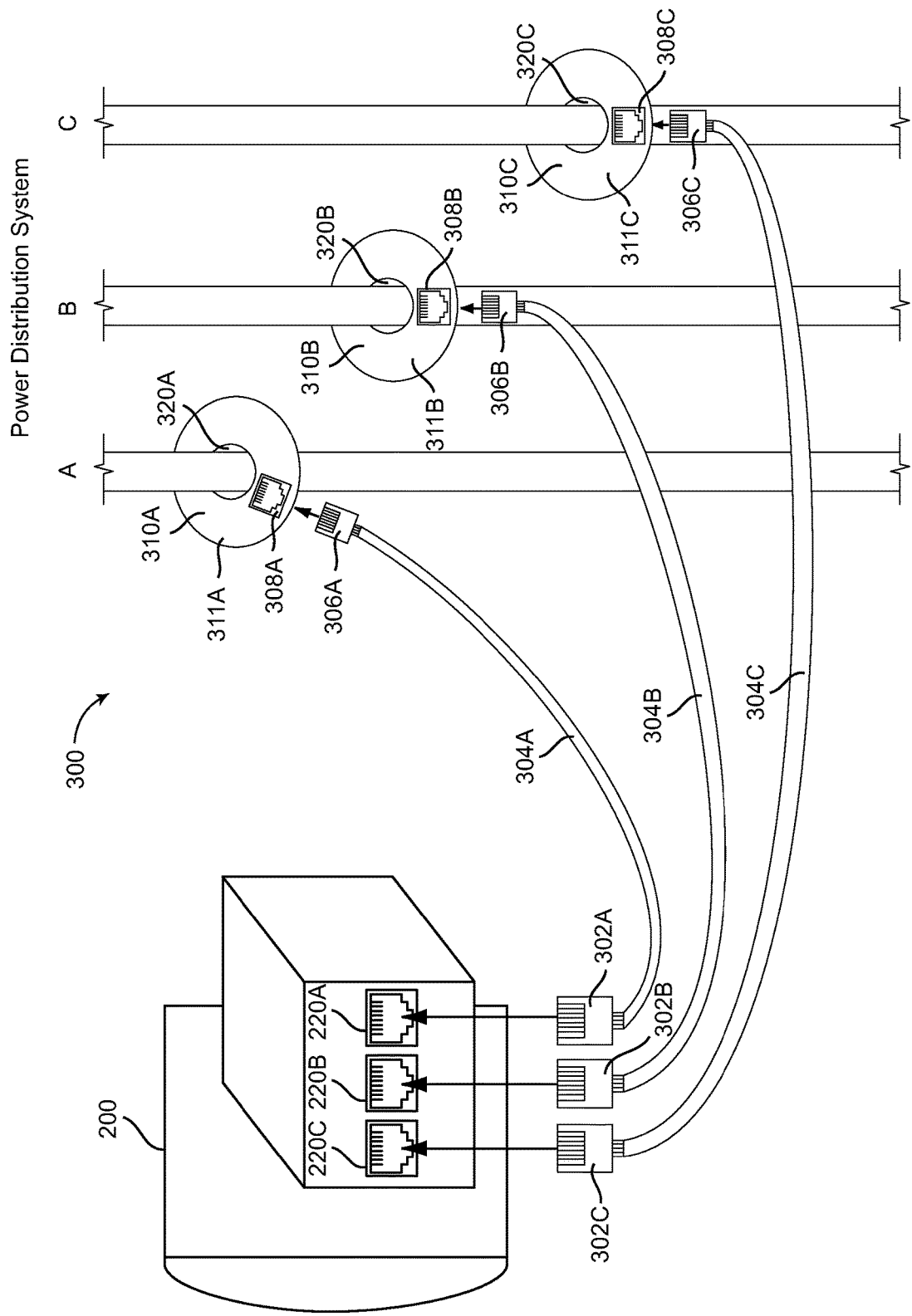
FIG. 3A is an illustration of an IED coupled with at least one current sensor on a power distribution system using fiber optic cables in accordance with an embodiment of the present disclosure.

Turning to FIG. 3A, a system 300 is shown in accordance with an embodiment of the present disclosure. In FIG. 3A, IED 200 is coupled to current sensor 310 via fiber-optic cable 304. Current sensor 310 is disposed on lines A, B, and C to measure current. In one embodiment, current sensor 310 is an indirect current sensor that measures load current by measuring induced voltage on a coil that is disposed around a wire (e.g., transmission lines A, B, or C) to be measured. The induced voltage on the coil is proportional to the current passing through incoming lines A, B, and/or C. Current sensor 310 includes RJ-45 receptacle 308 disposed on a housing 311 of current sensor 310. RJ-45 receptacle 308 is coupled to RJ-45 transmitter 306. RJ-45 transmitter 306 is coupled to RJ-45 receiver 302 using fiber-optic cable 304 (or any other material suitable for carrying light signals). It is to be appreciated that fiber-optic cable 304 may contain multiple fibers for carrying multiple light signals simultaneously. RJ-45 receiver 302 is coupled to RJ-45 receptacle 220 on IED 200 and RJ-45 receptacle 220 is coupled to sensor module 12 in IED 200. It is to be appreciated that in one embodiment, RJ-45 receptacle 220 may be coupled directly with any one of A/D converter 14, CPU 50, DSP1 60, DSP2 70, and/or FPGA 80 in accordance with the present disclosure.

Figure 3B:
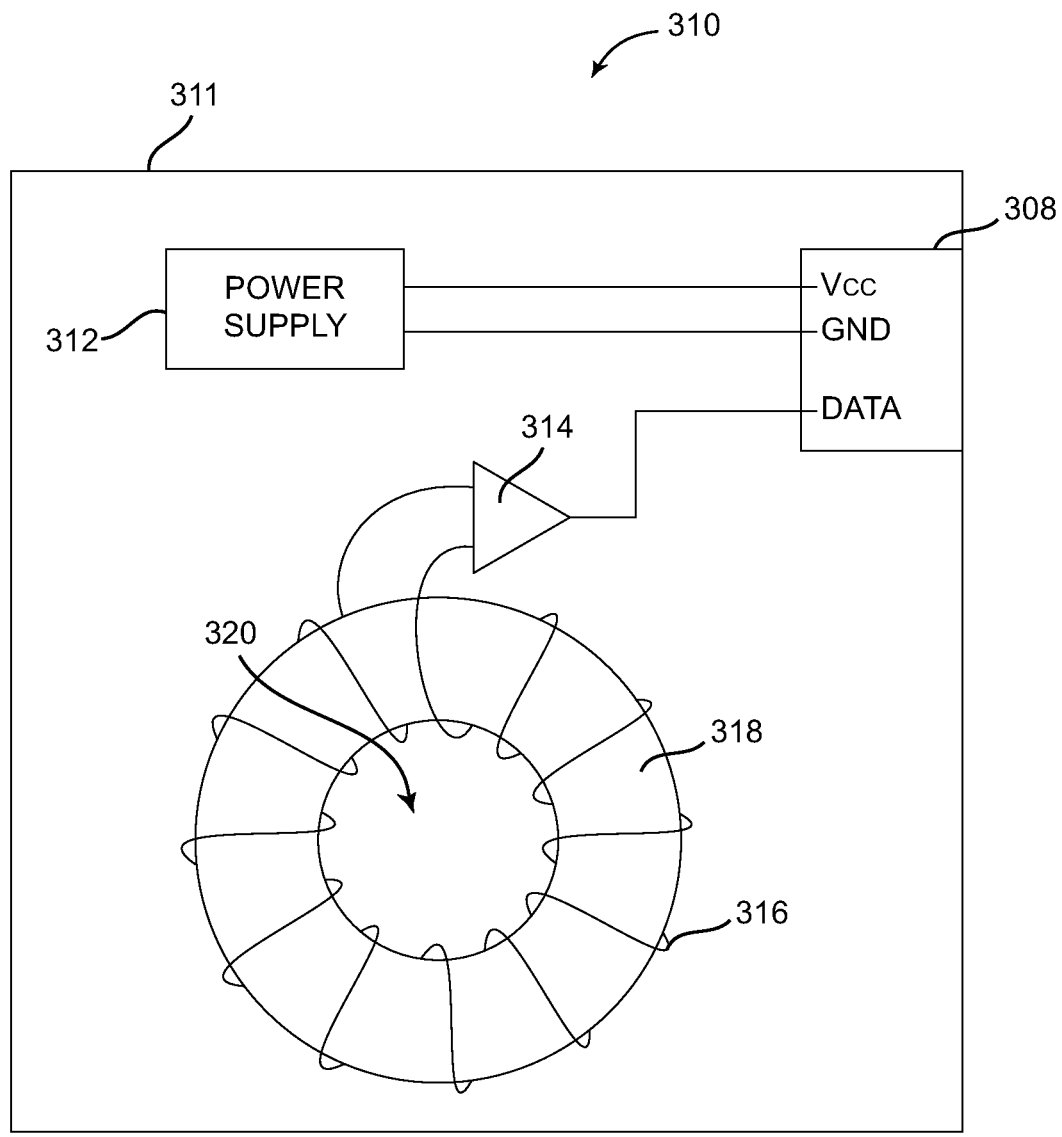
FIG. 3B is a more detailed illustration of a current sensor in the system of FIG. 3A in accordance with an embodiment of the present disclosure.

Turning to FIG. 3B, a more detailed illustration of current sensor 310 is shown in accordance with the present disclosure. As described above, current sensor 310 includes RJ-45 receptacle 308. Current sensor 310 also includes a magnetic core 318, where a coil 316 is wrapped around the magnetic core 318. It is to be appreciated that when current sensor 310 is disposed on a transmission line (such as lines A, B, and/or C), a portion of the transmission line (e.g., lines A, B, and/or C) is disposed through magnetic core 318 and coil 316, i.e., through aperture 320 formed in the housing 311. In this way when current passes through the transmission line at the location where current sensor 310 is disposed, a voltage signal is induced in coil 316, where the induced voltage signal in coil 316 is indicative of the current passing through the transmission line at the location where current sensor 310 is disposed. It is to be appreciated that the housing 311 may be configured for a solid core (i.e., a generally cylindrical housing that is disposed over a power line to be sensed before the line is connected to a load, etc.) or a split core (i.e., a housing that includes a hinge for coupled the housing to a power line that is already connected to a termination point).

In one embodiment, the coil 316 is coupled to an analog to digital (A/D) converter 314, such that when the induced voltage signal is provided to A/D converter 314, A/D converter 314 converts the induced voltage signal to a digital signal. The digital signal is then provided by A/D converter to a data channel (i.e., data channel 438, as will be described below) of RJ-45 receptacle 308. It is to be appreciated that in another embodiment, the induced voltage signal may be provided directly to the data channel of RJ-45 receptacle 308.

In one embodiment, current sensor 312 may include a power supply 312 either internal or external to the current sensor 310 to provide power to A/D converter 314 and any circuitry in the RJ-45 transmitter 306 that is coupled to the RJ-45 receptacle 308. The power supply 312 may provide power to the circuitry in the RJ-45 transmitter 306 via a voltage source channel and a ground channel (i.e., channel 434 and 436, as will be described below) in RJ-45 receptacle 308. It is to be appreciated that in another embodiment, coil 316 may be coupled to the voltage source channel and ground channel of RJ-45 receptacle 308 to provide power to the circuitry in RJ-45 transmitter 306 using a portion of the induced voltage signal instead of external power supply 312. In this embodiment, the induced voltage may also be used to provide power to A/D converter 314. As will be described in greater detail below, in yet another embodiment, IED 200 may provide power to A/D converter 314 and/or the circuitry in RJ-45 transmitter 306. In a further embodiment, power may be provided from the main voltage connection of the power distribution system that the current sensor is coupled to.

In one embodiment, receiver 302 and transmitter 306 are RJ-45 modular connectors. An RJ-45 modular connector is an 8 position 8 contact (8P8C) modular connector. Within each modular connector, there are 8 conducting wires. Modular connectors can be connected to RJ-45 receptacles, which also contain 8 conducting wires. When the RJ-45 modular connector is coupled to the RJ-45 receptacle, the conductive wires from the RJ-45 modular connector and the RJ-45 receptacle come into contact, whereby data and power can be transmitted electrically. Although the embodiments described below are described as using RJ-45 modular connectors, reference to RJ-45 connectors are for exemplary use only and not meant to limit the scope of the present disclosure, and many other modular connectors may be used in accordance with the teachings of the present disclosure.

Furthermore, it is to be appreciated that the dimensions of many commonly used modular connectors are such that a narrower modular connector can be inserted into a wider receptacle, where the wider receptacle has more conductive wires than the narrower modular connector. When a narrower modular connector is coupled to a wider receptacle, the modular receptacle's outermost conductive wires are unconnected. Therefore, when a narrower modular connector is coupled to a wider receptacle, in the wider receptacle, only the conductive wires that are coupled to the conductive wires within the narrower receptacle will be assigned a task (i.e., be a designated channel).

It is to be appreciated that the conductive wires in the modular connectors and receptacles of the embodiments described below may be assigned such that modular connectors with fewer conductive wires (for example, a modular RJ-9 connector with 4 conductive wires as is commonly used in telephonic connections), may be coupled to receptacles with a greater number of conductive wires (for example, an RJ-45 modular connector with 8 conductive wires). For example, a RJ-45 receptacle may be configured to use the four center conductors of the RJ-45 receptacle so either a RJ-9 or RJ-45 plug may be utilized.

Figure 4:
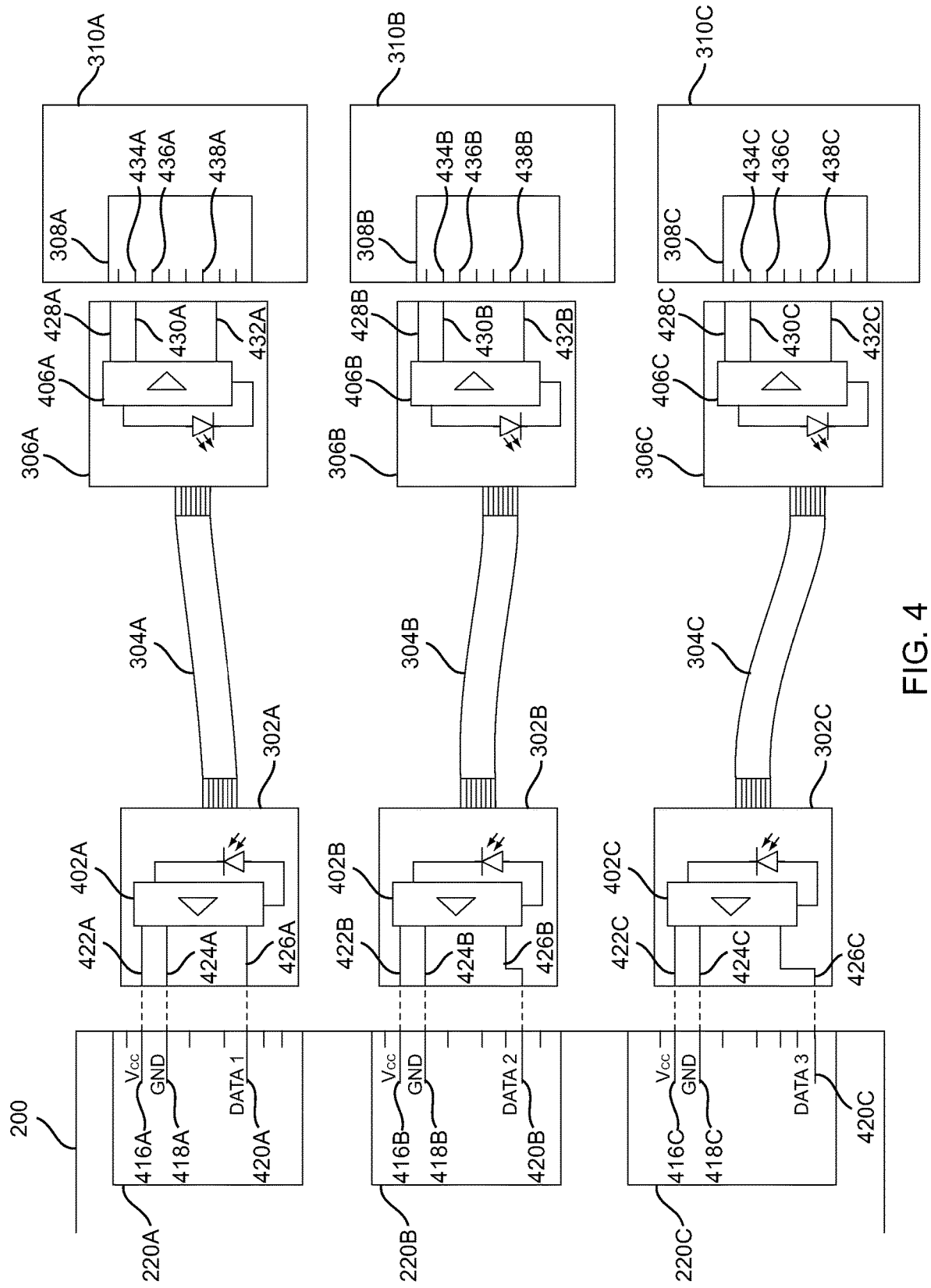
FIG. 4 is a more detailed illustration of FIG. 3A in accordance with an embodiment of the present disclosure.

Turning to FIG. 4, a more detailed illustration of FIG. 3A in accordance with an embodiment of the present disclosure is shown. RJ-45 receptacle 220 and RJ-45 receiver 302 each contain 8 conductive wires. When RJ-45 receiver 302 is coupled to RJ-45 receptacle 220, the conductive wires of RJ-45 receiver 302 come into contact with the conductive wires of RJ-45 receptacle 220. The conductive wires of RJ-45 receptacle 220 and RJ-45 receiver 302 that occupy the same positions when coupled will be assigned the same tasks. However, it is to be appreciated that it is not necessary to make use of all 8 conductive wires in RJ-45 receptacle 220 and RJ-45 receiver 302.

For instance, in this embodiment, only 3 conductive wires in RJ-45 receptacle 220 and RJ-45 receiver 302 are being used (however, it is to be appreciated that more may be used as desired). RJ-45 receptacle 220 includes voltage source channel 416, ground channel 418, and data channel 420. RJ-45 receiver 302 includes voltage source channel 422, ground channel 424, and data channel 426. When RJ-45 receiver 302 is coupled to RJ-45 receptacle 220, voltage source channel 422 comes into contact with voltage source channel 416, ground channel 424 comes into contact with ground channel 418, and data channel 426 comes into contact with data channel 420. Voltage source channel 422, ground channel 424, and data channel 426 are coupled to light to voltage converter (LVC) circuitry 402 inside the RJ-45 receiver 302. LVC circuitry 402 may include a silicon-based photodiode (or any other semiconductor material suitable) for converting a received light signal into an electrical signal.

Similarly, RJ-45 receptacle 308 and RJ-45 transmitter 306 each contain 8 conductive wires, however, in this embodiment only 3 are being used (although, again, it is to be appreciated that more may be used as desired). RJ-45 receptacle 308 includes voltage source channel 434, ground channel 436, and data channel 438. RJ-45 transmitter 306 includes voltage source channel 428, ground channel 430, and data channel 432. When RJ-45 transmitter 306 is coupled to RJ-45 receptacle 308, voltage source channel 428 comes into contact with voltage source channel 434, ground channel 430 comes into contact with ground channel 436, and data channel 432 comes into contact with data channel 438. Also, in RJ-45 transmitter 306, voltage source channel 428, ground channel 430, and data channel 430 are coupled to voltage to light converter (VLC) circuitry 406. VLC circuitry 406 may include a light-emitting diode (LED) or a laser diode (LD) (or any other combination of circuitry and semiconducting material that produces light when suitable voltage is applied) for converting received electrical signals into light signals.

An exemplary use of system 300 for using an RJ-45 modular connector to convert electrical signals to light signals (and vice versa) and to transmit the converted signals from/to current sensors 310A, 310B, and 310C and IED 200 via fiber-optic cables (or any other combination of cables and materials that can be used to transmit light signals) will now be described in relation to FIGS. 1, 2, 3, and 4.

Turning to FIG. 3A, when current passes through lines A, B, and/or C, a voltage is induced on coil 318 disposed in current sensor 310. Then, turning to FIG. 4, the induced voltage signal is transmitted to data channel 438 in RJ-45 receptacle 308. As stated above, it is to be appreciated that the induced voltage signal may be converted from an analog signal to a digital signal in A/D converter 314 in current sensor 310 before being transmitted to RJ-45 receptacle 308. Then, the voltage signal is transmitted from data channel 438 to data channel 432 in RJ-45 transmitter 306. Once the voltage signal is received in RJ-45 transmitter 306, VLC circuitry 406 converts the voltage signal into a light signal. It should be appreciated that, as stated above, the induced voltage in current sensor 310 may also be used to supply voltage to the VLC circuitry 406 via voltage source channel 434 and voltage source channel 428. Therefore, in this embodiment, current sensor 310 and RJ-45 transmitter 306 do not require an independent power supply. It is further to be appreciated that in certain embodiments the data channel 438 may be used in conjunction with a ground channel (not shown). In other embodiments, the data channel 438 may employ ground channel 436 as a reference.

After the voltage signal has been converted to a light signal by VLC circuitry 406, the light signal is provided to an input of fiber-optic cable 304 and the light signal will propagate along fiber-optic cable 304 until the light signal is received by RJ-45 receiver 302. Once received by RJ-45 receiver 302, LVC circuitry 402 converts the light signal into a voltage signal. Then, the voltage signal is transmitted from data channel 426 in RJ-45 receiver 302 to data channel 420 in RJ-45 receptacle 220. The voltage signal received by RJ-45 receptacle 220 may then transmitted from data channel 420 to sensor module 12 in IED 200.

It is to be appreciated that LVC circuitry 402 may be powered by the power supply 16 in IED 200. The power is transmitted from power supply 16 to the LVC circuitry 402 via voltage channel 416 in RJ-45 receptacle 220 and voltage channel 422 in RJ-45 receiver 302.

Turning to FIG. 1, once the voltage signal is received by sensor module 12, the voltage signal may be transmitted to A/D converter 14 (i.e., if the voltage signal was not converted to a digital signal in A/D converter 314) where the analog signal received can be converted to a digital signal. From A/D converter 14, the signal may be transmitted to the FPGA 80 and then to the CPU 50, and/or DSP1 60, and/or DSP2 70, or any combination thereof, where the signal may be processed and the IED 200 may make any calculation or adjustments needed. If desired, the signal may be stored in volatile memory 18 or non-volatile memory 20. Furthermore, if desired, any measurement, as calculated by IED 200, may be transmitted to multimedia interface 22 to be displayed on IED 200 or communicated to an external device via the communications module 24.

As stated above, in one embodiment, an A/D converter 314 may be disposed in the current sensor 310 to transmit digital data to the IED 200. In this way, when digital data is sent to IED 200 via fiber-optic cable 304, the digital data may be transmitted directly to the FPGA 80 (bypassing A/D converter 14) and/or the CPU 50 and/or DSP1 60 and/or DPS2 70, or any combination thereof, where the digital data may be processed and the IED 200 may make any calculation or adjustments needed. In a further embodiment, at least one processor (not shown) is disposed in the current sensor 310 so certain calculations occur at the sensor 310, such as RMS data.

Figure 5:
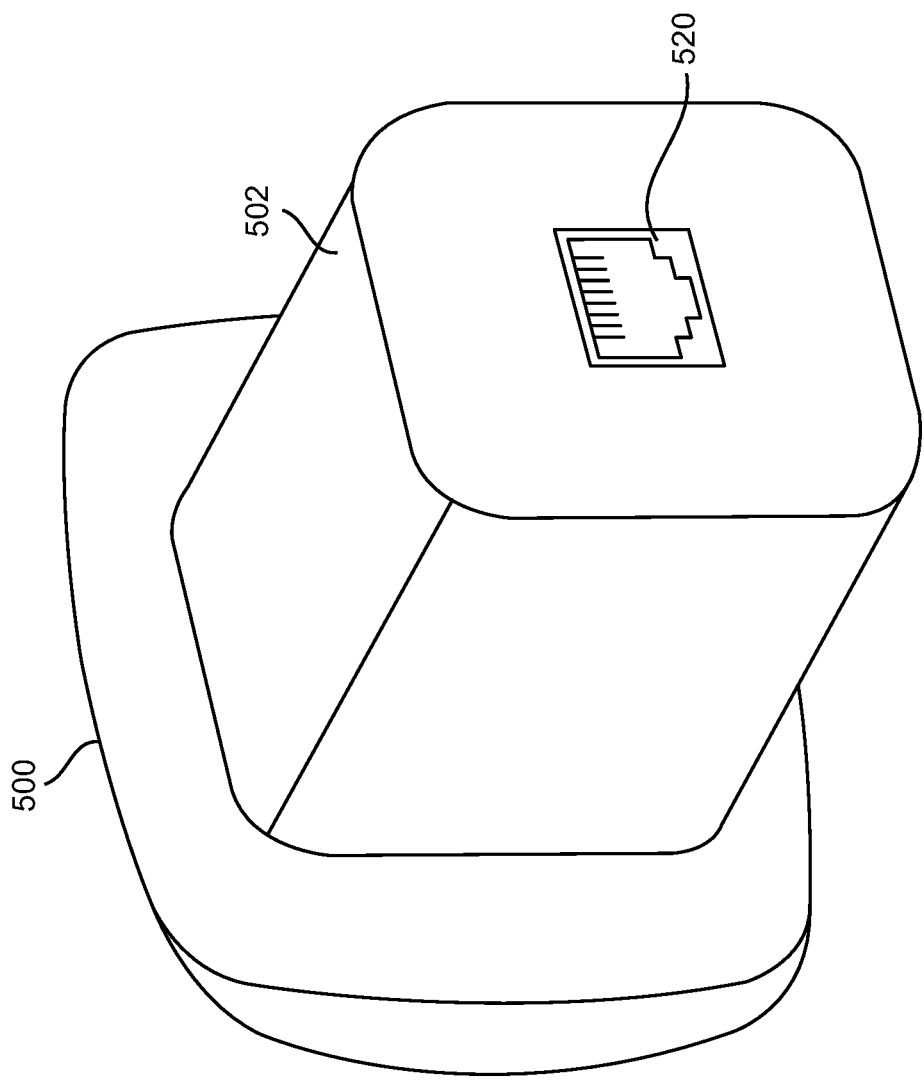
FIG. 5 is perspective view of an exemplary IED in accordance with another embodiment of the present disclosure.

In an alternative embodiment, fiber-optic cables 304A, 304B, and 304C may be merged at a predetermined point between RJ-45 transmitter 306 and RJ-45 receiver 302. Turning to FIG. 5, an alternative embodiment of an IED device in accordance with the present disclosure is illustrated. In this embodiment, IED 500 is shown. IED 500 has similar components as IED 10, 200. However, IED 500 does not include RJ-45 receptacles 220A, 220B, and 220C. Instead, IED 500 includes only one RJ-45 receptacle, RJ-45 receptacle 520 disposed on housing 502 of IED 500. It is to be appreciated that receptacle 520 may be disposed on any surface of the housing 502 of IED 500.

Figure 6:
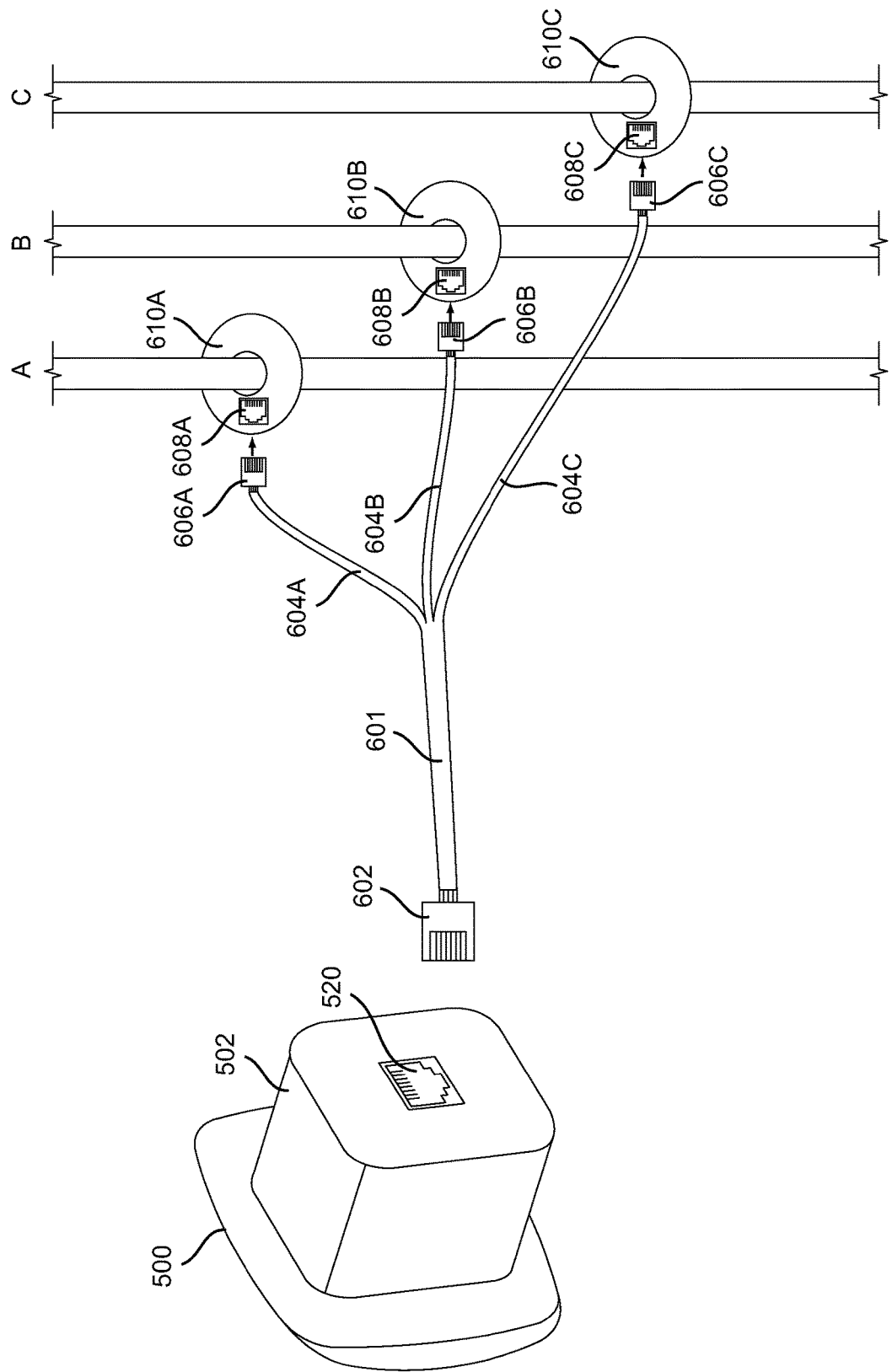
FIG. 6 is an illustration of the IED of FIG. 5 coupled with at least one current sensor on a power distribution system using fiber-optic cables in accordance with another embodiment of the present disclosure.

Turning to FIG. 6, IED 500 is shown coupled to current sensor 610 on power distribution lines A, B, and C via fiber-optic cable 601 and fiber-optic cables 604A, 604B, and 604C. Current sensor 610 is disposed on transmission lines A, B, and C to measure current. Current sensor 610 includes RJ-45 receptacle 608. RJ-45 transmitter 606 is coupled to RJ-45 receptacle 608. RJ-45 transmitters 606A, B, and C are each coupled to fiber-optic cables 604A, 604B, and 604C. At a predetermined point, the separate fibers in fiber-optic cables 604A, 604B, and 604C are merged into fiber-optic cable 601. After this predetermined point, the fibers in fiber-optic cables 604A, 604B, and 604C carrying light signals transmitted from RJ-45 transmitters 606A, 606B, and 606C will all be contained within fiber-optic cable 601. Fiber-optic cable 601 is coupled to RJ-45 receiver 602. RJ-45 receiver 602 is coupled to RJ-45 receptacle 520 on IED 500. Also, it is to be appreciated that RJ-45 receptacle 520 is coupled to sensor module 12 in IED 500, in certain embodiments. It is to be appreciated that the receptacle 520 may be coupled to other components depending on whether the received signal is in analog or digital form.

Figure 7:
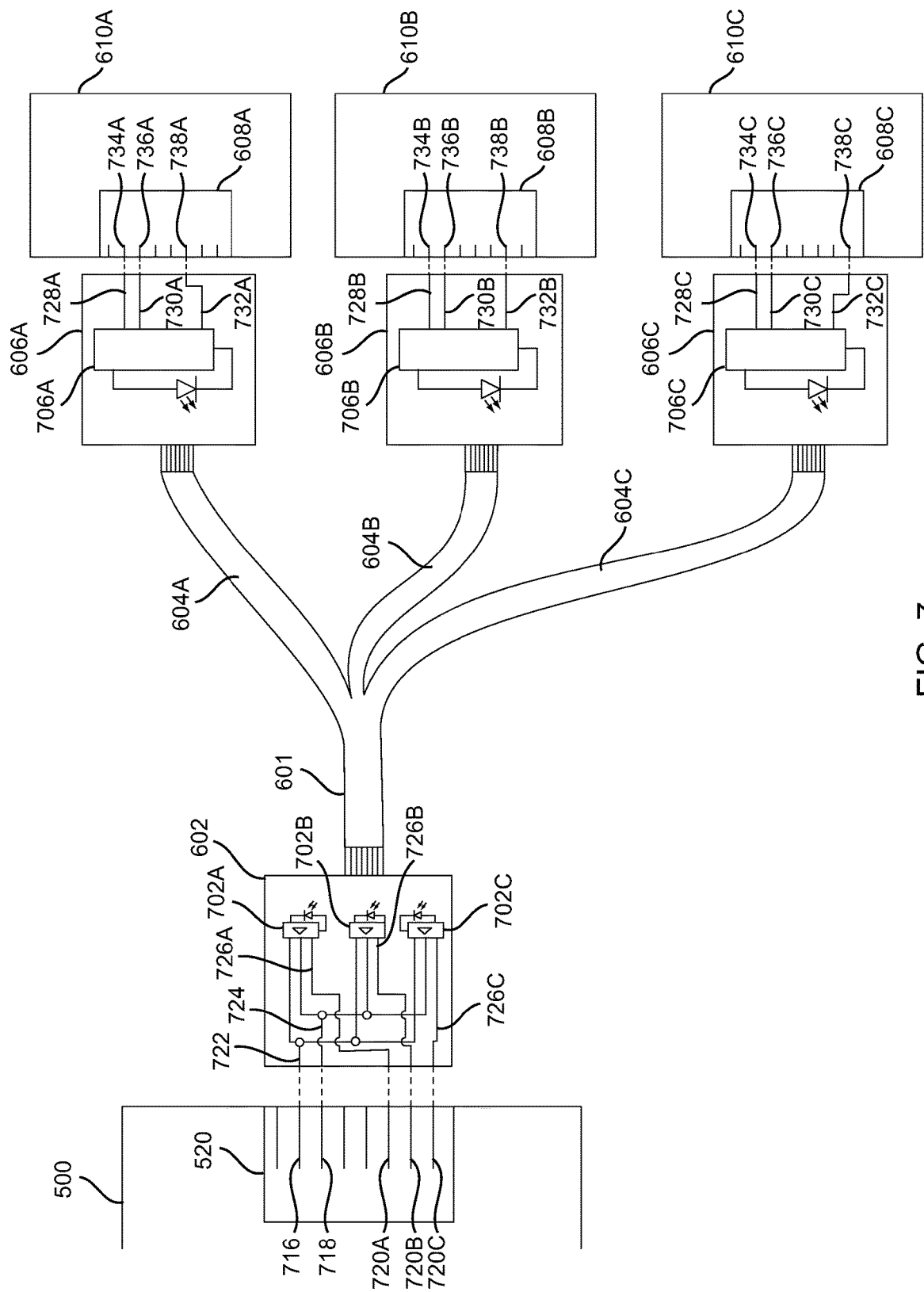
FIG. 7 is a more detailed illustration of FIG. 6 in accordance with the present disclosure.

Turning to FIG. 7, a more detailed illustration of FIG. 6 in accordance with an embodiment of the present disclosure is shown. As in the previous embodiment, in this embodiment, RJ-45 receptacle 520 and RJ-45 receiver 602 each contain 8 conductive wires. However, in this embodiment, RJ-45 receptacle 520 and RJ-45 receiver 602 each use 5 of the 8 available conductive wires (although, it is to be appreciated that more conductive wires may be used as desired). RJ-45 receptacle 520 includes voltage source channel 716, ground channel 718, and data channels 720A, 720B, and 720C. RJ-45 receiver 602 includes voltage source channel 722, ground channel 724, and data channels 726A, 726B, and 726C. When RJ-45 receiver 602 is coupled to RJ-45 receptacle 520, voltage source channel 722 comes into contact with voltage source channel 716, ground channel 724 comes into contact with ground channel 718, data channel 726A comes into contact with data channel 720A, data channel 726B comes into contact with data channel 720B, and data channel 726C comes into contact with data channel 720C. It is to be appreciated that the data channel may be associated to a ground channel as described above.

Furthermore, RJ-45 receiver 602 includes LVC circuitry 702A, 702B, and 702C for converting light signals received from RJ-45 transmitters 606A, 606B, and 606C, respectively, into electrical signals. It is to be appreciated that LVC circuitry 702 is identical to LVC circuitry 402 from FIG. 4 above. Returning to FIG. 7, in RJ-45 receiver 602, data channel 726A is coupled to LVC circuitry 702A, data channel 726B is coupled to LVC circuitry 702B, and data channel 726C is coupled to LVC circuitry 702C. Voltage source channel 722 is split into 3 conductive wires inside RJ-45 receiver 602, wherein one conductive wire is coupled to LVC circuitry 702A, another is coupled to LVC circuitry 702B, and the last is coupled to LVC circuitry 702C. Similarly, in RJ-45 receiver 602 the ground channel 724 is split into 3 conductive wires, where one of the three conductive wires is coupled to LVC circuitry 702A, another is coupled to LVC circuitry 702B, and the last is coupled to LVC circuitry 702C.

As with RJ-45 receptacle 520 and RJ-45 receiver 602, RJ-45 receptacle 608 and RJ-45 transmitter 606 each contain 8 conductive wires. As in the above-described embodiments, in this embodiment, only 3 conductive wires in each RJ-45 receptacle 608 and RJ-45 transmitter 606 are being used (although, again, it is to be appreciated that more may be used as desired). RJ-45 receptacle 608 includes voltage source channel 734, ground channel 736, and data channel 738. RJ-45 transmitter 606 includes voltage source channel 728, ground channel 730, and data channel 732. When RJ-45 transmitter 606 is coupled to RJ-45 receptacle 608 voltage source channel 728 comes into contact with voltage source channel 734, ground channel 730 comes into contact with ground channel 736, and data channel 732 comes into contact with data channel 738. Also, voltage source channel 728, ground channel 730, and data channel 732 are coupled to VLC circuitry 706 inside RJ-45 transmitter 606. It is to be appreciated that VLC circuitry 706 is identical to VLC circuitry 406 from FIG. 4 in the above-described embodiment.

Below, an exemplary usage of one or more RJ-45 modular connectors to convert electrical signals to light signals (and vice versa) and transmit the signals from current sensors 610A, 610B, and 610C to an RJ-45 receptacle included in IED 500 via fiber-optic cables (or any other cables that can be used to transmit light signals) will be described in relation to FIGS. 1, 6, and 7.

Turning to FIG. 6, when current passes through lines A, B, and/or C a voltage is induced on a coil located in current sensor 610. Then, turning to FIG. 7, the induced voltage signal is transmitted to data channel 738 in RJ-45 receptacle 608. Then, the voltage signal is transmitted from data channel 738 to data channel 732 in RJ-45 transmitter 606. Once the voltage signal is received in RJ-45 transmitter 606, VLC circuitry 706 will convert the voltage signal into a light signal. It is to be appreciated that the induced voltage in current sensor 610 may also be used to supply voltage to the VLC circuitry 706 via voltage source channel 734 and voltage source channel 728; therefore, in this embodiment, current sensor 610 and RJ-45 transmitter 606 do not require an independent power supply.

After the voltage signal has been converted to a light signal by VLC circuitry 706A, 706B, or 706C, the light signal will propagate along fiber-optic cables 604A, 604B, and/or 604C. At a predetermined point, fiber-optic cables 604A, 604B, and 604C will be merged into fiber-optic cable 601. The fibers carrying light signals in fiber-optic cables 604A, 604B, and 604C will now all be contained in fiber-optic cable 601. Any light signals transmitted from RJ-45 transmitter 606 will then propagate along fiber-optic cable 601 until RJ-45 receiver 602 receives the light signal(s). Once received by RJ-45 receiver 602, any light signals transmitted from RJ-45 transmitter 606A will be converted back to a voltage signal in LVC circuitry 702A. Similarly, any light signals transmitted from RJ-45 transmitter 606B will be converted to voltage signals in LVC circuitry 702B, and any light signals transmitted from RJ-45 transmitter 606C will be converted to voltage signals in LVC circuitry 702C.

The voltage signal that has been converted will then be transmitted from RJ-45 receiver 602 to RJ-45 receptacle 520 in IED 500 via data channel 726A to data channel 720A, if converted in LVC circuitry 702A, or via data channel 726B to data channel 720B, if converted in LVC circuitry 702B, or via data channel 726C to data channel 720C, if converted in LVC circuitry 702C. Any electrical signal received by RJ-45 receptacle 520 may then transmitted via data channel 720A, 720B, and/or 720C to sensor module 12 in IED 500 or any other component of IED 500 that is desired, e.g., A/D converters 14, FPGA 80, CPU 50, DSP1 60, DSP2 70, etc.

It is to be appreciated that LVC circuitry 702, inside RJ-45 receiver 602, may be powered by the power supply 16 in IED 500. The power is transmitted from the IED 500 to the LVC circuitry 702 via voltage source channel 716 in RJ-45 receptacle 520 and voltage source channel 722 in RJ-45 receiver 602.

Turning to FIG. 1, once the voltage signal is received by sensor module 12, the voltage signal may be transmitted to A/D converter 14 (i.e., if the induced voltage signal has not already been converted to a digital signal in current sensor 610) where the analog signal received can be converted to a digital signal. From A/D converter 14, the signal may be transmitted to the FPGA 80 and then to the CPU 50, and/or DSP1 60, and/or DSP2 70, or any combination thereof, where the signal will be processed and the IED 500 will make any calculation or adjustments needed. If desired, the signal may be stored in volatile memory 18 or non-volatile memory 20.

In another embodiment of the present disclosure, a conversion module may be used to merge the three fiber-optic cables from power distribution lines A, B, and C into one fiber-optic cable.

Figure 8B:
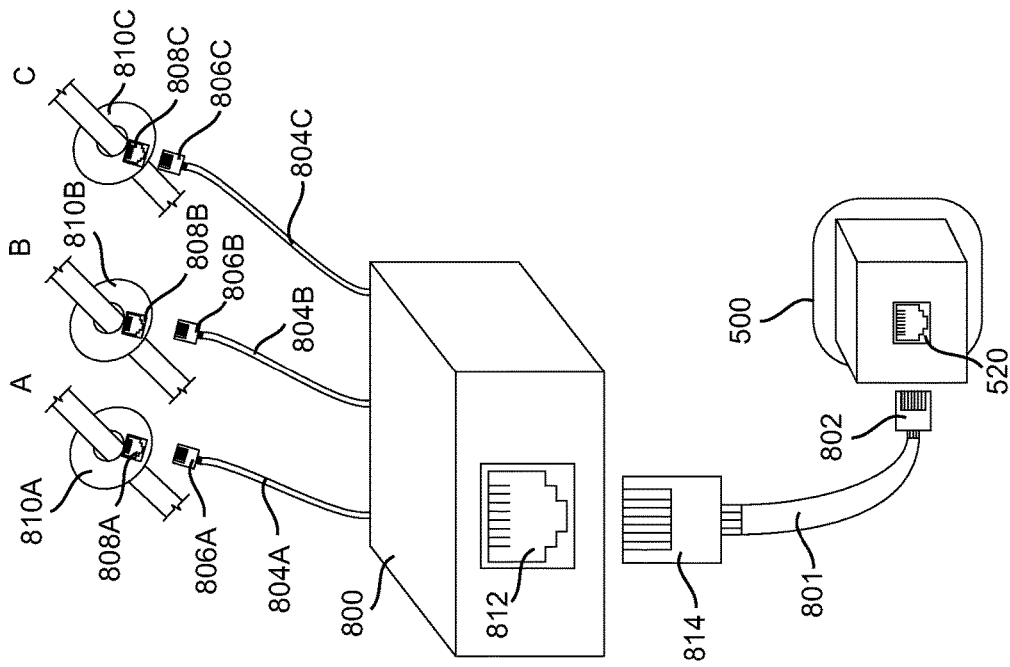
FIG. 8B is an opposite perspective view of FIG. 8A in accordance with the present disclosure.
Figure 8A:
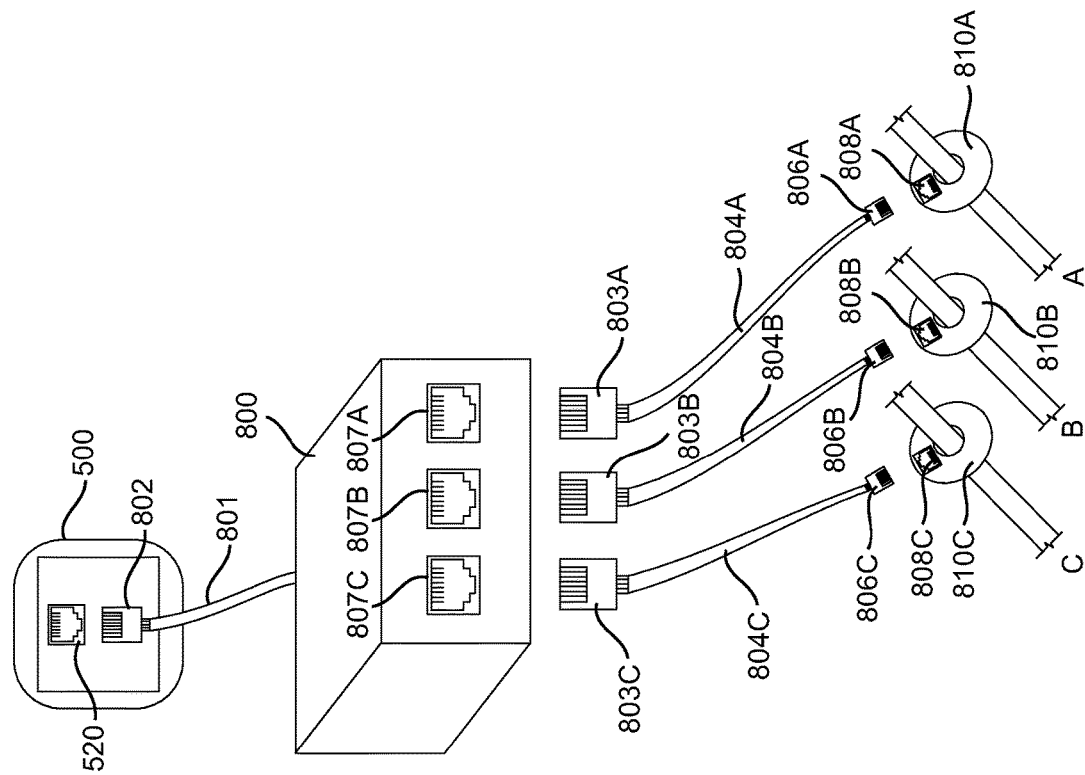
FIG. 8A is perspective view of the IED of FIG. 5 coupled with at least one current sensor on a power distribution system using fiber-optic cables and an exemplary conversion module in accordance with another embodiment of the present disclosure.

Turning to FIGS. 8A and 8B, IED 500 is shown from two opposite perspectives coupled with current sensor 810 on power distribution lines A, B, and C using RJ-45 module connectors, fiber-optic cables and conversion module 800 in accordance with an alternative embodiment of the present disclosure. As in previous embodiments of the present disclosure, current sensor 810 is disposed on lines A, B, and C to measure current. To couple IED 500 to current sensor

810, RJ-45 receptacle 808 in current sensor 810 is coupled to RJ-45 transmitter 806; RJ-45 transmitter 806 is coupled to RJ-45 receiver 803 via fiber-optic cable 804; RJ-45 receiver 803 is coupled to RJ-45 receptacle 807 on conversion module 800; RJ-45 receptacle 812 is coupled to RJ-45 transmitter 814; RJ-45 transmitter 814 is coupled to RJ-45 receiver 802 via fiber optic cables 801; and finally, RJ-45 receiver 802 is coupled to RJ-45 receptacle 520 on IED 500. As in the previous embodiment of the present disclosure, it is to be appreciated that RJ-45 receptacle 520 is coupled to sensor module 12 in IED 500, or other components as described above.

Figure 9A:
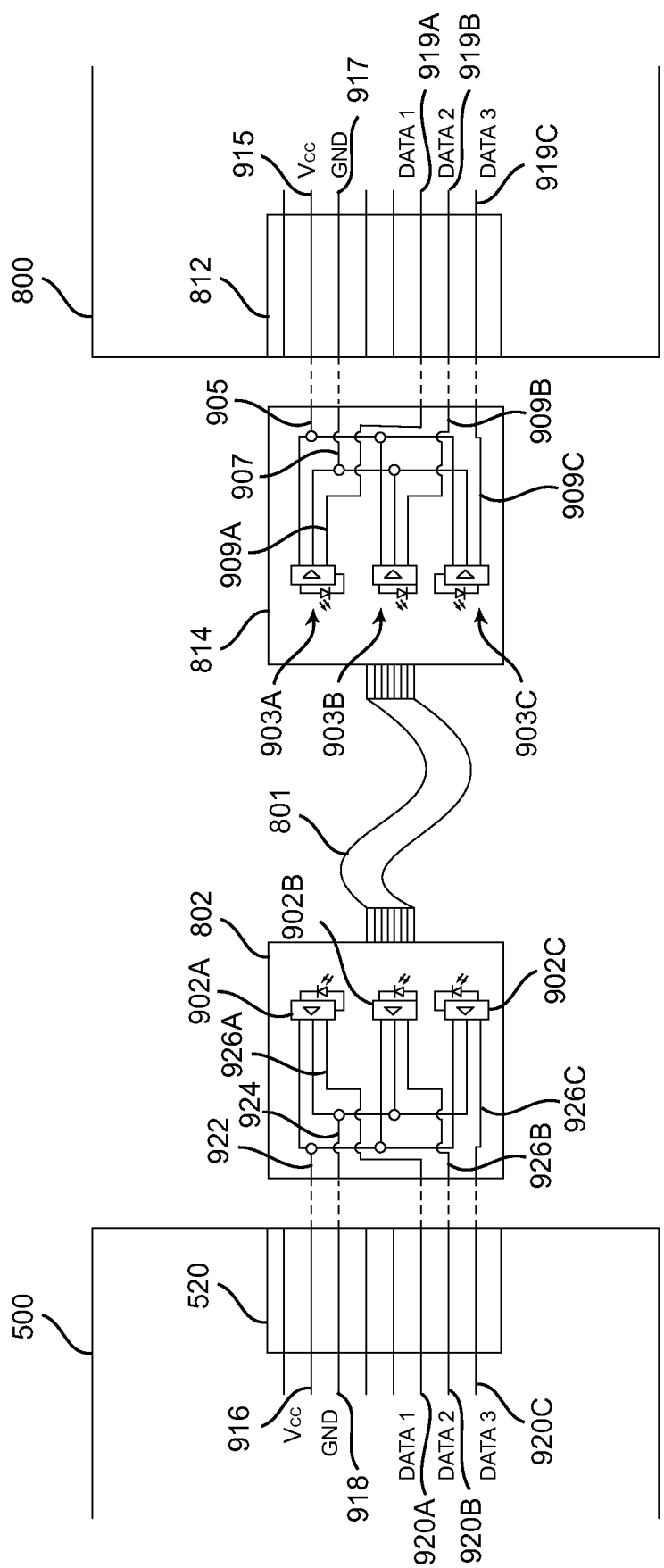
FIG. 9A is a more detailed illustration of a portion of FIG. 8, where the IED of FIG. 5 is shown coupled to an exemplary conversion module using fiber-optic cables in accordance with the present disclosure.

Turning to FIG. 9A, a more detailed illustration of a portion of FIG. 8B is shown, where IED 500 is coupled to conversion module 800 in accordance with an embodiment of the present disclosure. As in the previous embodiments of the present disclosure, in this embodiment, RJ-45 receptacle 520 and RJ-45 receiver 802 each include 8 conductive wires. In this embodiment, 5 of the 8 conductive wires are used in each (although, it is to be appreciated that more conductive wires may be used as desired). RJ-45 receptacle 520 includes voltage source channel 916, ground channel 918, and data channels 920A, 920B, and 920C. Also, RJ-45 receiver 802 includes voltage source channel 922, ground channel 924, and data channels 926A, 926B, and 926C. When RJ-45 receiver 802 is coupled to RJ-45 receptacle 520, voltage source channel 922 comes into contact with voltage source channel 916, ground channel 924 comes into contact with ground channel 918, data channel 926A comes into contact with data channel 920A, data channel 926B comes into contact with data channel 920B, and data channel 926C comes into contact with data channel 920C.

Furthermore, in FIG. 9A, RJ-45 receiver 802 includes LVC circuitry 902A, 902B, and 902C for converting light signals received from RJ-45 transmitters 806A, 806B, and 806C respectively into electrical signals. It is to be appreciated that LVC circuitry 902 is identical to LVC circuitry 402 from FIG. 4 above. Returning to FIG. 9A, in RJ-45 receiver 802, data channel 926A is coupled to LVC circuitry 902A, data channel 926B is coupled to LVC circuitry 902B, and data channel 926C is coupled to LVC circuitry 902C. Voltage source channel 922 is split into 3 conductive wires inside RJ-45 receiver 802, wherein one conductive wire is coupled to LVC circuitry 902A, another is coupled to LVC circuitry 902B, and the last is coupled to LVC circuitry 902C. Similarly, in RJ-45 receiver 802, ground channel 924 is split into 3 conductive wires, where one conductive wire is coupled to LVC circuitry 902A, another is coupled to LVC circuitry 902B, and the last is coupled to LVC circuitry 902C.

RJ-45 transmitter 814 includes voltage source channel 905, ground channel 907, and data channels 909A, 909B, and 909C. Furthermore, RJ-45 receptacle 812 on conversion module 800 includes voltage source channel 915, ground channel 917, and data channels 919A, 919B, and 919C. When RJ-45 transmitter 814 is coupled to RJ-45 receptacle 812, voltage source channel 905 comes into contact with voltage source channel 915, ground channel 907 comes into contact with ground channel 917, data channel 909A comes into contact with data channel 919A, data channel 909B comes into contact with data channel 919B, and data channel 909C comes into contact with data channel 919C.

RJ-45 transmitter 814 also includes VLC circuitry 903A, 903B, and 903C for converting light signals into electrical signals. It is to be appreciated that LVC circuitry 902 is identical to VLC circuitry 402 from FIG. 4 above. Returning to FIG. 9, in RJ-45 transmitter 814, data channel 909A is coupled to VLC circuitry 903A, data channel 909B is coupled to VLC circuitry 903B, and data channel 909C is coupled to VLC circuitry 903C. Also, voltage source channel 905 is split into 3 conductive wires inside RJ-45 transmitter 814, wherein one conductive wire is coupled to VLC circuitry 903A, another is coupled to VLC circuitry 903B, and the last is coupled to VLC circuitry 903C. Similarly, in RJ-45 transmitter 814, ground channel 907 is split into 3 conductive wires, where one conductive wire is coupled to VLC circuitry 903A, another is coupled to VLC circuitry 903B, and the last is coupled to VLC circuitry 903C.

Figure 9B:
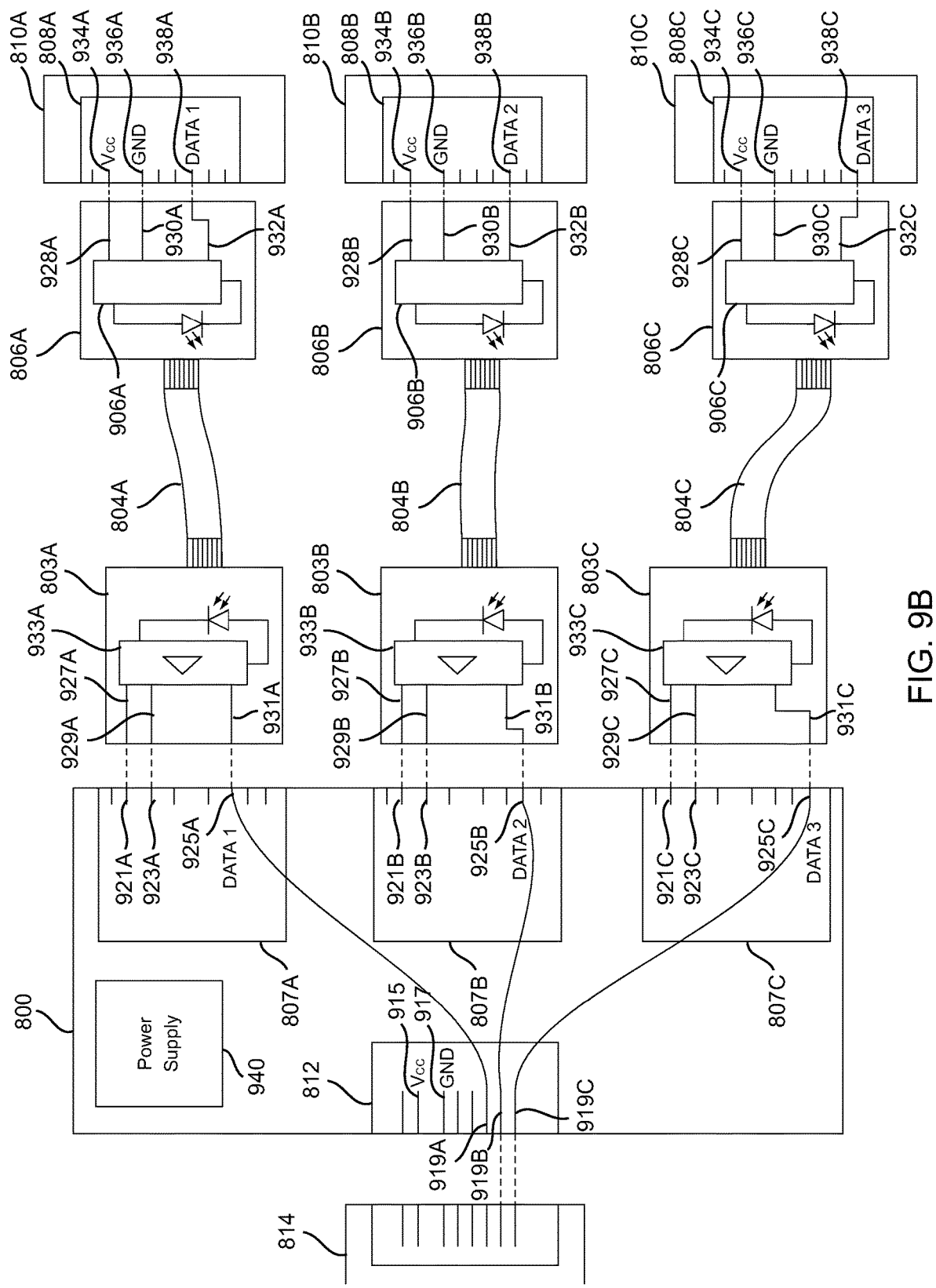
FIG. 9B is a more detailed illustration of a portion of FIG. 8, where an exemplary conversion module is shown coupled to at least one current sensor on a power distribution system using fiber-optic cables in accordance the present disclosure.

Turning to FIG. 9B, a more detailed illustration of a portion of FIG. 8A is shown, where conversion module 800 is coupled to current sensor 810 via fiber-optic cable 804 in accordance with an embodiment of the present disclosure. In FIG. 9B, conversion module 800 includes RJ-45 receptacles 807A, 807B, and 807C. Each RJ-45 receptacle 807 includes voltage source channel 921, ground channel 923, and data channel 925. Data channels 925A, 925B, and 925C in RJ-45 receptacles 807A, 807B, and 807C are coupled to data channels 919A, 919B, and 919C, respectively, in RJ-45 receptacle 812 via conductive wires.

Conversion module 800 also includes power supply 940. It is to be appreciated that power supply 940 is an independent power supply. Returning to FIG. 9B, power supply 940 is coupled to (the coupling is not shown) RJ-45 receptacle 812 and RJ-45 receptacle 807A, 807B, and 807C to power VLC circuitry 903A, 903B, and 903C in RJ-45 transmitter 814 and LVC circuitry 933A, 933B, and 933C in RJ-45 receiver 803A, 803B, and 803C. It is to be appreciated that power supply 940 may be included in conversion module 800 or at a desired location outside conversion module 800.

RJ-45 receivers 803A, 803B, and 803C are coupled to RJ-45 receptacles 807A, 807B, and 807C. Each RJ-45 receiver 803 includes LVC circuitry 933. Each LVC circuitry 933 is coupled to voltage source channel 927, ground channel 929, and data channel 931. When RJ-45 receiver 803 is coupled to RJ-45 receptacle 807, voltage source channel 927 comes into contact with voltage source channel 921, ground channel 929 comes into contact with ground channel 923, and data channel 931 comes into contact with data channel 925.

Furthermore, RJ-45 receiver 803 is coupled to RJ-45 transmitter 806 via fiber-optic cable 804. RJ-45 transmitter 806 includes VLC circuitry 906. VLC circuitry 906 is coupled to voltage source channel 928, ground channel 930, and data channel 932. Also, RJ-45 transmitter 806 is coupled to RJ-45 receptacle 808 on current sensor 810. RJ-45 receptacle 808 includes voltage source channel 934, ground channel 936, and data channel 938. When RJ-45 transmitter 806 is coupled to RJ-45 receptacle 808, voltage source channel 928 comes into contact with voltage source channel 934, ground channel 930 comes into contact with ground channel 936, and data channel 932 comes into contact with data channel 938.

An exemplary usage of one or more RJ-45 modular connectors to convert electrical signals to light signals (and vice versa) and to transmit the signals from current sensors 810A, 810B, and 810C to an RJ-45 receptacle included in IED 500 via fiber-optic cables (or any other cables that can be used to transmit light signals) using conversion module 800 will now be described in relation to FIGS. 1, 8, 9A, and 9B.

Turning to FIG. 8, when current passes through power distribution lines A, B, and/or C a voltage is induced on a coil located in current sensor 810. Then, turning to FIG. 9B, the induced voltage signal is transmitted to data channel 938 in RJ-45 receptacle 808 to data channel 932 in RJ-45 transmitter 806. Once the voltage signal is received in RJ-45 transmitter 806, VLC circuitry 906 inside RJ-45 transmitter 806 will convert the voltage signal into a light signal. As stated in previous embodiments, the induced voltage in current sensor 810 may also be used to supply power to VLC circuitry 906 via voltage channel 934 and voltage channel 928; therefore, the current sensor 810 and the RJ-45 transmitter 806 do not require an independent power supply.

After the voltage signal has been converted to a light signal by VLC circuitry 906, the light signal will propagate along fiber-optic cables 804A, 804B, and/or 804C until the light signal reaches RJ-45 receivers 803A, 803B, and/or 803C. Once received by RJ-45 receiver 803, the light signal will be converted back to a voltage signal by LVC circuitry 933 included in RJ-45 receiver 803. Then, the voltage signal will be transmitted from data channel 931A, B, and/or C in RJ-45 receiver 803 to data channel 925A, 925B, and/or 925C in conversion module 800. Any voltage signals received in data channel 925A, 925B, and/or 925C will be transmitted via conductive wire to data channel 919A, B, and/or C in RJ-45 receptacle 812.

Then, turning to FIG. 9A, from data channel 919A, 919B, and/or 919C in RJ-45 receptacle 812, the voltage signals will be transmitted to VLC circuitry 903A, 903B, and/or 903C via data channel 909A, 909B, and/or 909C in RJ-45 transmitter 814. VLC circuitry 903 will then convert the voltage signal into a light signal and the converted light signal will be transmitted along fiber-optic cable 801 to RJ-45 receiver 802. Once received by RJ-45 receiver 802, the light signal will be converted by LVC circuitry 902A, 902B, and/or 902C into a voltage signal. The voltage signal that has been converted will then be transmitted from RJ-45 receiver 802 to RJ-45 receptacle 520 via data channel 926 in RJ-45 receiver 802 and data channel 920 in RJ-45 receptacle 520. Any electrical signal received by RJ-45 receptacle 520 is then transmitted via conductive wire to sensor module 12 in IED 500, or other component as described above.

It is to be appreciated that the LVC circuitry 902 included in RJ-45 receiver 802 may be powered by the power supply 16 in IED 500. The power is transmitted from the IED 500 to the LVC circuitry 902 via voltage source channel 916 in RJ-45 receptacle 520 and voltage source channel 922 in RJ-45 receiver 802.

Turning to FIG. 1, once the voltage signal is received by sensor module 12, the voltage signal may be transmitted to A/D converter 14 (i.e., if the induced voltage signal has not already been converted to a digital signal in current sensor 610) where the analog signal received can be converted to a digital. From A/D converter 14, the voltage signal may be transmitted to the FPGA 80 and/or the CPU 50, and/or DSP1 60, and/or DSP2 70, or any combination thereof, where the signal will be processed and IED 500 will make any calculation or adjustments needed. If desired, the signal may be stored in volatile memory 18 or non-volatile memory 20. Furthermore, if desired, any measurement, as calculated by IED 500, may be transmitted to multimedia interface 22 to be displayed on IED 500 or communicated to an external device via the communications module 24.

Although in previous embodiments, current sensor 310/610/810 has been used to power circuitry in RJ-45 transmitter 406/606/806, in an alternative embodiment, circuitry in RJ-45 transmitter 406/606/806 may be powered using light energy provided via fiber-optic cables by a light signal module coupled to IED 200/500.

Figure 10:
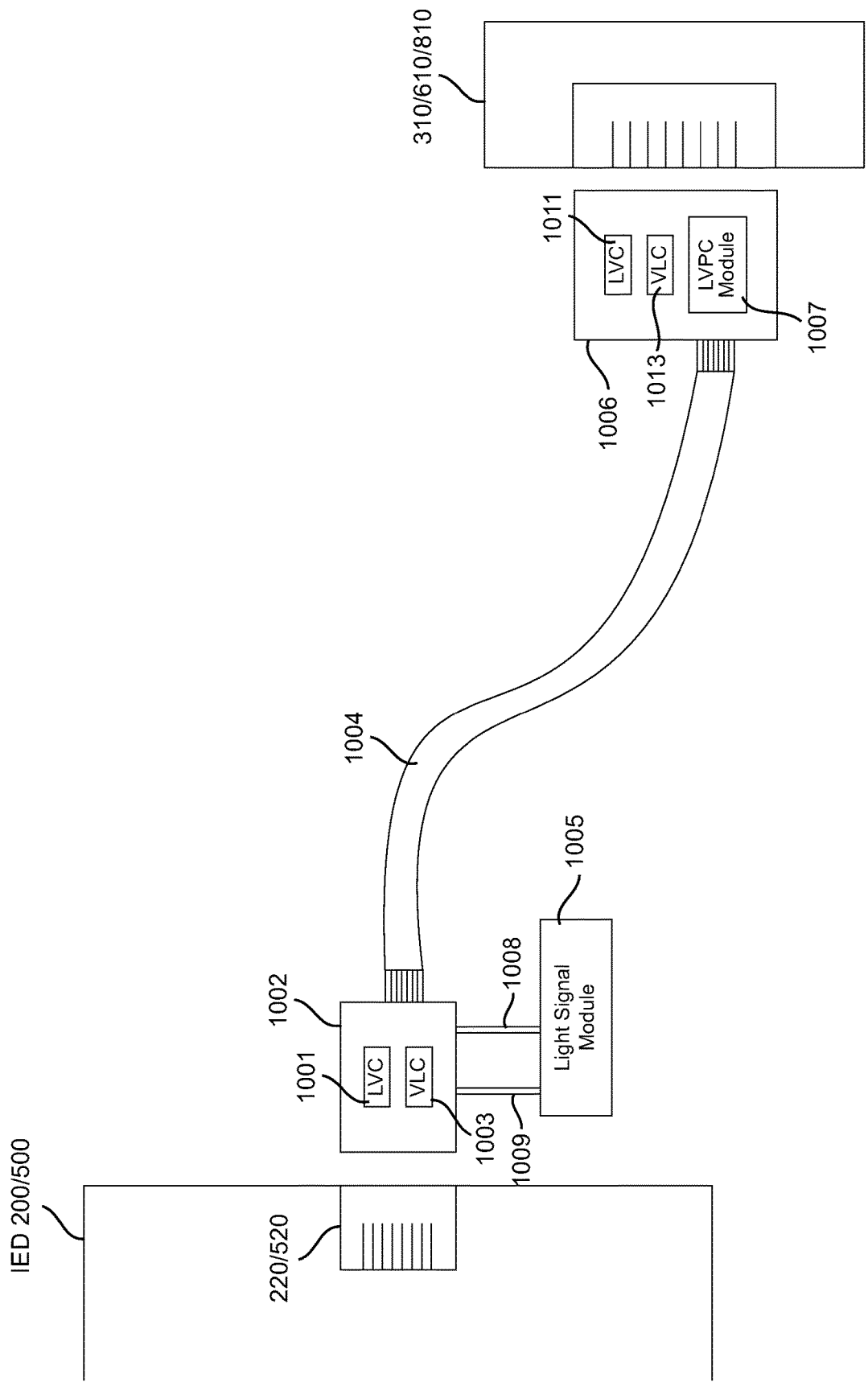
FIG. 10 is an illustration of an IED coupled with a current sensor on a power distribution system using fiber-optic cables, which include a light to voltage power conversion module (LVPCM), in accordance with an embodiment of the present disclosure.

Turning to FIG. 10, a light to voltage power converter (LVPC) module 1007 may be included in RJ-45 transmitter/receiver 1006 in accordance with an embodiment of the present disclosure. FIG. 10 shows IED 200/500 coupled to current sensor 310/610/810. To couple IED 200/500 to current sensor 310/610/810, current sensor 310/610/810 is coupled to transmitter/receiver 1006; RJ-45 transmitter/receiver 1006 is coupled to RJ-45 transmitter/receiver 1002 via fiber-optic cable 1004; and finally, RJ-45 transmitter/receiver 1002 is coupled to RJ-45 receptacle 220/520 on IED 200/500 and light signal module 1005 via fiber optic cable 1008.

RJ-45 transmitter/receiver 1006 includes LVC circuitry 1011 and VLC circuitry 1013 to convert light signals to electrical signals and vice versa. To power LVC circuitry 1011 and VLC circuitry 1013, LVPC module 1007 is also included in RJ-45 transmitter/receiver 1006. LVPC module 1007 contains a photovoltaic cell (not shown in FIG. 10) to convert light energy into electrical energy. Photovoltaic cells contain semi-conducting material such as, but not limited to, gallium arsenide, indium phosphide, or indium gallium arsenide. It is to be appreciated that LVPC module may be made of one of these materials, or any other material suitable for use with a photovoltaic cell. When light is directed at the chosen material in the photovoltaic cell, the photons in the light excite the electrons in the semi-conducting material into a higher state of energy, resulting in a flow of electrons (i.e., a current) across the material. The current generated in the semi-conducting material in LVPC module 1007 can then be supplied to LVC circuitry 1011 and VLC circuitry 1010 in RJ-45 transmitter/receiver 1006.

Returning to FIG. 10, although only RJ-45 transmitter/receiver 1002 and 1006 are used to couple IED 200/500 to current sensor 310/610/810, it is to be appreciated that multiple RJ-45 transmitters/receivers may couple RJ-45 transmitter/receiver 1006 to RJ-45 transmitter/receiver 1002. Furthermore, RJ-45 transmitter/receiver 1002 and RJ-45 transmitter 1006 (and every RJ-45 transmitter/receiver that couples current sensor 310/610/810 to IED 200/500) will contain both LVC circuitry and VLC circuitry, so that light/electricity flowing to/from IED 200/500 and current sensor 310/610/810 can be converted in both directions (from current sensor 310/610/810 to IED 200/500 and to current sensor 310/610/810 from IED 200/500). In this way, if desired, IED 200/500 and current sensor 310/610/810 can communicate bi-directionally (i.e., IED 200/500 and current sensor 310/610/810 can both receive and send communication to each other). This bidirectional communication ability may be used in one embodiment for IED 200/500 to send a request (e.g., generated by CPU 50) to a processor disposed in current sensor 310/610/810 and receive a reply to the request from current sensor 310/610/810. Alternatively, the bidirectional communication may be used for current sensor 310/610/810 to send a request to IED 200/500 and receive a reply to the request from IED 200/500.

It is to be appreciated that the light signal produced by VLC circuitry 1003 is may not be sufficiently powerful to effectively power LVC circuitry 1011 and VLC circuitry 1013 after the light energy has been converted to electrical energy in LVPC module 1007 in RJ-45 transmitter/receiver 1006. Therefore, instead of using VLC circuitry 1003 in RJ-45 transmitter/receiver 1002 to power LVC circuitry 1011 and VLC circuitry 1013 in RJ-45 transmitter/receiver 1006, in one embodiment, light signal module 1005 will be used. Light signal module 1005 includes laser diode circuitry capable of outputting a power light signal, for example, in one embodiment, light signal module can output up to about 5-8 Watts of optical power (780 to 1500 nm wavelength). Furthermore, conversion efficiency can be up to 40-50%. However, it is to be appreciated that optical power requirements and conversion efficiency will vary according to the distance between the optical power source and the photovoltaic cell; longer distances require larger amounts of optical power and vice versa.

Turning again to FIG. 10, light signal module 1005 is shown outside of RJ-45 transmitter/receiver 1002. However, it is to be appreciated that light signal module 1005 may be included in RJ-45 transmitter/receiver 1002, or, alternatively, light signal module 1005 may be included in IED 200/500, or, alternatively, light signal module 1005 may be coupled to IED 200/500 and RJ-45 transmitter/receiver 1002 (as is shown in FIG. 10) via a fiber-optic cable 1008. Furthermore, it is to be appreciated that RJ-45 transmitter/receiver 1002 can be powered by power supply 16 in IED 200/500 or by an independent power supply.

It is to be appreciated that, although only two RJ-45 transmitter/receivers are shown in FIG. 10, it is contemplated that teaching of the present disclosure may be used with multiple RJ-45 transmitters/receivers coupled to multiple current sensors on multiple power distribution lines. Furthermore, it is to be appreciated that the system described below for supplying power to LVC and VLC circuitry inside RJ-45 transmitter/receiver 1006 from IED 200/500 in accordance with the present disclosure may be applied to all previous embodiments described above.

Turning to FIGS. 1 and 10, power supply 16 in IED 200/500 will supply electrical power to RJ-45 receptacle 220/520 in IED 200/500. The electrical power will then be transmitted from RJ-45 receptacle 220/520 to RJ-45 transmitter/receiver 1002, where, in one embodiment, the electrical power supplied by power supply 16 will be transmitted to light signal module 1005 via at least one conductive wire 1009 coupling RJ-45 transmitter/receiver 1002 to light signal module 1005. Light signal module 1005 will then use this electrical energy to produce a light beam that will propagate along fiber-optic cable 1008 and fiber-optic cable 1004 until the light beam reaches LVPC module 1007 in RJ-45 transmitter/receiver 1006. It is to be appreciated that if there are other modules or components in between the IED 200/500 and RJ-45 transmitter/receiver 1006, the light beam will be retransmitted along fiber-optic cables as necessary until it reaches LVPC module 1007 in RJ-45 transmitter/receiver 1006. Then, LVPC module 1007 in RJ-45 transmitter/receiver 1006 will convert the light received into electrical power. The electrical power that has been converted will then be supplied to LVC circuitry 1011 and VLC circuitry 1013. It is to be appreciated that light signal module 1005 may be disposed in transmitter/receiver 1002, disposed external to transmitter/receiver 1002 or in IED 200/500, where light generated is passed through receptacle 220/520 to transmitter/receiver 1002.

As described in the embodiments above, current sensors placed on transmission lines A, B, and/or C may provide power to the LVC circuitry and/or VLC circuitry by the voltage induced on a coil within a given current sensor when current passes through lines A, B, and/or C. Additionally, power may be provided to the LVC circuitry and/or VLC circuitry by the main voltage connection of the power distribution lines. However, it is to be appreciated that in an alternative embodiment, the LVC circuitry and/or VLC circuitry in the above-described embodiments may be powered by an alternative power source. For example, in FIGS. 11-13 current sensors are shown in accordance with the present disclosure that include a photovoltaic cell coupled to the current sensors. The photovoltaic cell is positioned such that when light is received on the photovoltaic cell, the light is converted to electrical power. The converted electrical power may then be used to power LVC circuitry and/or VLC circuitry. Below various possible embodiments of current sensors that include photovoltaic cells are described in accordance with the present disclosure.

Turning to FIG. 11, current sensor 1110 is shown in accordance with an embodiment of the present disclosure. Current sensor 1110 includes photovoltaic cell 1190 and RJ-45 receptacle 1108 disposed on a surface 1109 of housing 1111 of current sensor 1110. When current sensor 1110 is placed on transmission line A, B, or C, any light received by photovoltaic cell 1190 is converted to electrical power. The converted electrical power is then provided to receptacle 1108 which subsequently provides power to a modular plug or connector received in the receptacle 1108.

Although FIG. 11 shows current sensor 1110 as including photovoltaic cell 1190 disposed on a surface 1109 of housing 1111 of the current sensor 1110, it is to be appreciated that, in alternative embodiments, photovoltaic cell 1190 may instead be disposed outside current sensor 1110 so that photovoltaic cell 1190 may be placed at a more desirable location. It may be advantageous to place photovoltaic sensor 1190 at a location that receives more light than the location where current sensor 1110 is disposed. Turning to FIG. 12, a current sensor coupled to a movable photovoltaic cell is shown in accordance with an embodiment of the present disclosure.

More specifically, FIG. 12 shows current sensor 1210. Current sensor 1210 includes RJ-45 receptacle 1208. Additionally current sensor 1210 is coupled to photovoltaic cell 1290 via conductive wires 1235 and 1237. Conductive wire 1235 is coupled to a voltage channel in receptacle 1208 (not shown) and conductive wire 1237 is coupled to a ground channel in receptacle 1208 (not shown). Similar to current sensor 1110, when photovoltaic cell 1290 receives light, photovoltaic cell 1290 will convert the light into electrical power. The converted electrical power will then be provided to the receptacle 1208 via conductive wires 1235, 1237.

Turning to FIG. 13, a schematic view of current sensor 1110 is shown in accordance with the present disclosure. In FIG. 13, RJ-45 receptacle 1108 is shown as including voltage source channel 1334, ground channel 1336, and data channel 1338. Similar to conductive wires 1235 and 1237 in FIG. 12, conductive wires 1335 and 1337 couple photovoltaic cell 1190 to RJ-45 receptacle 1108. More specifically, conductive wire 1335 couples photovoltaic cell 1190 to voltage source channel 1334 and conductive wire 1337 couples photovoltaic cell 1190 to ground channel 1336. Conductive wire 1335 is used to provide electrical power to RJ-45 receptacle 1108, while wire 1337 is used to provide a return path between RJ-45 receptacle 1108 and photovoltaic cell 1190. It is to be appreciated that current sensor 1210 is configured and wired in a similar manner.

In yet another embodiment, an RJ-45 receiver may be configured to provide light directly to current sensors 1110 and 1210. This may be advantageous because the positioning of the photovoltaic cell would not affect the amount of light being received by the photovoltaic cell.

Figure 14A:
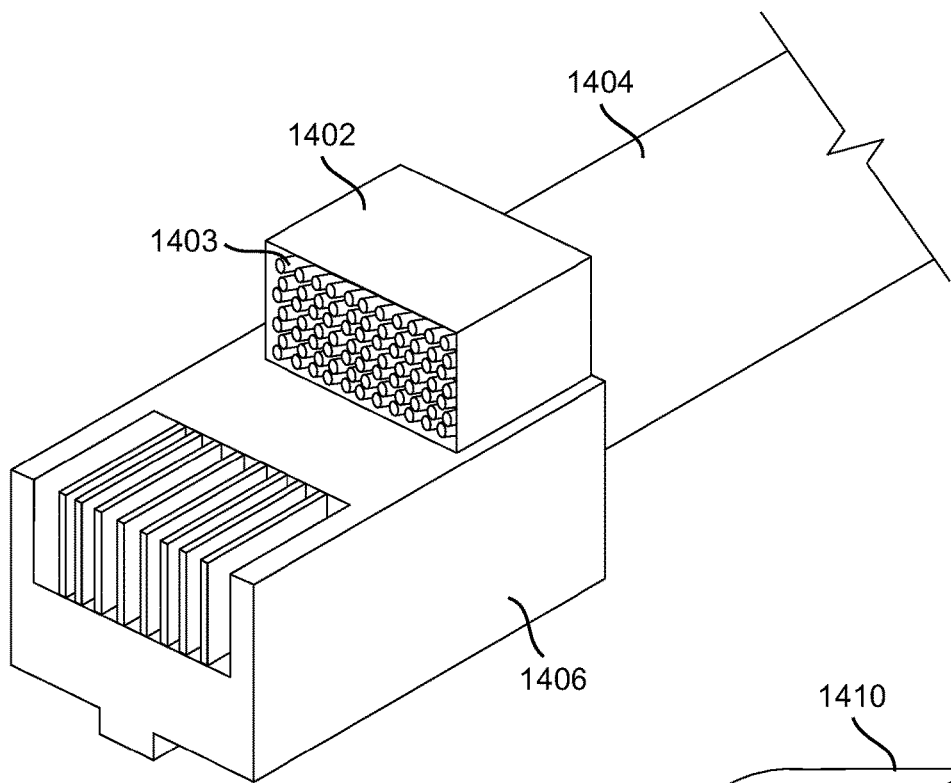
FIG. 14A is a perspective view of an RJ-45 receiver coupled to a fiber-optic cable in accordance with an embodiment of the present disclosure.
Figure 14B:
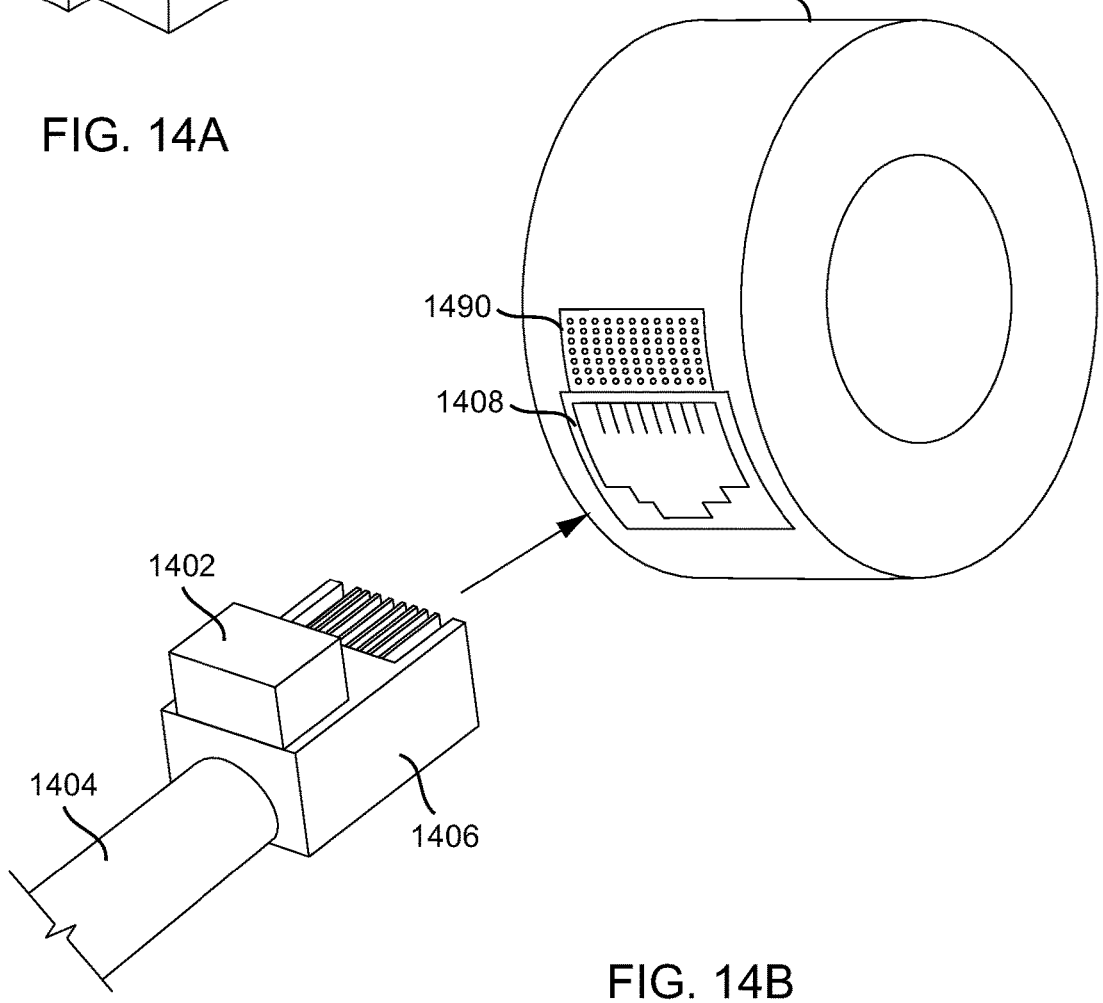
FIG. 14B is a perspective view of the RJ-45 receiver of FIG. 14A and a current sensor in accordance with an embodiment of the present disclosure.

Turning to FIGS. 14A and 14B, an RJ-45 receiver configured to provide light to a current sensor is shown in accordance with an embodiment of the present disclosure. FIG. 14A includes RJ-45 receiver 1406 coupled to fiber-optic cable 1404. RJ-45 receiver 1406 includes light source module (LSM) 1402. RJ-45 receiver 1406 is configured such that a predetermined amount or portion of fibers 1403 from fiber-optic cable 1404 are provided to LSM 1402. It is to be appreciated that although LSM 1402 is shown in FIG. 14A as including many fibers, LSM 1402 may be configured to include only one fiber of the fibers in fiber-optic cable 1404 if desired, and, alternatively, LSM 1402 may be configured to include many more fibers of the fibers in fiber-optic cable 1404 than shown in FIG. 14A if desired. Furthermore, it is to be appreciated that although LSM 1402 is shown in FIG. 14A as being included in RJ-45 receiver 1406, in other embodiments LSM 1402 may be separate from RJ-45 receiver 1406 and LSM 1402 may be provided independently to photovoltaic cell 1490 on current sensor 1410. Also, it is to be appreciated that RJ-45 receiver 1406 also includes LVC and/or VLC circuitry for use with all other embodiments described above in the present disclosure.

Turning to FIG. 14B, RJ-45 receiver 1406 is shown again coupled to fiber-optic cable 1404. Also shown in FIG. 14B, is current sensor 1410. Similar to current sensor 1110, current sensor 1410 includes photovoltaic cell 1490 and RJ-45 receptacle 1408. RJ-45 receiver 1406 and current sensor 1410 are configured such that when RJ-45 receiver 1406 is inserted into RJ-45 receptacle 1408, fibers 1403 in LSM 1402 are positioned to provide light to photovoltaic cell 1490. The light provided to photovoltaic cell 1490 will be converted by photovoltaic cell 1490 to electrical power, which may then be used to power any LVC and/or VLC circuitry in RJ-45 receiver 1406.

It is to be appreciated that the light provided to photovoltaic cell 1490 via fibers 1403 may come from light signal module 1005 described above and illustrated in FIG. 10. For example, the light signal module 1005 may be located at the opposite end of cable 1404 in or at the IED 200/500. The light signal module 1005 generates light and transmits the light into at least one fiber 1403, which is then propagates along the at least one fiber 1403 and is emitted from the LSM 1402 onto the photovoltaic cell 1490.

It is to be appreciated that current sensors 1110 and 1210, and the combination of current sensor 1410 and RJ-45 receiver 1406 may be used with any of the embodiments described above. Furthermore, it is to be appreciated that although current sensors 1110, 1210, and 1410 may include photovoltaic cells 1190, 1290, and 1490, respectively, in other embodiments, current sensors 1110, 1210, 1410 may concurrently generate power by any induced voltage on the coils in current sensors 1110 and 1210 and the converted electrical power provided by photovoltaic cells 1190 and 1290.

It is to be appreciated that the usage of RJ-45 transmitters/receivers and fiber optic cables as described in the embodiments of the present disclosure, provide several advantages over currently used methods. For example, the embodiments described above provide for a more versatile connection between IEDs, e.g., a meter, and sensors than currently used methods because the embodiments described above are compatible with RJ-45 terminated, 8 twisted pair wiring systems. Alternatively, fiber optic lines can be used for connecting a plurality of meters and sensors. Through fiber optic connections, high-level voltage isolation is facilitated between sensors and meters. Therefore, it is possible to attach the sensors on high voltage transmission lines. Furthermore, the above described embodiments allow for high speed communication between the sensor and the meter, therefore high frequency analog to digital sampling rate is achievable on all measured channels. Also, long distances can be bridged with the fiber optic lines. Another advantage of the above described embodiments is that the utilization of multichannel fiber optic cable is made possible to further improve frequency of communication and bandwidth. Additionally, for short distance, low bandwidth applications, the above described embodiments allow for cost effective plastic optical fiber to be used.

It is to be appreciated that in all the above described embodiments of the present disclosure, although fiber-optic cables are used to transmit light, it is contemplated the present disclosure can also be used with any now known, or later to be discovered, cables, wires, or connections that are capable of transmitting light. Also, it is to be appreciated that although the system described in the present disclosure involves using an RJ-45 modular connectors to couple the IED to a current sensor, it is contemplated all embodiments in the present disclosure can also be used with many other types of pin and contact modular connectors such as, but not limited to, 4P4C, 6P6C, 10P10C and any other combination of pin and contact (for instance 6P4C, and all others).

It is to be appreciated that although in previous embodiments fiber-optic cables are used to communicate signals between an IED and one or more current sensors coupled to one or more transmission lines, many different types of signal-carrying cables or media may be used with the embodiments described above. In one embodiment, a cable including one or more conductive wires may be used to carry the signal between the IED and the current sensor(s).

Figure 15:
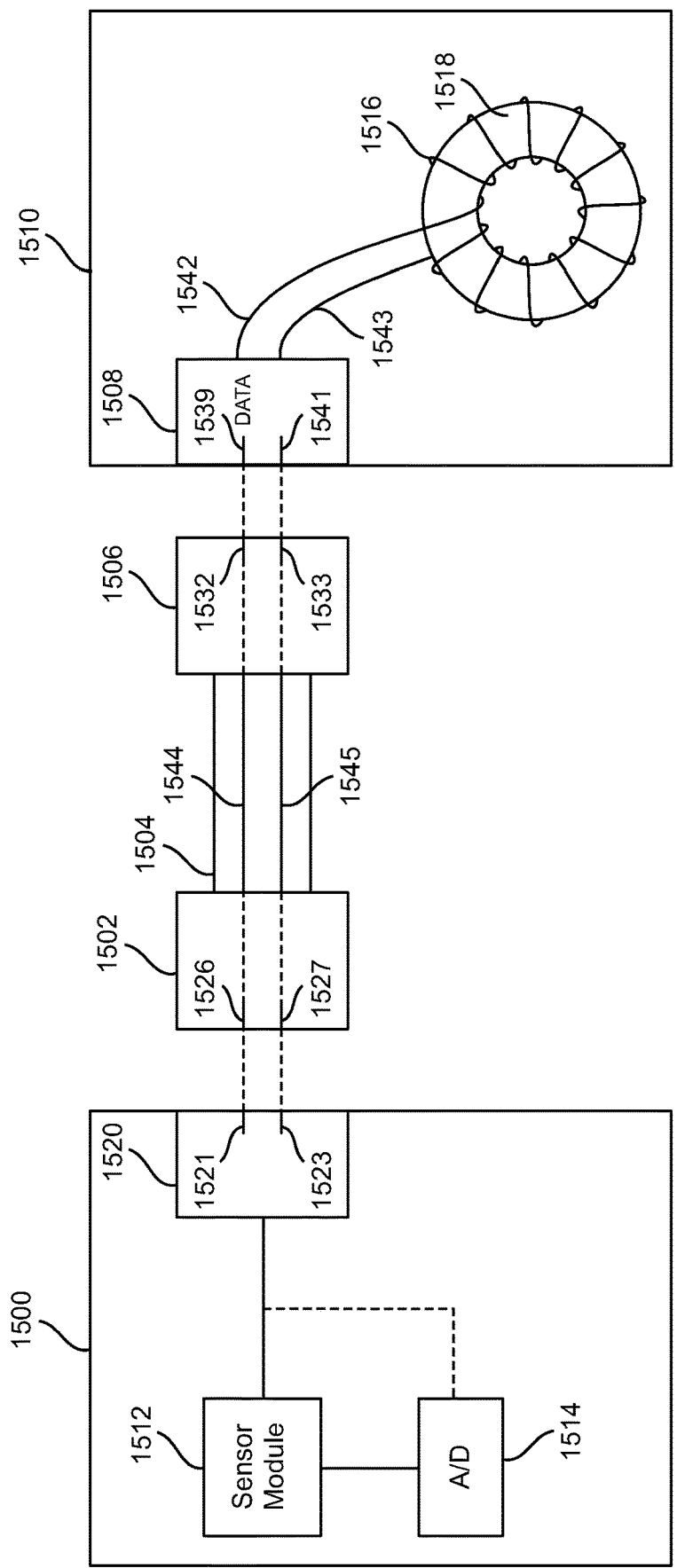
FIG. 15 is an illustration of an IED coupled with at least one current sensor on a power distribution system using at least one cable in accordance with an embodiment of the present disclosure.

For example, referring to FIG. 15, an IED 1500 is shown coupled to a current sensor 1510 using a cable 1504 and one or more modular, e.g., RJ-45, connectors and receptacles in accordance with the present disclosure. As shown in FIG. 15, IED 1500 includes RJ-45 receptacle 1520 disposed on a housing of IED 1500. IED 1500 also includes sensor module 1512 and at least one analog to digital converter (A/D) 1514, where RJ-45 receptacle 1520 is coupled to sensor module 1512 and A/D converter 1514. Although not shown, IED 1500 includes similar components as included in IED 10, 200, e.g., FPGA 80, CPU 50, DSP1 60, DSP2 70, etc. .

RJ-45 receptacle 1520 of IED 1500 is configured to receive RJ-45 connector 1502. RJ-45 connector 1502 is coupled to cable 1504, where cable 1504 includes conductive wires 1544 and 1545. It is to be appreciated that, in one embodiment, conductive wires 1544 and 1545 are configured as a twisted pair. Cable 1504 is also coupled to RJ-45 connector 1506. Current sensor 1510 includes RJ-45 receptacle 1508 disposed on a housing of current sensor 1510. RJ-45 receptacle 1508 is configured to receive RJ-45 connector 1506. Current sensor 1510 also includes magnetic core 1518 and coil 1516, where coil 1516 is wrapped around magnetic core 1516 and ends 1542 and 1543 of coil 1516 are each coupled to RJ-45 receptacle 1508. In one embodiment, end 1542 of coil 1516 is coupled to data channel 1539 included in RJ-45 receptacle 1508 and end 1543 of coil 1516 is coupled to ground or reference channel 1541 of RJ-45 receptacle 1508.

RJ-45 connector 1506 includes data channel 1532 and ground channel 1533. Data channel 1532 is coupled to a conductive wire 1544 in cable 1504 and ground channel 1533 is coupled to a conductive wire 1545 in cable 1504. Conductive wire 1544 is also coupled to data channel 1526 in RJ-45 connector 1502 and conductive wire 1545 is also coupled to ground channel 1527 in RJ-45 connector 1502. When RJ-45 connector 1506 is coupled to RJ-45 receptacle 1508, data channel 1532 comes into contact with data channel 1539 and ground channel 1533 comes into contact with ground channel 1541. Similarly, when RJ-45 connector 1502 is coupled to RJ-45 receptacle 1520, data channel 1526 comes into contact with data channel 1521 and ground channel 1527 comes into contact with ground channel 1523.

As described in the embodiments above, current sensor 1510 is configured to be coupled to a transmission line, such that, when current passes through the transmission line, a voltage signal is induced on coil 1516. The voltage signal is provided to data channel 1539 and channel 1541 via ends 1542, 1543 of coil 1516, respectively. The induced voltage signal is then provided from data channel 1539 and channel 1541 to data channel 1532 and channel 1533 and from data channel 1532 and channel 1533 to data channel 1526 and channel 1527 via conductive wires 1544, 1545 in cable 1504. From data channel 1526 and channel 1527, the induced voltage signal is provided to data channel 1521 and channel 1523, where the voltage signal is provided to A/D converter 1514 to be converted from an analog signal to a digital signal. It is to be appreciated that, in one embodiment, the induced voltage signal may be provided to sensor module 1512 before being provide to A/D converter 1514. From A/D converter 1514, the digital signal may be provided to one or more processors in IED 1500 so that one or more calculations relating to the transmission line coupled to current sensor 1510 can be performed.

In the embodiment above described in relation to FIG. 15, it is to be appreciated that current sensor 1510 does not need to provide power to RJ-45 connector 1506 and IED 1510 does not need to provide power to RJ-45 connector 1502, since RJ-45 connectors 1502 and 1506 do not include any circuitry required to be powered.

Additionally, the teachings of the present disclosure may be applied to other transmission mediums in addition to light, such as low power radio signals, IrDA signals, wireless signals, etc. In one embodiment, instead of converting the sensed signal to light, the connector may include a wireless transceiver for wirelessly sending/receiving signals and/or data to a corresponding connector either at the meter, IED or sensor. It is to be appreciated that other conversions of signals, e.g., wired to wireless, in a modular connector are contemplated to be within the scope of the present disclosure.

For example, in another embodiment of the present disclosure, wireless communication may be used to transmit the induced voltage signal from a current sensor to an IED rather than using cable or other hard-wired media connections. For example, referring to FIGS. 16A and 16B, a current sensor 1610 coupled to a modular connector, such as an RJ-45 connector, including a wireless transceiver and wireless antenna is shown in accordance with the present disclosure.

Figure 16A:
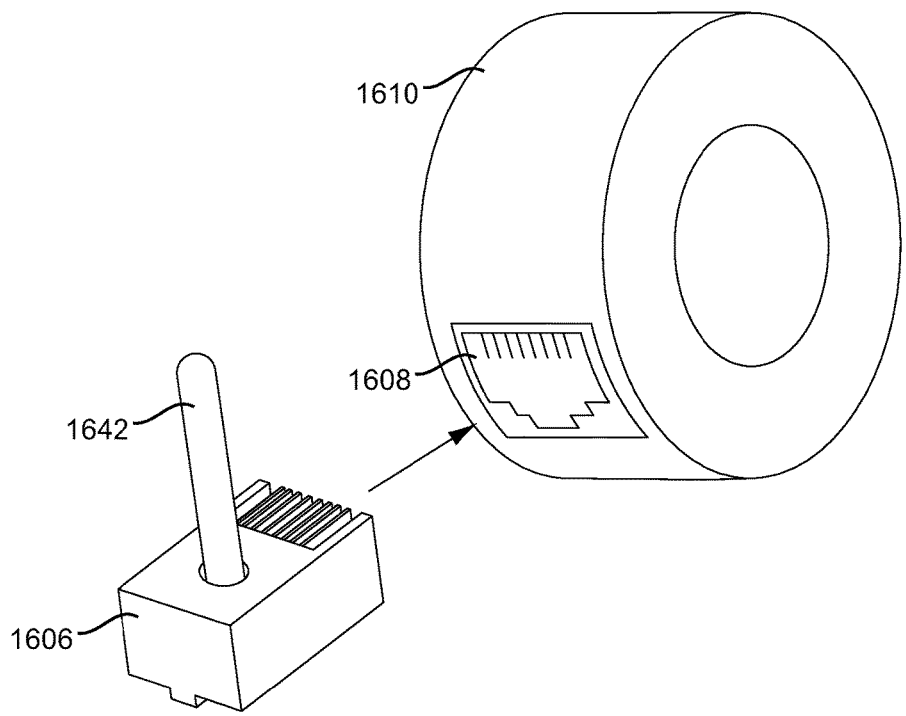
FIG. 16A is a perspective view of a current sensor and wireless connector in accordance with another embodiment of the present disclosure.
Figure 16B:
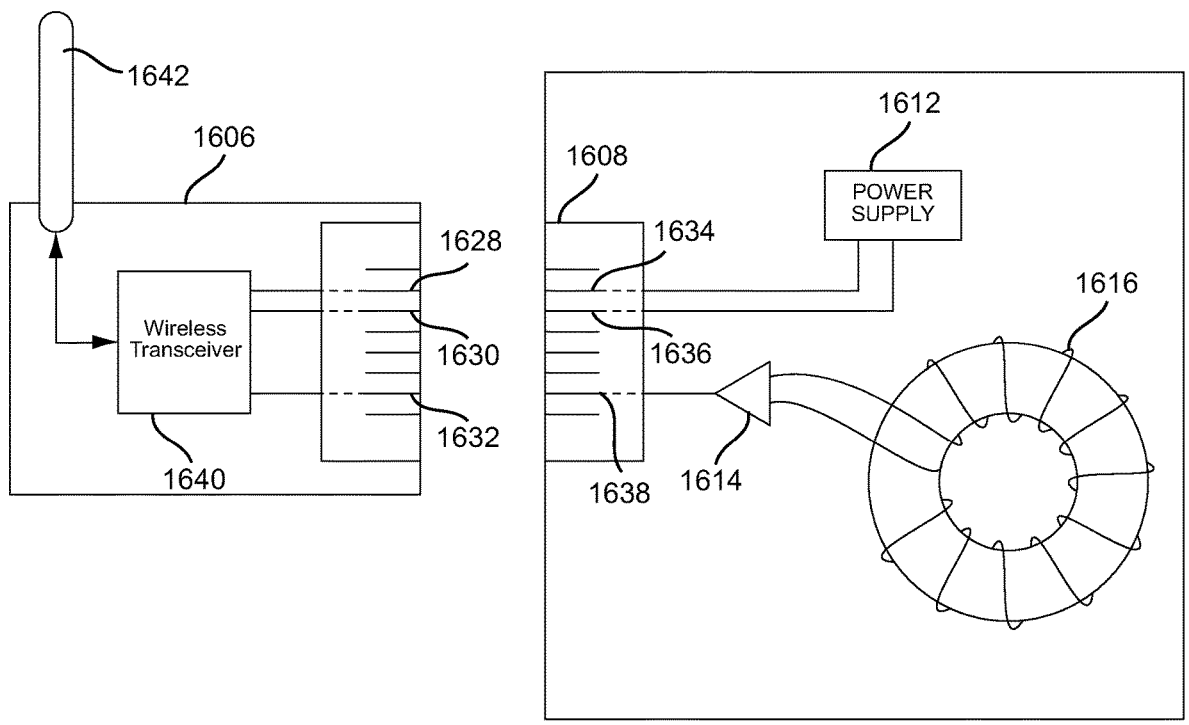
FIG. 16B is a more detailed illustration of the current sensor and wireless connector of FIG. 16A in accordance with an embodiment of the present disclosure.

FIGS. 16A and 16B include current sensor 1610. Current sensor 1610 includes a magnetic core 1618, a coil 1616, analog to digital (A/D) converter 1614, and RJ-45 receptacle 1608, where coil 1618 is wrapped around magnetic core 1618 and coupled to A/D converter 1614. A/D converter 1614 is coupled to a data channel 1638 included in RJ-45 receptacle 1608. Similar to the current sensors described in previous embodiments, current sensor 1610 is configured to be coupled to a transmission line, such that, when current passes through the transmission line at the location where current sensor 1610 is coupled to the transmission line, a voltage signal is induced on coil 1616. The voltage signal induced on coil 1616 is then transmitted to A/D converter 1614, where A/D converter 1614 converts the voltage signal from an analog signal to a digital signal. The converted digital signal is then transmitted to data channel 1638 of RJ-45 receptacle 1608. As described above, the receptacle 1608 may include a ground or reference channel as necessary to be employed with data channel 1638.

In one embodiment, current sensor 1610 may be coupled to an external power supply to supply power to A/D converter 1614 and RJ-45 receptacle 1608. In this embodiment, power supply 1612 is coupled to voltage source channel 1634 and ground channel 1636 included in RJ-45 receptacle 1608. In another embodiment, current sensor 1610 is not coupled to external power supply 1612, and instead a portion of the induced voltage signal is used to provide power to A/D converter 1614 and the RJ-45 receptacle 1608.

RJ-45 receptacle 1608 is configured to receive RJ-45 connector 1606. RJ-45 connector 1606 includes a voltage source 1628, ground channel 1630, and data channel 1638. When RJ-45 connector 1606 is coupled to RJ-45 receptacle 1608, voltage source channel 1628 comes into contact with voltage source channel 1634, ground channel 1636 comes into contact with ground channel 1630, and data channel 1632 comes into contact with data channel 1638. RJ-45 connector also includes a wireless transceiver 1640 and a wireless antenna 1642, where wireless transceiver 1640 is coupled to voltage source channel 1628, ground channel 1630, data channel 1632, and antenna 1642. In this way, power provided is provided from current sensor 1610 to wireless transceiver 1640 via voltage source channels 1628, 1634 and ground channels 1630, 1636 and the digital voltage signal is provided to wireless transceiver 1640 via A/D converter 1614 via data channels 1638 and 1632.

Wireless transceiver 1640 is configured to wirelessly transmit any digital signal received from data channel 1632 to an IED such as IED 200/500/800 via wireless antenna 1642. It is to be appreciated that in one embodiment, IED 200/500 is configured to receive the wireless signals transmitted via wireless transceiver 1640 and wireless antenna 1642 via built-in WiFi™ capabilities. For example, in one embodiment communications device 24 in IED 200 is configured to receive the wireless signal transmitted from RJ-45 connector 1606 and provide the wireless signals to CPU 50, DSP1 60, and/or DSP2 70, so that one or more calculations relating to the current passing through the transmission line current sensor 1610 is coupled to may be performed. In another embodiment, if IED 200/500 does not have built-in WiFi™ capabilities, another RJ-45 connector including a wireless transceiver and antenna, such as RJ-45 connector 1606 may be coupled to an RJ-45 receptacle to IED 200/500, such as RJ-45 receptacle 220/520. In this way, any signal transmitted from the RJ-45 connector 1606 connected to RJ-45 receptacle 1608 may be received by the RJ-45 connector 1606 connected to RJ-45 receptacle 220/520. The wireless signals received by RJ-45 receptacle 220/520 may them be sent to CPU 50, DSP1 60, and/or DSP2 70 as described above so that one or more calculation may be performed.

Furthermore, it is to be appreciated that although the present disclosure has provided implementing the modular connector technology described in the embodiments above with a panel meter, it is contemplated the present disclosure can also be used with other type of electric meters, for instance socket or S-base meters, switchboard/draw-out meters, A-base meters and many other types of electric meters or any type of intelligent electronic device (IED) as described above. Also, although the modular receptacles and/or connectors in the above described embodiments are disposed on the sides or back of the IED, it is contemplated that modular receptacles and/or connectors may be disposed on the front panel of the IED for use with permanently fixed electric meters.

The modular connector (including LVC and/or VLC circuitry) and fiber optic cable system of the present disclosure can be used to facilitate communications between devices in many types of systems and scenarios to save time, increase ease of usability, and decrease costs.

Figure 17A:
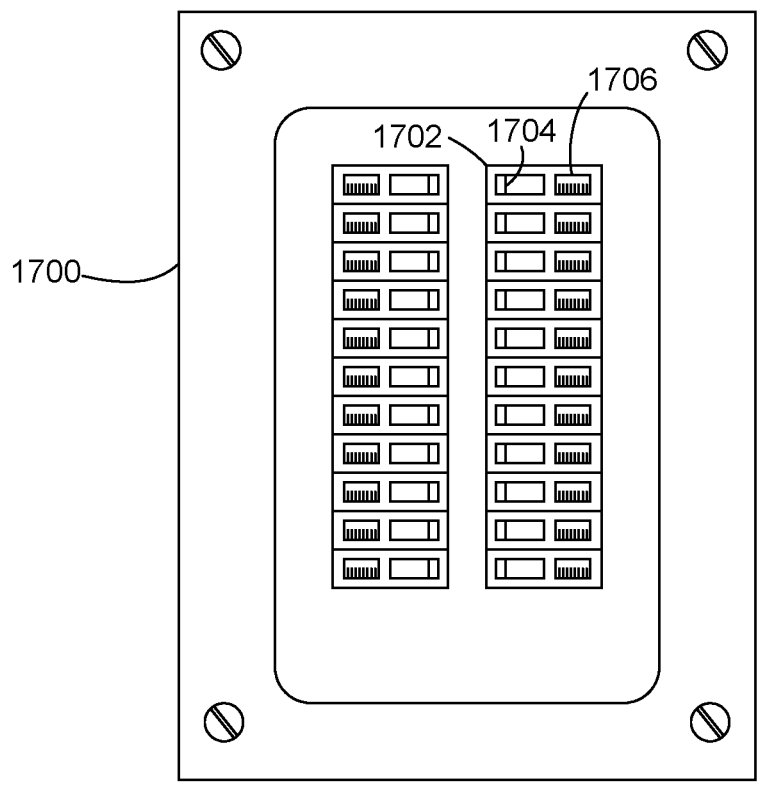
FIG. 17A illustrates a circuit breaker panel including a plurality of circuit breakers, each circuit breaker including a modular receptacle, in accordance with an embodiment of the present disclosure.
Figure 17B:
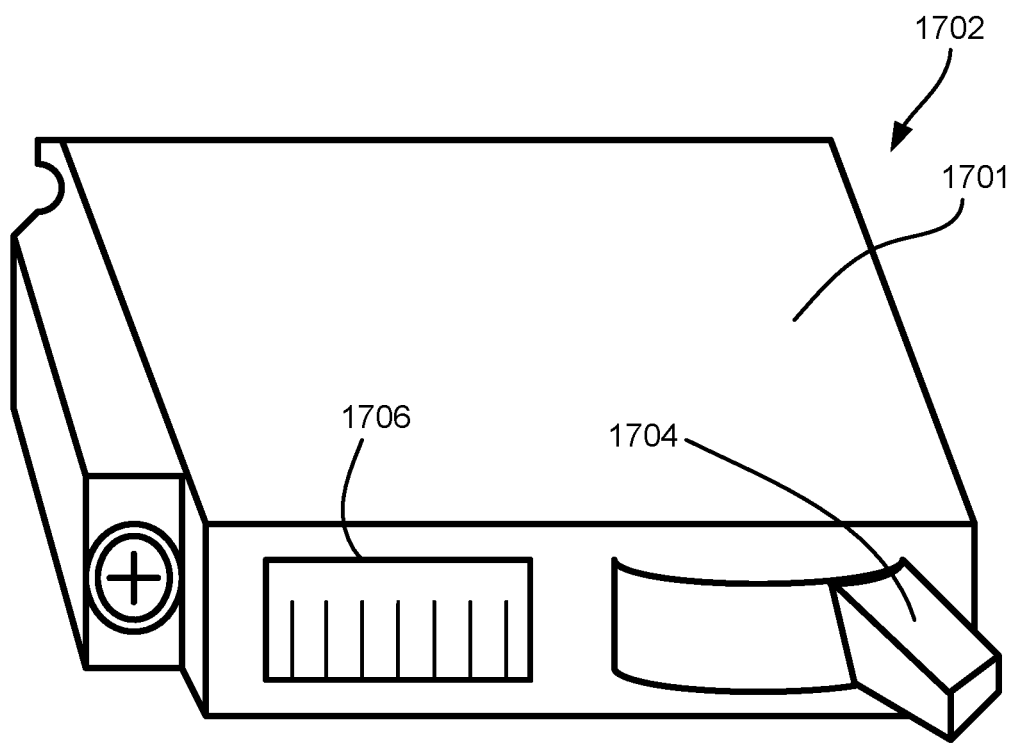
FIG. 17B illustrates a circuit breaker including a modular receptacle in accordance with an embodiment of the present disclosure.

For example, referring to FIG. 17A, a circuit breaker panel or housing 1700 is shown in accordance with the present disclosure. The circuit breaker panel 1700 includes a plurality of circuit breakers or overcurrent protection devices (OCPDs) 1702. Referring to FIG. 17B, a perspective view of circuit breaker 1702 removed from housing 1700 is shown in accordance with the present disclosure. Each circuit breaker 1702 includes a housing 1701, a switch or actuation means 1704, and a modular receptacle 1706 disposed on a surface of the housing 1701. As is known in the art, circuit breakers are configured to protect an electrical circuit (e.g., between a power distribution system and a load) from damage caused by a fault condition, such as, excessive current passing through the electrical circuit. When a fault condition is detected, the circuit breaker is configured to break the electrical circuit to stop the flow of current from the power source to the load the circuit breaker is coupled to. As will be described in greater detail below, in the present embodiment, in addition to detecting fault conditions and breaking the flow of current to a load, each circuit breaker 1702 includes circuitry for determining one or more electrical parameters associated with the current provided to the load by the power source. The modular receptacle 1706 included in each circuit breaker 1702 is configured to receive any of the modular connectors described above. In this way, the one or more electrical parameters detected by the circuitry in each circuit breaker 1702, may be provided via a fiber optic cable to an IED, such as IEDs 200/500 described above.

Figure 17C:
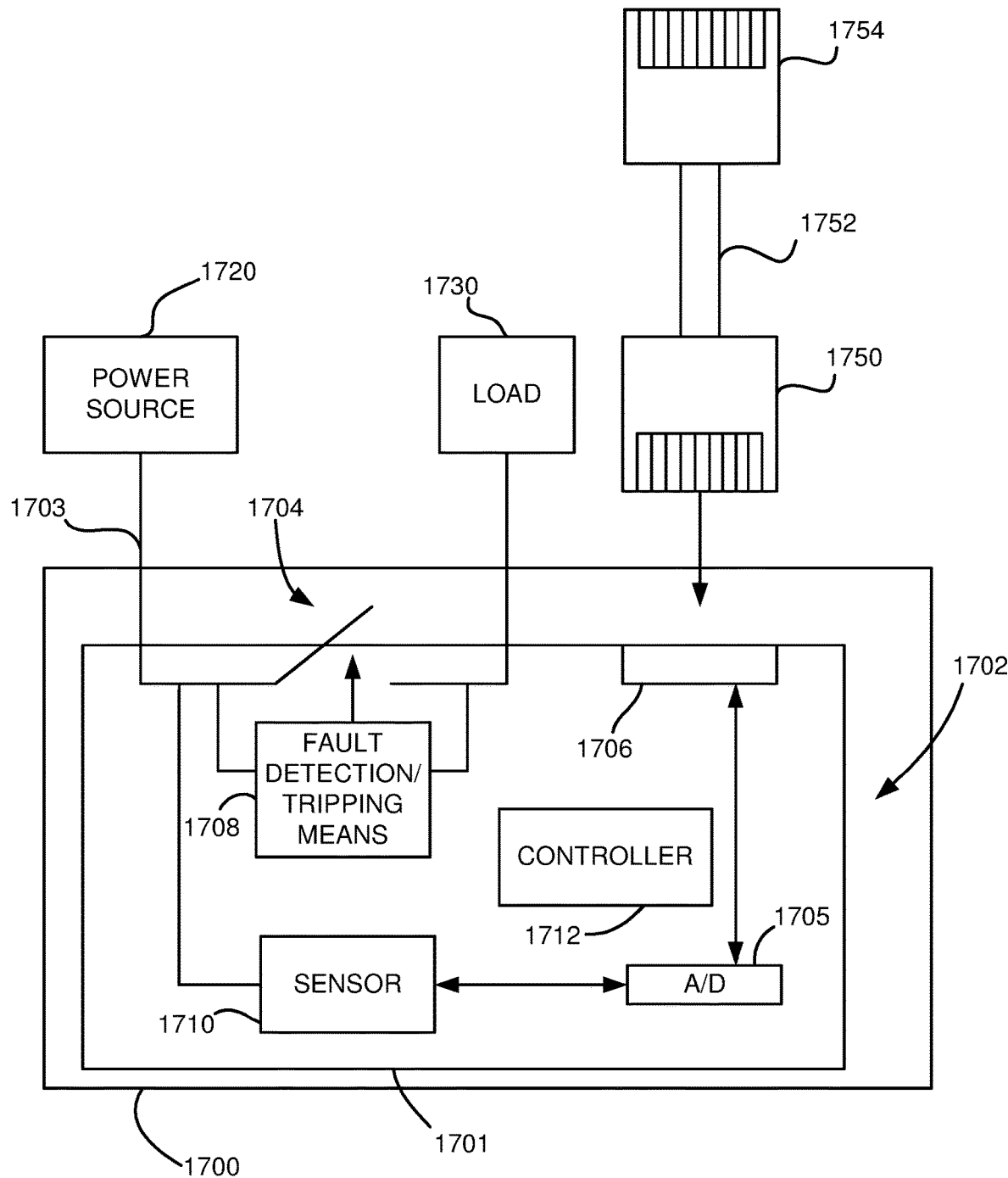
FIG. 17C is a block diagram of the circuit breaker of FIG. 17B in accordance with an embodiment of the present disclosure.

Referring to FIG. 17C, a block diagram of one of the circuit breakers 1702 included in panel 1700 is shown in accordance with the present disclosure. As shown in FIG. 17B, circuit breaker 1702 is coupled to a power source 1720 (e.g., a power distribution system) and to a load 1730 via line(s) 1703, such that, a circuit is formed between the power source 1720 and the load 1730. In addition to switch 1704 and receptacle 1706, the circuit breaker 1702 includes a fault detection/tripping means 1708, a sensor 1710, and an A/D converter 1714. In some embodiments, circuit breaker 1702 may include at least one controller or processor 1712 for controlling the various components of circuit breaker 1702 and performing one or more functions (e.g., processing, calculation, communication, etc.). Although not shown, controller or processor 1712 may be coupled to the fault detection/tripping means 1708, the sensor 1710, and/or A/D converter 1714.

The fault detection/tripping means 1706 is configured to detect a fault on the line 1703, such as excessive current flowing from power source 1720 to load 1730. If a fault condition is detected, fault detection/tripping means 1706, is configured to open switch 1704 to break the connection between power source 1720 and load 1730. It is to be appreciated that fault detection/tripping means may include any now known, or later developed means for fault detection and circuit breaking/overcurrent protection without deviating from the scope of the present disclosure. For example, means 1708 may include a bi-metal configured to open or throw switch 1704 when the temperature on the line 1703 is above a predetermined threshold, an electromagnet configured to open or throw switch 1704 when the current on line 1703 is above a predetermined threshold, and/or one or more semi-conductor components configured to open or throw switch 1704 when the current on the line 1703 is above a predetermined threshold.

Sensor 1710 is coupled to line 1703 and includes circuitry for measuring one or more electrical parameters on line 1703. It is to be appreciated that, although only a single sensor 1710 is shown, sensor 1710 may represent a plurality of sensors for measuring a plurality of electrical parameters on line 1703. The electrical parameters may include, but are not limited to, current, voltage, energy, power, temperature, etc. Sensor 1710 is configured to sample line 1703 and output at least one analog signal proportional to or indicative of the at least one electrical parameter. The output is provided to A/D converter 1705 to be converted to a digital signal. The digital signal is provided to a data channel (e.g., a pin) of receptacle 1706. In some embodiments, the digital signal is provided to controller 1712 or a discrete communication module and then controller 1712 or the discrete communication module provides the digital signal to the data channel of receptacle 1706. It is to be appreciated that at least one additional sensor may be provided in housing 1701 to sense other parameters, e.g. the temperature in the housing 1701.

Receptacle 1706 is configured to receive a modular connector 1750, where modular connector 1750 may be any one of the modular connectors described above. Modular connector 1750 includes VLC circuitry for converting electrical signals to light signals. When modular connector 1750 is coupled to receptacle 1706, the digital signal outputted by A/C converter 1705 is provided to the VLC circuitry in modular connector 1750 and converted to one or more light signals. The one or more light signals are provided via fiber-optic cable 1752 to a second modular connector 1754 including LVC circuitry for converting light signals to electrical signals. The second modular connector 1754 is connected to an IED including a modular receptacle, such as IEDs 200 and 500 described above. In this way, when the second modular connector 1754 receives the one or more light signals from modular connector 1750, the LVC circuitry converts the one or more light signals to digital signals, which are more provided to the IED 200/500.

In one embodiment, fiber optic cable 1752 includes a single fiber for carrying light signals outputted from connector 1750 to the IED 200/500. In this embodiment, information or data sensed by sensor 1710 (e.g., voltage, current, etc.) and outputted by A/D converter 1705 may be multiplexed by controller 1712 or a discrete communication module of circuit breaker 1702 and provided to one or more data channels or pins of receptacle 1706. The multiplexed signal is then converted by VLC circuitry in receptacle 1706 to one or more light signals to provide the information or data measured by sensor 1710 to modular connector 1754 via the single fiber in cable 1752. In one embodiment, the information is time division multiplexed. By multiplexing the information or data sensed by sensor 1710, the information or data can be carried by a single communication line (e.g., such as a single fiber in cable 1752 or a single wire).

In another embodiment, fiber optic cable 1752 includes multiple optical fibers, where each fiber may carry light signals associated with different information to an IED 200/500. For example, a first fiber may carry a first type of data (e.g., current) and a second fiber may carry a second type of data (e.g., voltage). In this embodiment, controller 1712 or a discrete communication module of circuit breaker 1702 is configured to receive digitized data from A/D converter 1705 and separate the digitized data into the first type of data and second type of data. The first type of data is provided by the controller 1712 or communication module to a first data channel or pin of receptacle 1706 and the second type of data is provided by the controller 1712 or communication module to a second data channel or pin of receptacle 1706. The modular connector 1750 may include a plurality of VLC circuit, each corresponding to a separate fiber of cable 1752 and a separate data channel of receptacle 1706. A first VLC circuit of modular connector 1750 is configured to convert signals received from the first data channel of receptacle 1706 to light signals and provide the light signals to connector 1754 via a first fiber of cable 1752. A second VLC circuit of modular connector 1750 is configured to convert signals received from the second data channel of receptacle 1706 to light signals and provide the light signals to connector 1754 via a second fiber of cable 1752. Connector 1754 may include a plurality LVC circuits, each corresponding to the separate fibers of cable 1752 and the separate data channels or pins of a receptacle of IED 200/500. It is to be appreciated that connectors 1750, 1754 may include any number of VLC and LVC circuits respectively to accommodate any number of fibers included in cable 1752.

In one embodiment, controller 1712 or a discrete communication module of circuit breaker 1702 is configured to serialize any information to be sent to the IED (e.g., current or voltage data sensed by sensor 1710 and digitized by A/D converter 1705). The serialized information is then outputted in a serial stream to receptacle 1706. The serial stream is then converted by VLC circuitry in connector 1750 to a serial stream of light signals and provided via the fiber(s) in cable 1752 to receptacle 1754, where the serial stream of light signals is converted by LVC circuitry in receptacle 1754 to electrical signals and provided to IED 200/500. In one embodiment, the serialized stream of light signals is provided via a single fiber (or other type of communication line) in cable 1752.

In some embodiments, calibration data associated with sensor 1710 is stored in at least one memory (e.g., of sensor 1710, controller 1712, or a discrete memory of circuit breaker 1702) and provided to the IED via cable 1752. In this way, when the IED receives data or measurements from sensor 1710, the IED can use the calibration information to calibrate and adjust the measurements as necessary to achieve more precision in any calculations performed by the IED.

In one embodiment, each of connectors 1750, 1754 may include both VLC and LVC circuitry, such that, bi-directional communication between circuit breaker 1702 and the IED 200/500 is possible. In this embodiment, controller 1712 (or a discrete communication module of circuit breaker 1702) is configured to process incoming and outgoing communication for circuit breaker 1702. In this way, controller 1712 may be configured to perform one or more actions or functions based on one or more communication signals received from IED 200/500. For example, in one embodiment, the communication signals may be used for handshaking between circuit breaker 1702 and IED 200/500. In another embodiment, the communication signals may be used by IED 200/500 to query controller 1712 to determine the circuit or breaker type of circuit breaker 1702, where controller 1712 is configured to respond to the communication signals with identifying information (e.g., model number, identification number, compatibility information, etc.) stored in at least one memory of the circuit breaker. In another embodiment, the input signals may be used by IED 200/500 to issue at least one command to the circuit breaker 1702, such as, but not limited to, shut off the circuit that the circuit breaker 1702 is connected to (e.g., by controlling fault detection/tripping means 1708 to throwing open switch 1704 and break the circuit between power source 120 and load 1730).

Figure 17D:
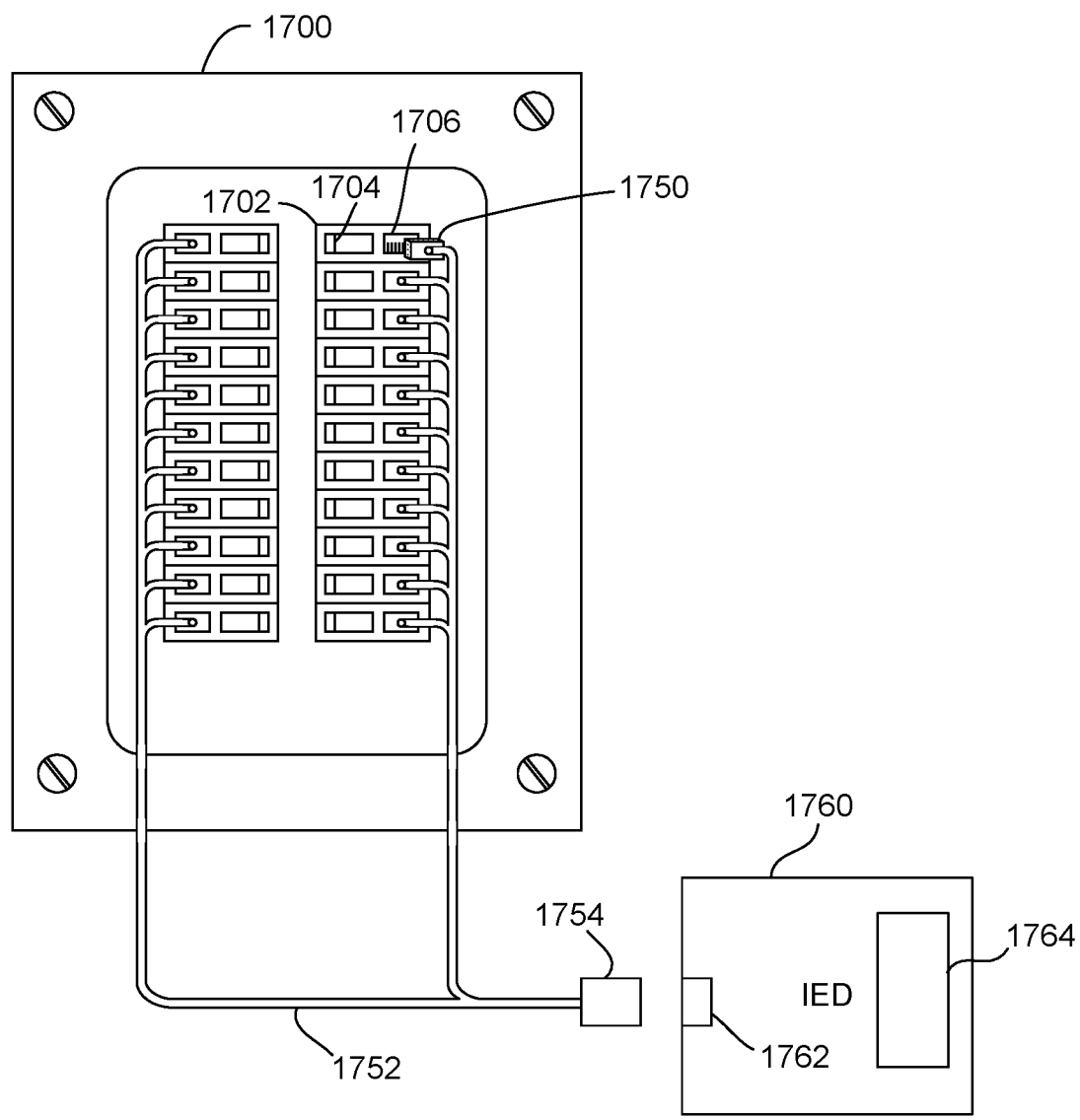
FIG. 17D illustrates the circuit breakers of the circuit breaker panel of FIG. 17B coupled to an IED in a first arrangement using a fiber optic cable and modular connectors in accordance with an embodiment of the present disclosure.

Referring to FIG. 17D, each of circuit breakers 1702 are shown coupled to an IED 1760 via a fiber-optic cable 1752 including multiple fibers and the modular connectors 1750, 1754. Cable 1752 includes a plurality of communication lines, each coupled to a separate modular connector 1750 and each including at least one fiber. Each receptacle 1706 is coupled to a separate modular connector 1750. The separate communication lines merge into a single communication line including all of the fiber, such that each modular connector 1750 is coupled to connector 1754 via cable 1752. Connector 1754 is coupled to receptacle 1762 of IED 1760. It is to be appreciated that IED 1760 may be configured with any features of the IEDs described above, such as IED 200/500. Connector 1754 includes at least one VLC and LVC circuit for bidirectional communication with each individual circuit breaker 1702 via the separate fibers in cable 1752. In one embodiment, connector 1752 may include a separate VLC and/or LVC circuit for each individual fiber in cable 1752 for sending/receiving light signals along each individual fiber.

IED 1760 is configured to receive communications from the sensor 1710 or controller 1712 in each of the circuit breakers 1702 in panel 1700 via cable 1752. The communications may include the electrical parameters measured by each sensor 1710, information identifying which circuit breaker 1702 the communication is received from, and/or any other information desired. A processor of IED 1760 is configured to collect all of the measurements obtained by sensors 1710 and any other communications received from circuit breakers 1702 in panel 1700. The collected measurements are used by a processor IED 1760 to perform one or more metering functions, such as, billing, power usage analysis, monitoring functions, etc.

In one embodiment, IED 1760 includes a billing module 1764 (e.g., stored in a memory of IED 1760 and executed/maintained by a processor of IED 1760). Billing module 1764 is configured to maintain records associated with the energy usage of each circuit breaker 1702 and automatically generate customized bills based on the energy usage by each load that each corresponding circuit breaker 1702 is coupled to. Billing module 1764 (via a communication module or processor of IED 1760) may be configured to transmit the customized bills along with any energy usage information associated with each circuit breaker 1702 directly to a customer's computing device periodically or upon request and/or post the customized bills and/or usage information to a website or server. Billing module 1764 may be configured via user input to IED 1760. The user input may be received directly by IED 1760 via a physical interface of IED 1760 (e.g., physical buttons and/or a touch interface) or alternatively the user input may be received as a communication signal by a communication module of IED 1760 (e.g., via a wireless or hardwired connection to a communication network).

As described above, each of connectors 1750, 1754 may include VLC and LVC circuitry, such that bi-directional communication between IED 1760 and circuit breakers 1702 is enabled. IED 1760 may be configured to send communication signals to the controller 1712 in each of the circuit breakers 1702 to query for additional data, change one or more settings in circuit breakers 1702, and/or controlling one or more circuit breakers 1702 (e.g., causing one or more circuit breakers to open switch 1704, stop/start measuring various parameters, etc.)

Figure 17E:
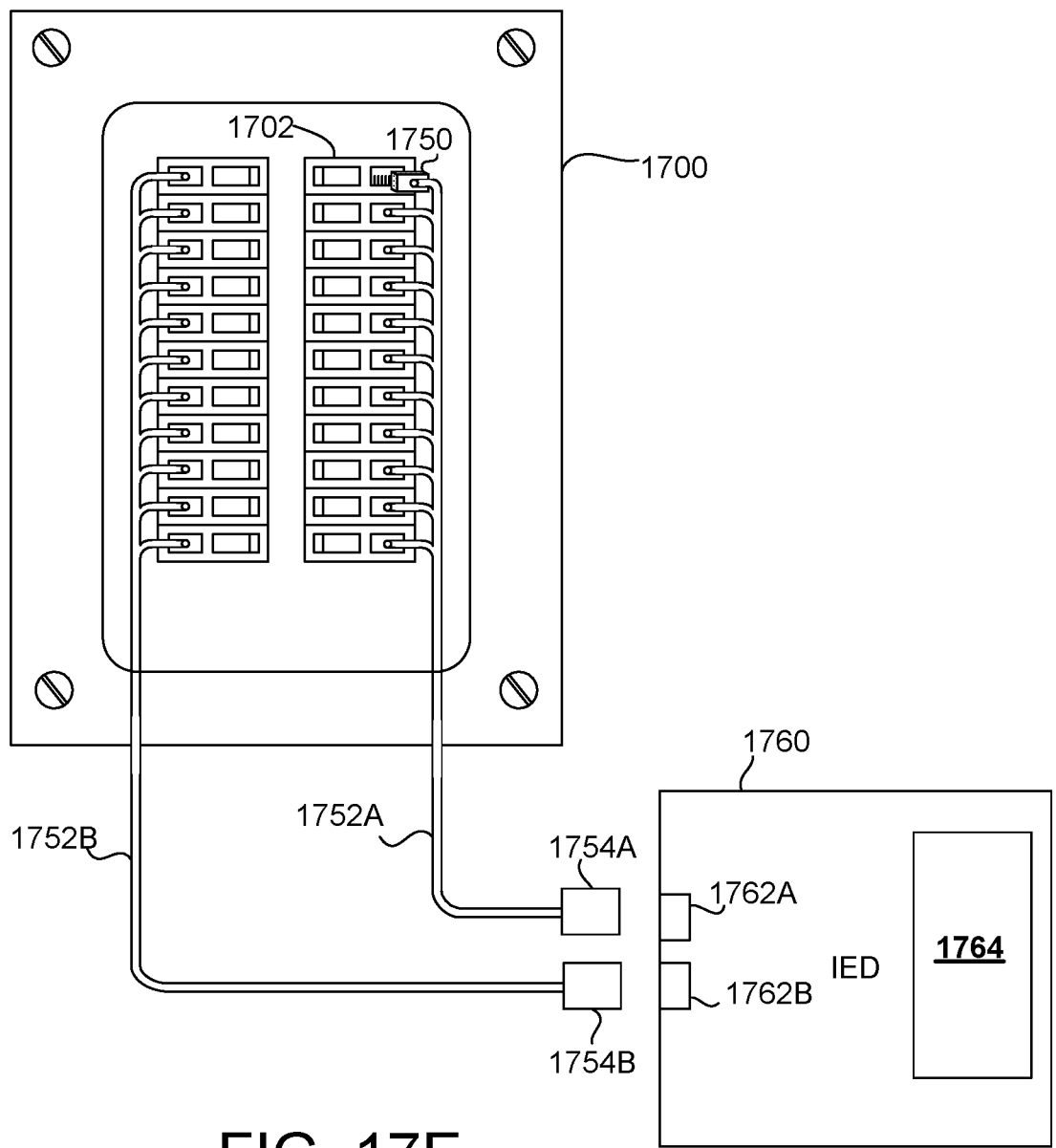
FIG. 17E illustrates the circuit breakers of the circuit breaker panel of FIG. 17B coupled to an IED in a second arrangement using fiber optic cables and modular connectors in accordance with an embodiment of the present disclosure.

It is to be appreciated that although in FIG. 17D, each of circuit breakers 1702 are coupled to a single receptacle 1762 of IED 1700, in other embodiments, IED 1706 may include multiple receptacles for receiving bulk communication from sub-groups of circuit breakers 1702 on separate receptacles. For example, referring to FIG. 17E, IED 1760 includes receptacle 1762A and receptacle 1762B. Each of receptacles 1762A and 1762B are configured to receive a separate modular connector, e.g., connectors 1754A and 1754B, respectively. Connector 1752A is coupled to a first fiber-optic cable 1752A, where cable 1752A is further coupled to a first sub-group of circuit breakers 1702 via a plurality of modular connectors. Connector 1752B is coupled to a second fiber-optic cable 1752B, where cable 1752B is further coupled to a second sub-group of circuit breakers 1702 via a plurality of modular connectors. In this way, IED 1760 may send/receive communication signals to/from the first group of circuit-breakers via receptacle 1762A and to/from the second group of circuit-breakers via receptacle 1762B.

Figure 17F:
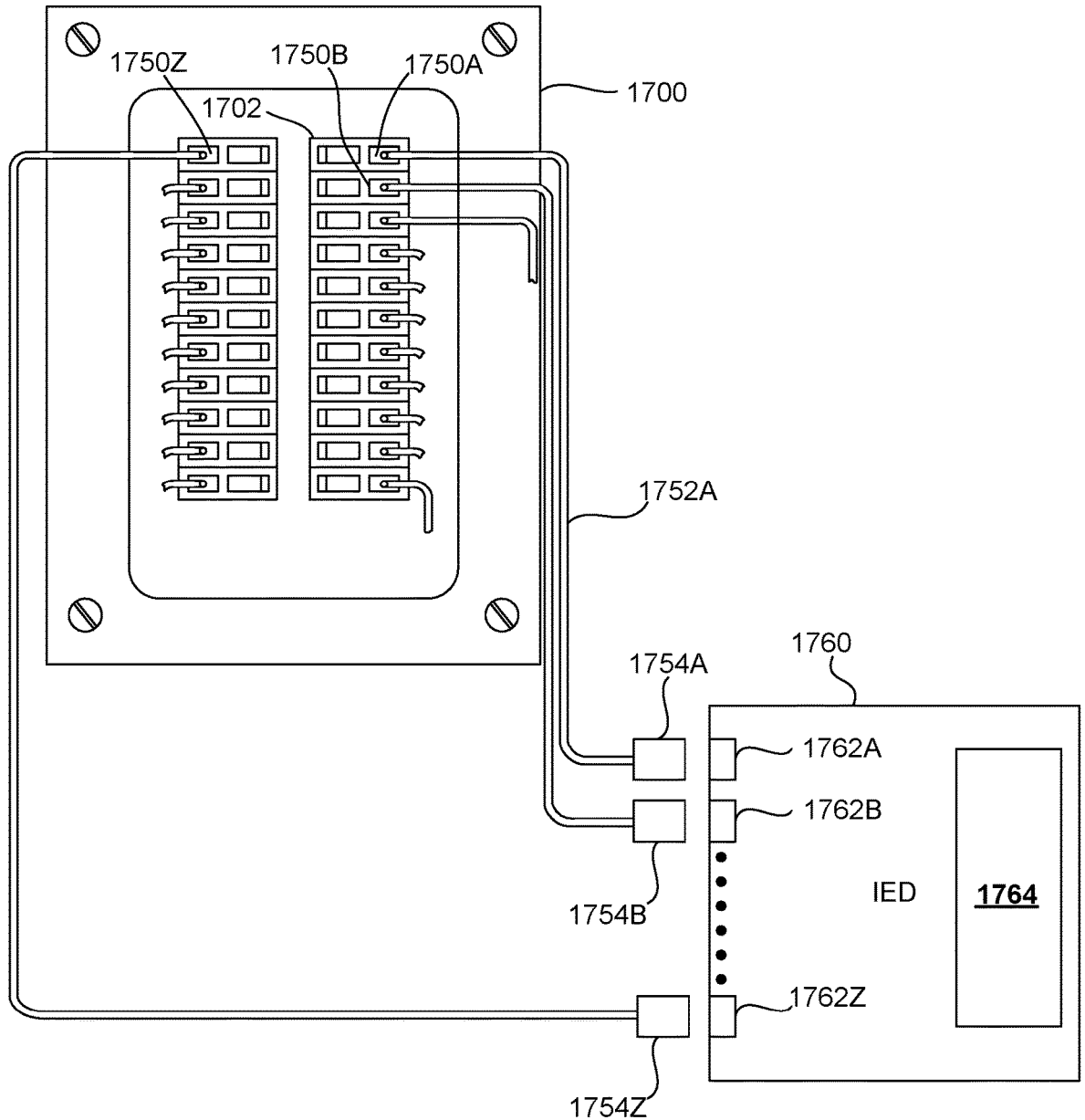
FIG. 17F illustrates the circuit breakers of the circuit breaker panel of FIG. 17B coupled to an IED in a third arrangement using fiber optic cables and modular connectors in accordance with an embodiment of the present disclosure.

In another embodiment of the preset disclosure, IED 1760 may include a separate receptacle for separately coupling to each circuit breaker 1702 in panel 1700. For example, referring to FIG. 17F, IED 1760 is shown in including a plurality of receptacles 1762. Each receptacle 1762 is coupled to a separate connector 1754, fiber-optic cable 1752, and connector 1750, where each connector 1750 is coupled to a separate receptacle 1706. Each connector 1750, 1754 includes VLC and/or LVC circuitry. In this way, IED 1760 is configured to communicate with each circuit breaker individually over separate cables 1752.

Figure 17G:
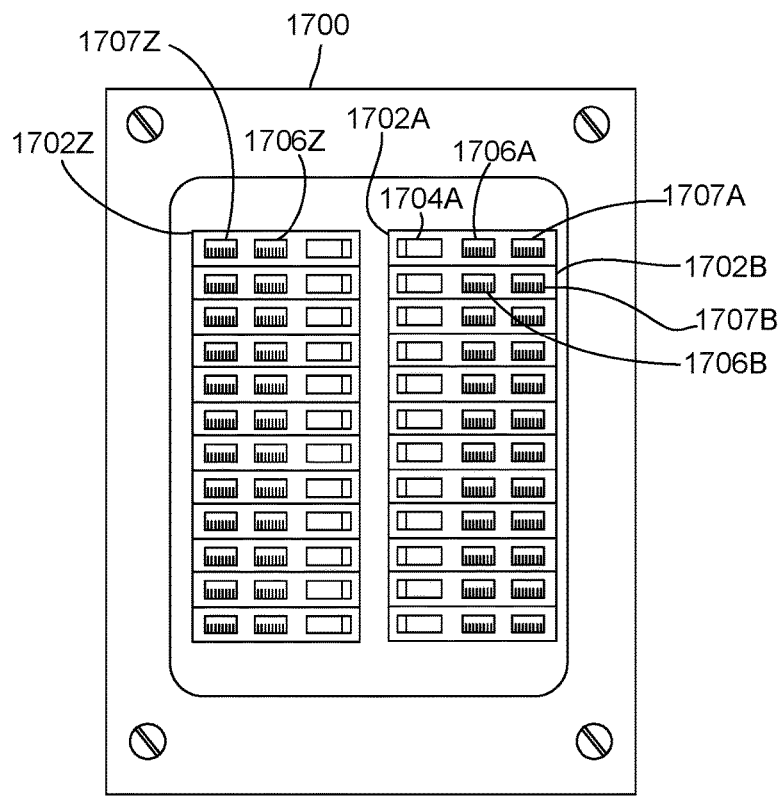
FIG. 17G illustrates the circuit breakers of FIG. 17B coupled to an IED in a daisy-chain arrangement using fiber optic cables and modular connectors in accordance with an embodiment of the present disclosure.
Figure 17G:
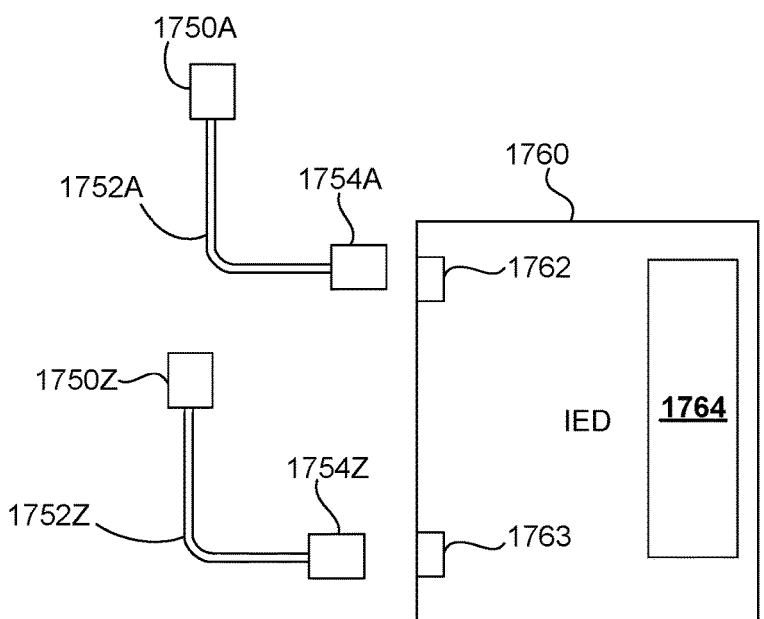

In another embodiment, of the present disclosure, circuit breakers 1702 may be coupled or arranged in a daisy-chain arrangement. For example, referring to FIG. 17G, in one embodiment, each circuit breaker 1702 includes receptacles 1706, 1707, each receptacle 1706, 1707 is configured to receive a modular connector 1750. Each receptacle 1706 is configured to receive inbound communication signals (e.g., commands or other communications from IED 1760) and provide the inbound communication signals to controller or processor 1712. Controller 1712 and/or A/D converter 1705 are configured to provide outbound communication signals (e.g., sensor data, responses to communications from IED 1760, etc.) to receptacle 1707. Furthermore, IED 1760 includes receptacles 1762, 1763, each receptacle configured to receive a modular connector 1754. Receptacle 1762 is configured for sending outbound communication signals (e.g., from IED 1760 to breakers 1702) and receptacle 1763 is configured for receiving inbound communication signals (e.g., from breakers 1702).

The daisy-chain arrangement is achieved by coupling outbound receptacle 1762 to a first modular connector 1754A and coupling inbound receptacle 1706A of a first circuit breaker 1702A to a second modular connector 1750A, where connectors 1750A, 1754A are connected by a cable 1752A, as described above. Thereafter, the outbound receptacle 1707A of the first circuit breaker 1702A is coupled via a second set of connectors 1750, 1754 and cable 1752 to the inbound receptacle 17066 of a second circuit breaker 1702B. The outbound receptacle 1707B of the second circuit breaker 17026 is coupled via a third set of connectors 1750, 1754 and cable 1752. The process of coupling the outbound receptacle 1707 of a circuit breaker 1702 to the inbound receptacle 1706 of a successive circuit breaker 1702 is repeated until a final circuit breaker 1702Z is reached. The inbound receptacle 1706Z of circuit breaker 1702Z is coupled via a final set of connectors 1750, 1754 and cable 1752 to a the second to last circuit breaker 1702 in the arrangement of FIG. 17G. The outbound receptacle 1707 of circuit breaker 1702 is coupled to modular connector 1750Z and the inbound receptacle 1763 of IED 1760 is coupled to modular connector 1752Z, where connectors 1750 and 1754 are coupled via cable 1752Z. It is to be appreciated that various components are designed in number with A to Z, however, this is not meant to limit the possible number, where more or less components may be provided in any particular embodiment.

Controller or processor 1764 of IED 1762 is configured to address any one of circuit breakers 1702 by sending an outbound communication signal including identifying information for one or more specific circuit breakers 1702 via outbound receptacle 1762. The outbound communication is received by the inbound receptacle 1706A of the first circuit breaker 1702A and provided to the controller 1712 of the breaker 1702A. Controller 1712 is configured to parse the communication, and if the identifying information pertains to circuit breaker 1702A in the daisy-chain arrangement, controller 1712 adds to the communication signal the appropriate response (e.g., sensor data or other information) to the communication signal and the communication signal including the response is provided to the second circuit breaker 1702B via outbound receptacle 1707A and inbound receptacle 1706B. It is to be appreciated that if controller 1712 of circuit breaker 1702A determines that the communication received from IED 1760 does not include identifying information pertaining to circuit breaker 1702A, the controller 1712 retransmits the original communication signal without a corresponding response to the next circuit breaker 1702B. In either case, each controller 1712 of each successive circuit breaker 1702 is configured to make the above-described determination when receiving inbound communication signals and retransmits the original communication signal (and a response, if appropriate) to the next circuit breaker 1702 in the daisy-chain arrangement. This process is repeated until the final circuit breaker 1702 provides each of the responses (and, in some embodiments the original communication signal) from any of the circuit breakers 1702 in the daisy-chain arrangement to inbound receptacle 1763 of IED 1760, where the responses are received by controller or processor 1764 of IED 1760.

It is to be appreciated that, in the daisy-chain arrangement described above, any combination of circuit breakers may be included using the coupling procedure described above.

It is to be appreciated that, although the system shown and described in FIGS. 17A-17E uses fiber optic cables to connect circuit breakers 1702 to an IED 1760, in other embodiments, cables including one or more electrical wires may be used to connect circuit breakers 1702 to IED 1760. In these embodiments, connectors 1750, 1754 are configured as standard modular connectors (e.g., RJ-45 connectors). Communications between IED 1760 and circuit breakers 1702 are provided via the one or more electrical wires in cable 1752. In some embodiments, each of circuit breakers 1702 may be coupled to a communication device, such as a router, modem, or other communication device. The communication device is configured to communicate with an IED, such as IED 1760, either wirelessly or via hardwired connection to enable each circuit breaker 1702 to send and receive communications with the IED.

In another embodiment, each circuit breaker 1702 may include a wireless communication module configured to transmit and receive wireless communication signals to/from an IED, such as IED 1760, or any other device. In this way, a physical connection between circuit breakers 1702 and IED 1760 is not necessary. The wireless communication module in each circuit breaker 1702 may be configured to communicate via Wi-Fi, Bluetooth, Infrared Data Associated (IrDA), or any other wireless communication protocol.

In another embodiment of the present disclosure, circuit breakers 1702 may be configured for use with fiber optic cables having optical fiber connectors. For example, referring to FIG. 18, housing 1700 includes a plurality of circuit breakers 1702, where each circuit breaker 1702 includes a corresponding modular receptacle 1806 configured as an optical fiber receptacle. As shown in FIG. 18B, the optical fiber receptacle 1806 is accessible via a surface of housing 1701 of circuit breaker 1702.

Figure 18A:
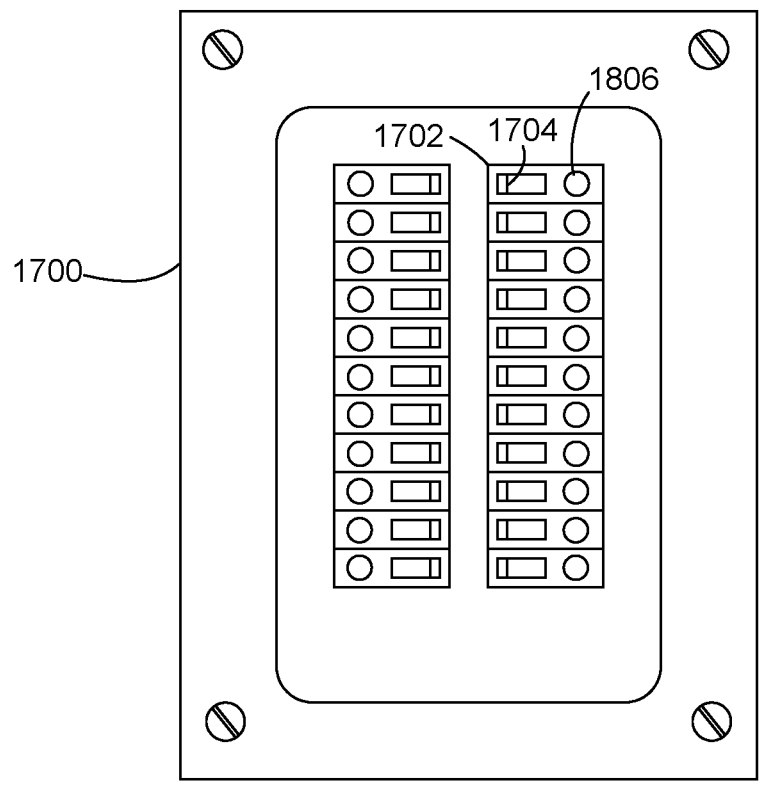
FIG. 18A illustrates a circuit breaker panel including a plurality of circuit breakers, each circuit breaker including an optical fiber receptacle, in accordance with an embodiment of the present disclosure.
Figure 18B:
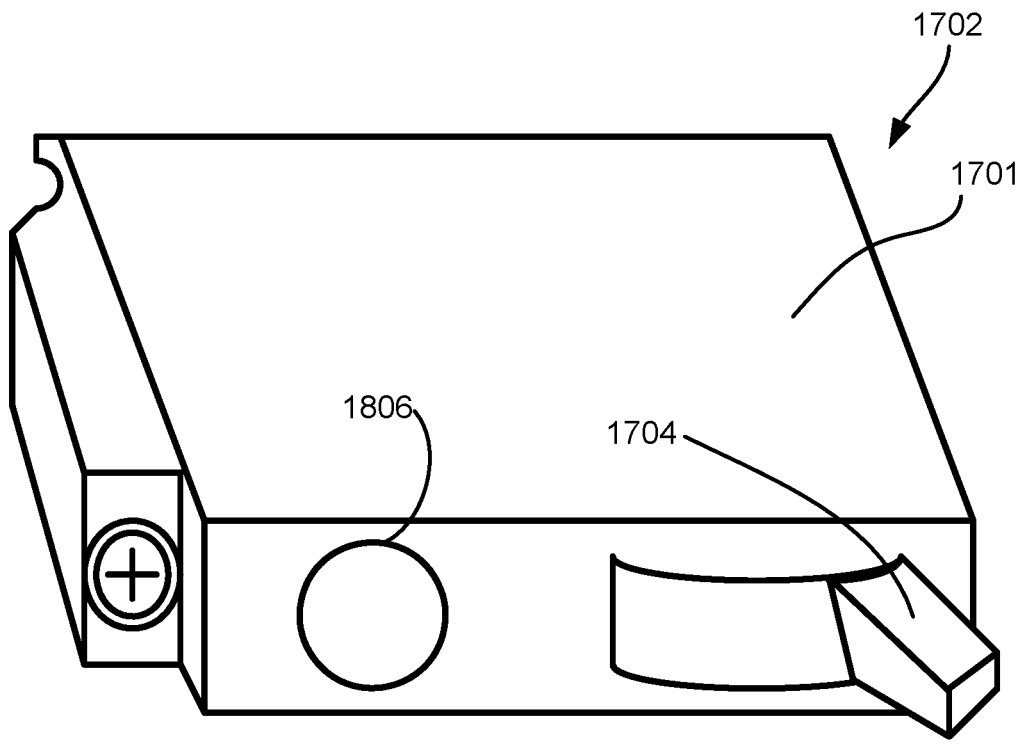
FIG. 18B illustrates a circuit breaker including an optical fiber receptacle in accordance with an embodiment of the present disclosure.
Figure 18C:
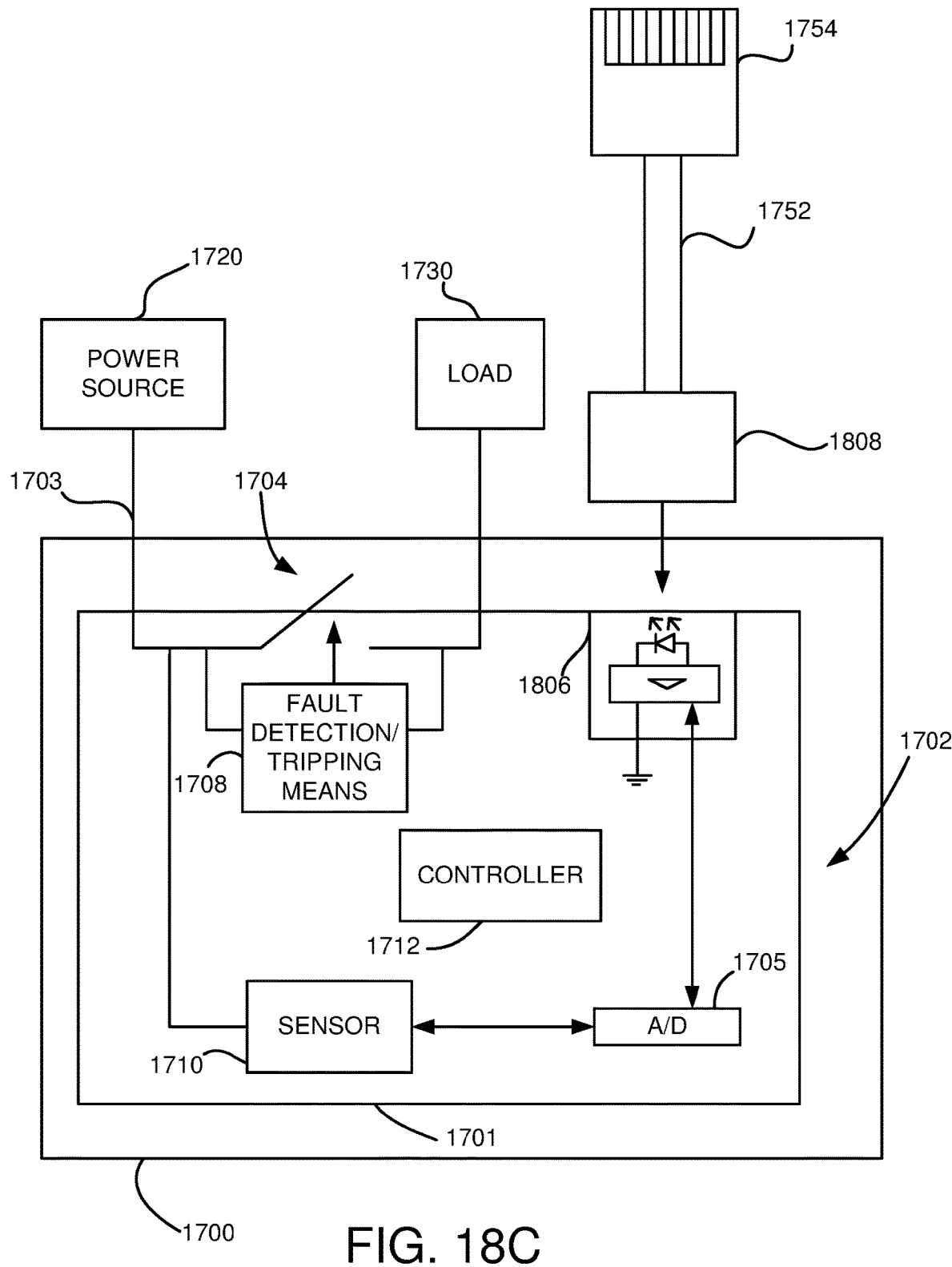
FIG. 18C is a block diagram of the circuit breaker of FIG. 18B in accordance with an embodiment of the present disclosure.

Referring to FIG. 18C, a block diagram of optical fiber receptacle is shown in accordance with the present disclosure. Optical fiber receptacle 1806 is configured to receive an optical fiber connector, such as connector 1808. It is to be appreciated that optical fiber receptacle 1806 and optical fiber connector 1808 may be any suitable type of receptacle and connector for connecting optical fibers, such as, but not limited to, subscriber connector (SC), straight tip (ST), lucent connector (LC), ferrule connector (FC), sub miniature A (SMA), D4, mechanical transfer registered jack (MT-RJ) and/or miniature unit (MU). Receptacle 1806 includes VLC circuitry for converting signals received from A/D converter 1705, controller 1712, and/or a communication module of circuit breaker 1702 to one or more light signals. The one or more light signals are outputted by receptacle 1806 to connector 1808 and provided via fiber(s) in cable 1752 to connector 1754. In one embodiment, receptacle 1806 also includes LVC circuitry, thus enabling circuit breaker 1702 to achieve bi-directional communication.

As described above, connector 1754 includes LVC circuitry for converting the light signals received from circuit breaker 1702 to electrical signals. The electrical signals are outputted by connector 1754 to IED 200/500. In some embodiments, connectors 1754 also includes VLC circuitry. In one embodiment, connector 1754 is replaced by an optical connector and IED 200/500 includes a receptacle with LVC and, in some embodiments, VLC circuitry.

It is to be appreciated that the system shown in FIGS. 18A-18C including optical receptacles 1806 and optical connectors 1808, may be used in any manner described above in relation to FIGS. 17A-17F.

Figure 18D:
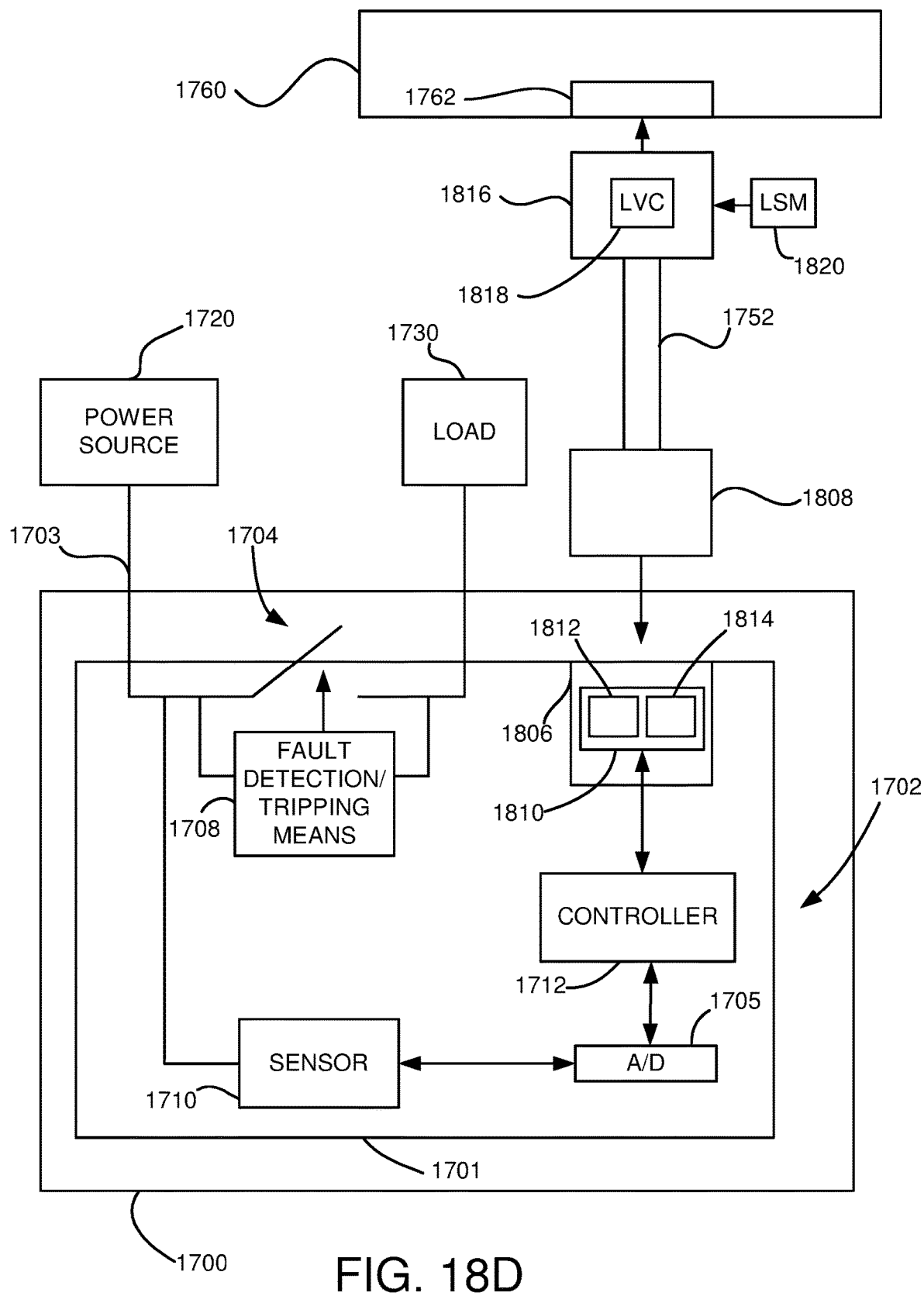
FIG. 18D is a block diagram of the circuit breaker of FIG. 18B in accordance with another embodiment of the present disclosure.

Referring to FIG. 18D, in another embodiment, receptacle 1806 may include one or more micro-electro-mechanical systems (MEMS) 1810 instead of VLC circuitry. In this embodiment, a continuous light signal is provided via a fiber in cable 1752 and optical connector 1808 to MEMS 1810 in receptacle 1806. The continuous light signal may be generated by IED 1760, a connector coupled to cable 1752, or a separate light source. For example, in one embodiment, a connector 1816 is coupled to an end of cable 1752. Modular connector 1816 (e.g., an RJ-45 connector) is configured to be received by receptacle 1762 of IED 1760. Connector 1816 includes LVC circuitry 1818. Light signal module (LSM) 1820 (e.g., a laser light source) is coupled to connector 1816 and configured to provide a light signal to connector 1816 and via a fiber in cable 1752 and connector 1808 to receptacle 1806. It is to be appreciated that LSM 1820 may be disposed in connector 1816 or be a discrete component disposed externally to connector 1816. LSM 1820 may be coupled to and controllable via a processor of IED 1760. It is to be appreciated that LSM 1820 may be disposed in IED 1760.

MEMS 1810 may include a reflector module 1812 and an actuator module 1814. Modules 1812 and 1814 are controllable via controller 1712. Controller 1712 is configured to cause actuator module 1814 to change the orientation of one or more mirrors in reflector module 1812. In this way, controller 1712 is configured to control how the continuous light provided to receptacle 1806 via LSM 1820 and cable 1752 is reflected from the one or more mirrors in reflector module 1812. To send IED 1760 communications (e.g., measurements from sensor 1710 or other information), controller 1712 is configured to cause the continuous light to be selectively reflected into a fiber of cable 1752 (e.g., the same fiber providing the continuous light or a separate fiber within cable 1752) such that a modulated or pulsed light signal to carry data or information (e.g., encoded as a serial stream of data containing one or more packets) is reflected into the fiber of cable 1752 and provided to connector 1816. LVC circuitry 1818 in connector 1816 is configured to convert the modulated or pulsed light signal into an electrical signal which is then provided via receptacle 1762 to IED 1760. A processor, controller, or communication module in IED 1760 is configured to process the electrical signal and decode communications from circuit breaker 1702.

In another embodiment, receptacle 1806 further includes LVC circuitry. In this embodiment, LSM module 1820 is controlled via a processor or controller of IED 1760, such that the light provided via LSM 1820 may be modulated or pulsed to encode information (e.g., as a serial stream of data containing one or more packets). The modulated or pulsed light from LSM 1820 is converted by LVC circuitry to an electrical signal in receptacle 1806 and provided to controller 1712 or a communication module of circuit breaker 1702, where controller 1712 or the communication module processes the electrical signal to decode communications from IED 1760. In this way, IED 1760 and circuit breaker 1702 may communicate bidirectionally via cable 1752.

It is to be appreciated that the systems of FIGS. 17A-17E and 18A-18D provide many advantages over prior methods of monitoring loads in a power distribution system. Communication over fiber-optic cables can achieve high isolation for safe connections (e.g., via non-conducting materials in the fiber-optic cables), noise immunity, and high speed data rates over relatively long distances. Furthermore, because each circuit breaker 1702 is configured to measure electrical parameters associated with a corresponding load and can be easily coupled to an IED via modular connectors (e.g., RJ-45 connectors, optical connectors, etc.) and a cable (e.g., a fiber optic cable or a cable including a plurality of conductors), IED 1760 (or any other IED coupled to circuit breakers 1702) does not require large amounts of sensor or transformer connections between IED 1760 and one or more loads, which can be bulky and unsafe. Thus, the systems of FIGS. 17A-17E and 18A-18D reduce labor associated with coupling and uncoupling an IED to a plurality of loads. With respect to the system of FIGS. 18A-18D, another advantage provided is that there is no conducting material on the surface of panel 1700 or any of breakers 1702, preventing faults, arcs, or other safety hazards introduced by conductive material being present.

Figure 19:
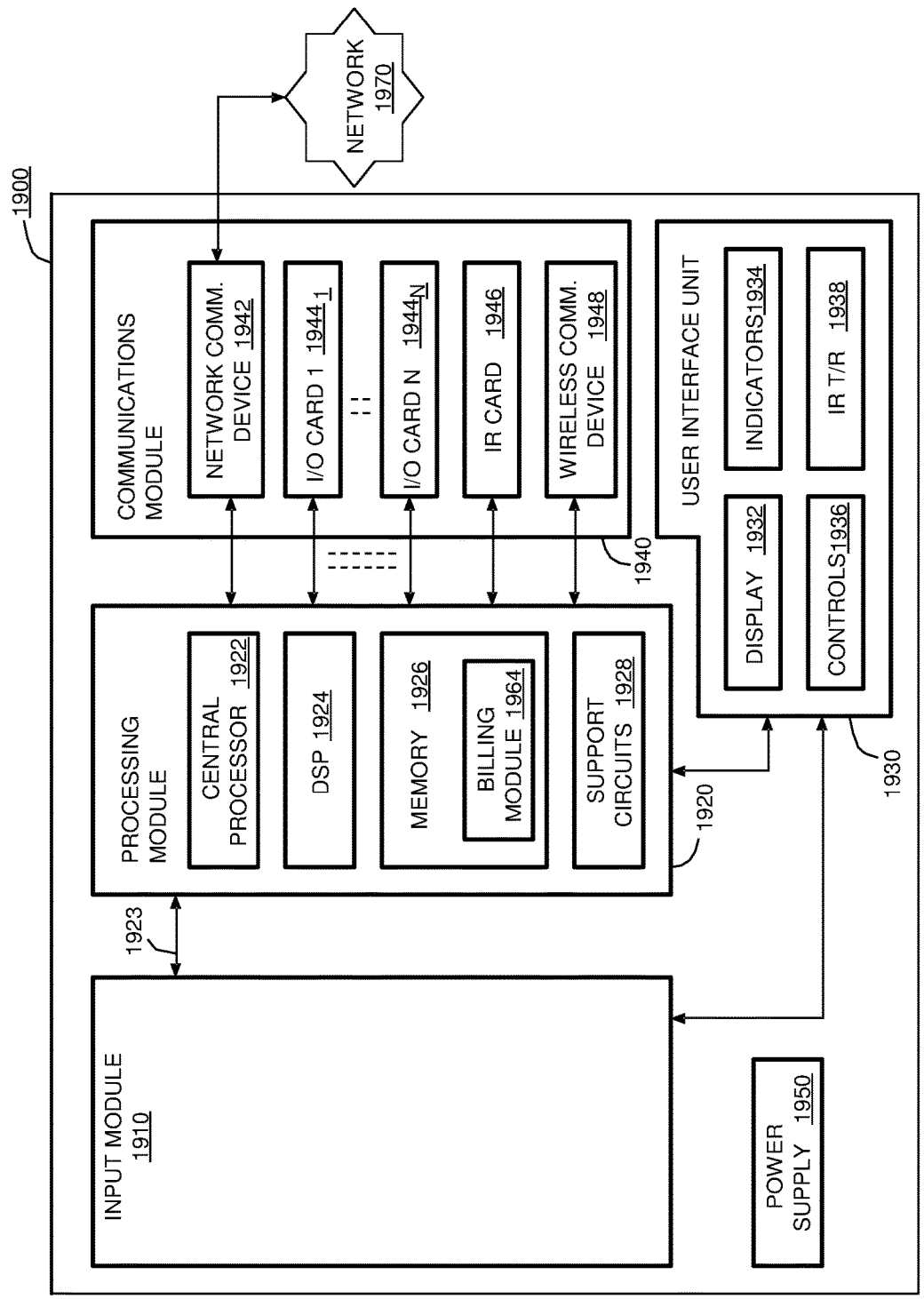
FIG. 19 is a schematic diagram illustrating an IED including a billing module is shown in accordance with the present disclosure.

It is to be appreciated that billing module 1764 of the system described above in relation to FIGS. 17A-18D may be implemented by a processor or processing module of an IED, such as IED 10, 200, 500, 1760 described above. For example, referring to FIG. 19, a schematic diagram illustrating an exemplary multi-input digital electrical power and energy meter/IED 1900 having a billing module 1964 is shown in accordance with the present disclosure. It is to be appreciated that billing module 1964 may be configured in a similar manner to billing module 1764 described above.

The meter 1900 generally comprises an input module 1910, a processing module 1920, a user interface unit 1930, a communications module 1940, and a power supply 1902 and may be connected to a network 1970. The input module 1910 may include various means (e.g., receptacles, connectors, etc.) for creating data connections between meter 1900 and other devices. For example, input module may include one or more receptacles configured to be coupled to electrical and/or optical data carrying means, such as, receptacles 1762 described above. The meter 1900 may be connected to the network 1970 using existing or dedicated telephone/cable interfaces compatible with packetized data transmissions In particular, for each of the monitored loads, the meter 1900 may measure, calculate, and analyze a line voltage, a line current, a phase voltage, a phase current, and a total harmonic distortion (THD) or a root mean square (RMS) value thereof; energy, revenue, real power, reactive power, total power, and a power factor, among other parameters.

Using bi-directional interface 1923, the input module 1910 is coupled to the processing module 1920 including a central processor 1922, a digital signal processing (DSP) module 1924, a memory 1926, and support circuits 1928. The memory 1926 (e.g., RAM, ROM, EEPROM, flash memory, and the like) contains codes of programs and software modules facilitating functions of the meter 1900. Such functions include various voltage, current, power, energy and power quality related measurements and calculations, support of user interface, and facilitation of network connectivity of the meter 1900. In one exemplary embodiment, the memory 1926 includes a code of a billing module 1964 that allows the meter 1900 to generate and/or adjust customized bills for energy consumed by each load monitored by the meter 1900. For example, the billing module 1964 may be configured in a manner similar to billing module 1764, such that module 1964 receives data from one or more circuit breakers 1702 to generate and/or adjust customized bills for energy consumed by the loads coupled each circuit breaker 1702.

In one embodiment, the memory 1926 contains code of a program that configures the meter 1900 to operate as a terminal or a server of the network 1970, such as an Intranet, a local area network (LAN), a wide area network (WAN), or the Internet (i.e., World Wide Web (WWW)). The meter 1900 may transmit and receive information using standard communication protocols. For example, the meter 1900 may be configured to communicate using the Hypertext Transfer Protocol (HTML), the File Transfer Protocol (FTP), or the Extensive Markup Language (XML) Protocol, as well as perform, in real time, conversions between these protocols.

Both incoming and outgoing information may be in a form of email messages. Outgoing information generally comprises present or historic raw or systemized data, alarms, text/symbolic messages, charts, and bar graphs, whereas examples of incoming information include meter's configuration settings, request for meter's data or status information, and the like. In some embodiments, billing module 1964 and/or processor 1922 of the meter 1900 may produce information in a form of web pages allowing access by a user computing device to the web page, such that a user may access particular data or configuration settings of the meter 1900 and/or an individual circuit breaker 1702. The email capability of the device 1900 shall have the capacity to generate utility type energy usage bills and attach those bills in the body or as an attachment to an outgoing email message. This allows different users to obtain energy and demand usage bills directly from the IED 1900 without need for separate software. This feature can also be extended to include other outgoing messages such as meter sensor failures, meter tampering notices, voltage outages and/or desired data. Moreover, the email function could also be configured to receive messages from a computer system, software or a user including new firmware updates, control commands, resets or any other meter function that would normally either be configured by a user on the display screen of the IED or by communication protocol utilizing a PC computer to communicate with the IED. All permutations thereof concerning attaching commands to emails messages are contemplated herein within the present disclosure. Moreover, it is contemplated by the present disclosure that email can be sent from one IED to another IED containing said information. It is further contemplated within the present disclosure that the communication module can be separate hardware or merely a software communication module within the central processor (1920). Moreover, the communication module can also be configured as an external piece of hardware coupled to the IED 1900 through a connector.

The user interface unit 1930 generally includes a front panel display 1932 (e.g., liquid crystal display (LCD) or plasma display), indicators 1934 (e.g., LED indicators), user controls 1936 and an optional infra-red transmitter/receiver (IR T/R) 1938. The user controls 1936 may include push-buttons allowing to select particular data of interest for being shown on the display 1932, select/confirm configuration settings of the meter, or review status messages generated by the meter. In one exemplary embodiment, the user interface unit 1930 includes a touch-screen display 1932, which may be used to review data and configuration settings of the meter 1900.

In another embodiment, the display 1932 may be used to review, by authorized personnel, and generate or adjust bills (via billing module 1964) for the energy consumed by each particular load monitored by the meter 1900. For example, the touch-screen display 1932 may be used to enter/modify billing rates, discounts, fees, etc., which are stored in billing module 1964 and used by billing module 1964 in adjusting/generating bills for loads monitored (e.g., by loads coupled to circuit breakers 1702). Additionally or alternatively, user controls 1936 may also be used to perform configuration and billing operations of billing module 1964 (e.g., when the meter 1900 comprises of a non-touch-screen display). Therefore, using billing module 1964, the meter 1900 can operate as a self-contained metering/billing device, which does not require any additional software or hardware to perform such functions. The approved bills generated by module 1964 may be transferred by module 1940 of the meter 1900 (e.g., e-mailed or transmitted via any other suitable protocol) to an owner of the facility or any other interested party where the meter 1900 is being installed and/or to the owners/tenants of the respective load(s) coupled to circuit breakers 1702. In one exemplary embodiment, customized bills for the consumed energy are generated by module 1964 and then subsequently e-mailed or otherwise transmitted by module 1940 of the meter 1900 to the owner(s) and/or to tenants (for example, same-floor tenants) of a commercial/residential building which electrical services are monitored by the meter 1900. Such bills and other portions of the outgoing information (e.g., notices, recommendations, etc.) may be generated by module 1964 of the meter 1900 and forwarded via module 1940 to their addressees with pre-determined periodicity (e.g., every hour, every day, every week, etc.)

In one embodiment, billing module 1964 and/or processor 1922 may generate and maintain a web page (e.g., hosted on a memory of meter 1900 or on an external web server) accessible by a user computing device. The web page enables a user to adjust any desired parameter via user input to the web page using a user computing device. For example, the web page may enable a user to change setting of the meter 1900, change settings in any one of the circuit breakers 1702 the meter 1900 is in communication with, request information associated with meter 1900 and/or any of the circuit breakers 1702, etc. Via user input to the web page, a user may select for billing module 1964 to generate bills for the loads that circuit breakers 1702 are coupled to and for the generated bills to be provided to the user (e.g., via email, display on the webpage, or any other communication means) periodically at predetermined intervals.

In one embodiment, the web page maintained by the meter 1900 may via a suitable graphical user interface enable a user to select which circuit breakers 1702 within a monitored system are to be used to generate a bill. Since, each circuit breaker 1702 is associated to a particular load, this enables a user to select one or more subgroups of loads (i.e., by selecting the corresponding circuit breakers 1702) for which a bill is generated. A user may select within the graphical user interface of the web page a single load for which a bill is produced (i.e., by selecting a single breaker 1702) or a subgroup of loads for which a bill is produced (i.e., by selecting individual breakers 1702 that make up a desired subgroup of loads). The individual and/or subgroup(s) of loads selected by the user may be associated to a particular customer and the bill generated by billing module 1964 may be sent via communication module 1940 to the particular customer (e.g., via email, notification, display on the web page, or other communication means).

In one exemplary embodiment, the communications module 1940 comprises a network communication device 1942, optional input/output (I/O) cards (i.e., printed circuit boards (PCBs)) 19441-1944N, an optional infra-red (IR) I/O card 1946, and an optional wireless communication device 1948. The meter 1900 may be configured to include up to two of the same or different I/O cards 1944. Exemplary I/O cards 1944 include analog I/O cards and relay I/O cards. The device 1942 and the I/O cards 1944, 1946 are generally coupled to the processing module 1920 using serial interfaces, for example, DNP, Modbus, Serial Peripheral Interface (SPI), RS-232, or RS-485 interfaces.

The network communication device 1942 is configured for providing bi-directional connectivity between the meter 1900 and the network 1970 (for example, via a hardware/software modem) and, structurally, includes one or more specialized cards or modules. In one embodiment, the network communication device 1942 supports the TCP/IP and 10/100Base-T Ethernet communication protocols and, optionally, at least some of the Modbus/TCP, Modbus, Distributed Network Protocol (DNP) (e.g., DNP 3.0), RS-485, RS-232 and universal serial bus (USB) architectures.

The network communication device 1942 may be a modem, network interface card (NIC), wireless transceiver, etc. The network communication device 1942 may perform its functionality by hardwired and/or wireless connectivity. The hardwire connection may include but is not limited to hard wire cabling (e.g., parallel or serial cables, including RS-232, RS-485, USB, and Firewire (IEEE-1394) Ethernet, Fiber Optic, or Fiber Optic over Ethernet cables, and the appropriate communication port configuration. The wireless connection will operate under any of the wireless protocols, providing but not limited to Bluetooth™ connectivity, infrared connectivity, radio transmission connectivity including computer digital signal broadcasting and reception commonly referred to as Wi-Fi or 802.11.X (where X denotes the transmission protocol), satellite transmission or any other type of communication transmissions, as well as communication architecture or systems currently existing or to be developed for wirelessly transmitting data, including spread-spectrum systems operating at 900 MHz or other frequencies, Zigbee, WiFi, or mesh-enabled wireless communication systems. Note that it is contemplated within the present disclosure that the data may be transmitted using encryption algorithms such as 128-bit or 64-bit encryption.

Correspondingly, the I/O cards support industry-standard bi-directional 0-1 mA interface and 4-20 mA current loop interface, the relay I/O cards provide digital ON/OFF input/output contacts and an energy pulse output (i.e., KYZ pulse output), and the IR I/O card 1946 supports bi-directional optical communications with external IR-enabled devices, such as Personal Digital Assistants (PDAs), laptops, and the like. Via respective communication links (not shown), the I/O cards 1944 and 1946 provide connectivity to remote users of the meter 1900. In some embodiments, the wireless communication device 1948 may be used for communications otherwise performed in the meter 1900 using the network communication device 1942 or I/O cards 1944, 1946.

The wireless communication device 1948 may be used to provide communication links between the meter 1900 and remotely disposed devices, such as, to processor or 1712 or voltage/current sensors 1710 of circuit breakers 1702 or any other devices. For example, such voltage/current sensors 1710 of circuit breakers 1702 may wirelessly transmit data (via a wireless communication module in each of circuit breakers 1702) to the wireless communication device 1942 of meter 1900 for processing by billing module 1964 and/or other modules of the processing module 1920.

In operation, a real time clock may be used to support energy calculations and billing features of billing module 1964 of the meter 1900.

Through infrastructure of the network 1970, outgoing information may simultaneously be addressed and transferred to a plurality of network-enabled users, such as accounting, maintenance, or customer service personnel of a utility company operating the meter or power lines/loads monitored by the meter 1900. Correspondingly, the meter 1900, operating as a server or terminal of the network 1970, may be assigned a plurality of network addresses (e.g., Internet addresses) and be simultaneously accessed by a plurality of network-enabled users. In one embodiment, the Dynamic Host Configuration Protocol (DHCP) may be used to assign Internet addresses to the meter 1900. In some embodiments, the meter 1900 may receive and transmit information using different communication protocols.

It is to be appreciated that the various features shown and described are interchangeable, that is a feature shown in one embodiment may be incorporated into another embodiment.

Although embodiments which incorporate the teachings of the present disclosure have been shown and described in detail herein, those skilled in the art can readily devise many other varied embodiments that still incorporate these teachings. Having described preferred embodiments of a gateway device voice recognition system and method thereof (which are intended to be illustrative and not limiting), it is noted that modifications and variations can be made by persons skilled in the art in light of the above teachings. It is therefore to be understood that changes may be made in the particular embodiments of the disclosure disclosed which are within the scope of the disclosure as outlined by the appended claims.

What is claimed is:

1. A system comprising:
   a circuit breaker panel;
   a plurality of individual circuit breakers positioned in the circuit breaker panel to connect a respective circuit to a respective load, each circuit breaker including,
      a housing configured to be disposed in the circuit breaker panel,
      at least one tripping device disposed in the housing and configured to break the respective circuit,
      at least one sensor disposed in the housing and configured to sense at least one electrical parameter of the respective circuit and output an analog signal indicative of the at least one electrical parameter,
      at least one analog to digital converter disposed in the housing and configured to convert the analog signal to at least one digital signal, and
      a first wireless communication device disposed in the housing and configured to transmit the at least one digital signal; and
   at least one device remote from the circuit breaker panel, the at least one device including a second wireless communication device configured to receive and send signals to the first wireless communication device.

2. The system of claim 1, wherein the at least one device is at least one of a Programmable Logic Controller ("PLC"), a Remote Terminal Units ("RTU"), an electric power meter, a panel meter, a protective relay, a fault recorder, a phase measurement unit, a serial switch and/or a smart input/output device.

3. The system of claim 1, wherein the at least one electrical parameter is any one of current, voltage, energy, power, and/or temperature.

4. The system of claim 1, wherein each of the circuit breakers further comprises at least one processor configured to receive at least one communication signal from the at least one device via the first wireless communication device, the at least one processor configured to perform at least one action based on the at least one communication signal.

5. The system of claim 4, wherein the at least one action includes instructing the tripping device to break the circuit.

6. The system of claim 4, wherein the at least one action includes instructing the tripping device to break the circuit according to a load shedding function.

7. The system of claim 1, wherein the first wireless communication device operates in accordance with at least one of WiFi protocols and/or Bluetooth protocols.

8. The system of claim 4, wherein the at least one processor is configured to calculate energy consumed by the load based on the at least one electrical parameter sensed by the at least one sensor.

9. The system of claim 8, wherein the at least one device includes at least one device processor configured to generate at least one web page accessible by at least one external device, the at least one web page enabling at least one of presenting data associated and/or sensed by the at a device circuit breakers and/or adjusting at least one setting of the circuit breakers.

10. The system of claim 1, wherein the at least one tripping device includes a switch.

11. A system comprising:
    a circuit breaker panel;
    a plurality of individual circuit breakers positioned in the circuit breaker panel to connect a respective circuit to a respective load, each circuit breaker including,
       a housing configured to be disposed in the circuit breaker panel,
       at least one tripping device disposed in the housing and configured to break the respective circuit,
       a controller disposed in the housing and configured to operate the tripping device to break the respective circuit,
       at least one sensor disposed in the housing and configured to sense at least one electrical parameter of the respective circuit and output an analog signal indicative of the at least one electrical parameter,
       at least one analog to digital converter disposed in the housing and configured to convert the analog signal to at least one digital signal, and
       a first wireless communication device disposed in the housing and configured to transmit the at least one digital signal; and
    at least one device remote from the circuit breaker panel, the at least one device including a second wireless communication device configured to receive and send signals to the first wireless communication device,
    wherein the at least one device is configured to transmit a signal to the first wireless communication device to instruct the controller to activate the tripping device to break the respective circuit.

12. The system of claim 11, wherein the at least one device is at least one of a Programmable Logic Controller ("PLC"), a Remote Terminal Units ("RTU"), an electric power meter, a panel meter, a protective relay, a fault recorder, a phase measurement unit, a serial switch and/or a smart input/output device.

13. The system of claim 11, wherein the at least one electrical parameter is any one of current, voltage, energy, power, and/or temperature.

14. The system of claim 11, wherein the at least one tripping device includes a switch.

15. The system of claim 11, wherein the controller is configured to multiplex data output by the analog to digital converter.

16. The system of claim 11, wherein the controller is configured to serialize data data output by the analog to digital converter.

17. The system of claim 11, wherein the controller is configured to respond to communication signals with identifying information.

18. The system of claim 11, wherein the at least one device includes a device processor configured to implement a billing component stored in memory.

19. The system of claim 18, wherein the billing component is configured to generate bills for energy consumed by the respective load.

20. The system of claim 18, wherein the at least one device includes a user interface having a display.

* * * * *